US012772661B2

(12) United States Patent
Han et al.

(10) Patent No.: US 12,772,661 B2
(45) **Date of Patent: *Oct. 20, 2026**

(54) DISPLAY SUBSTRATE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Linhong Han, Beijing (CN); Qiwei Wang, Beijing (CN); Youngyik Ko, Beijing (CN); Benlian Wang, Beijing (CN); Weiyun Huang, Beijing (CN); Binyan Wang, Beijing (CN); Yao Huang, Beijing (CN); Zhi Wang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 19/275,262

(22) Filed: Jul. 21, 2025

(65) Prior Publication Data

US 2025/0351679 A1 Nov. 13, 2025

Related U.S. Application Data

(63) Continuation of application No. 18/791,937, filed on Aug. 1, 2024, now Pat. No. 12,457,854, which is a (Continued)

(51) Int. Cl.
*H10K 59/121* (2023.01)
*G09G 3/3233* (2016.01)
*H10K 59/131* (2023.01)

(52) U.S. Cl.
CPC ....... *H10K 59/1213* (2023.02); *G09G 3/3233* (2013.01); *H10K 59/131* (2023.02);

(Continued)

(58) Field of Classification Search
CPC .. H10K 59/1213; H10K 59/131; H10K 59/35; H10K 59/1216; G09G 3/3233;

(Continued)

(56) References Cited

U.S. PATENT DOCUMENTS

2007/0278613 A1* 12/2007 Imade .................... H10D 30/60 257/500
2012/0013590 A1* 1/2012 Minami ............... G09G 3/3225 345/80

(Continued)

FOREIGN PATENT DOCUMENTS

| | | | |
|---|---|---|---|
| CN | 110752246 | A | 2/2020 |
| DE | 102019135043 | A1 | 7/2020 |
| JP | 2016053640 | A | 4/2016 |

OTHER PUBLICATIONS

Chinese Office Action from Application No. 2021800010637; Mailing Date: Dec. 19, 2025.

(Continued)

*Primary Examiner* — Sahlu Okebato
(74) *Attorney, Agent, or Firm* — Dilworth & Barrese, LLP.; Michael J. Musella, Esq.

(57) ABSTRACT

A display substrate and a display device are provided. In the display substrate, a first signal line transmitting a first scan signal extends along a first direction and a second signal line transmitting a data signal extends along a second direction;

(Continued)

the data writing transistor transmits the data signal to the driving transistor under control of the first scan signal, the first scan signal is transmitted on the first signal line, and the data signal is transmitted on the second signal line; the driving transistor controls magnitude of a driving current according to the data signal; the channel region at least partially overlaps with the gate electrode; a planar shape of the channel region of the driving transistor is a strip shape extending along the second direction; the light emitting device receives the driving current and is driven by the driving current to emit light.

20 Claims, 47 Drawing Sheets

Related U.S. Application Data continuation of application No. 17/916,206, filed as application No. PCT/CN2021/091896 on May 6, 2021, now Pat. No. 12,100,350.

(52) U.S. Cl.
CPC ............... *G09G 2300/0842* (2013.01); *G09G 2310/0262* (2013.01); *G09G 2310/08* (2013.01)

(58) Field of Classification Search
CPC ... G09G 2300/0842; G09G 2310/0262; G09G 2310/08; G09G 2300/0421; G09G 2300/0861; G09G 2310/0251; H10D 86/441; H10D 86/481; H10D 86/60
See application file for complete search history.

(56) References Cited

U.S. PATENT DOCUMENTS

| | | | | |
|---|---|---|---|---|
| 2016/0118451 | A1 | 4/2016 | Youn et al. | |
| 2017/0012094 | A1 | 1/2017 | Lee | |
| 2020/0410196 | A1 | 12/2020 | Moon et al. | |
| 2021/0020707 | A1 | 1/2021 | Choi et al. | |
| 2021/0384289 | A1* | 12/2021 | Li ............................ | G09G 3/32 |

OTHER PUBLICATIONS

German Office Action from Application No. 112021004654.3; Mailing Date: Feb. 16, 2026.

* cited by examiner

A-A'

C-C'

E-E'

F-F'

G-G'

H-H'

I-I'

J-J'

K-K'

L-L'

DISPLAY SUBSTRATE AND DISPLAY DEVICE

This patent application is a continuation of U.S. application Ser. No. 18/791,937 filed on Aug. 1, 2024, which is a continuation of U.S. Ser. No. 17/916,206 filed on Sep. 30, 2022 which is a national stage application of international application PCT/CN2021/091896 filed on May 6, 2021, and the entire contents of all these applications are hereby incorporated by reference herein in its entirety.

TECHNICAL FIELD

At least one embodiment of the present disclosure relates to a display substrate and a display device.

BACKGROUND

In the field of display, organic light emitting diode (OLED) display panels have characteristics of self-illumination, high contrast, low energy consumption, wide viewing angle, fast response speed, being capable of being used in flexible panels, wide temperature range, simple manufacture and so on, and have broad development prospects. In order to enrich functions of the display panels, components with other functions are usually integrated, such as imaging components with photosensitive functions, so as to realize the functions of imaging, fingerprint identification and so on.

SUMMARY

At least one embodiment of the present disclosure provides a display substrate, the display substrate includes a base substrate, a first signal line extending along a first direction as a whole and a second signal line extending along a second direction as a whole on the base substrate, the second direction intersects the first direction; the first signal line transmits a first scan signal, and the second signal line transmits a data signal; the sub-pixel includes a pixel circuit, and the pixel circuit includes: a light emitting device, a driving transistor and a data writing transistor, the data writing transistor is configured to transmit the data signal to the driving transistor under a control of the first scan signal, the first scan signal is transmitted on the first signal line, and the data signal is transmitted on the second signal line; the driving transistor is configured to control a magnitude of a driving current flowing through the light emitting device according to the data signal, the driving transistor includes an active pattern and a gate electrode, the active pattern includes a channel region, and an orthographic projection of the channel region on the base substrate at least partially overlaps with an orthographic projection of the gate electrode on the base substrate; a planar shape of the channel region of the driving transistor is a strip shape extending along the second direction as a whole; the light emitting device is configured to receive the driving current and is driven by the driving current to emit light.

For example, in the display substrate provided by at least one embodiment of the present disclosure, the planar shape of the channel region of the driving transistor is a straight strip shape extending along the second direction.

For example, in the display substrate provided by at least one embodiment of the present disclosure, the pixel circuit further comprises a storage capacitor, and the storage capacitor comprises a first electrode plate and a second electrode plate; the first electrode plate is electrically connected with the gate electrode of the driving transistor; and an orthographic projection of the second electrode plate on the base substrate at least partially overlaps with an orthographic projection of the first electrode plate on the base substrate, and does not overlap with an orthographic projection of the channel region of the driving transistor on the base substrate.

For example, in the display substrate provided by at least one embodiment of the present disclosure, the first electrode plate comprises a first portion and a second portion. The first portion extends along the second direction, and an orthographic projection of the first portion on the base substrate overlaps with an orthographic projection of the channel region of the driving transistor on the base substrate; and the second portion is connected with the first portion and protruding from the first portion of the first electrode plate along the first direction; an orthographic projection of the second portion on the base substrate at least partially overlaps with an orthographic projection of the second electrode plate on the base substrate.

For example, in the display substrate provided by at least one embodiment of the present disclosure, the pixel circuit further comprises a semiconductor layer and a first connection structure. The a semiconductor layer comprises the active pattern of the driving transistor; a first terminal of the first connection structure is connected with the semiconductor layer, and a second terminal, opposite to the first terminal, of the first connection structure is electrically connected with the gate electrode of the driving transistor and the first electrode plate, an orthographic projection of the first connection structure on the base substrate does not overlap with an orthographic projection of the second electrode plate on the base substrate.

For example, in the display substrate provided by at least one embodiment of the present disclosure, the orthographic projection of the first connection structure on the base substrate does not overlap with the orthographic projection of the channel region of the driving transistor on the base substrate.

For example, in the display substrate provided by at least one embodiment of the present disclosure, the orthographic projection of the first connection structure on the base substrate at least partially overlaps with an orthographic projection of the second portion of the first electrode plate on the base substrate.

For example, in the display substrate provided by at least one embodiment of the present disclosure, the first connection structure is in a same layer as a first electrode of the driving transistor, and is electrically connected with the first electrode plate through a first via; an orthographic projection of the first via on the base substrate overlaps with an orthographic projection of the second portion of the first electrode plate on the base substrate, and does not overlap with an orthographic projection of the second electrode plate on the base substrate.

For example, in the display substrate provided by at least one embodiment of the present disclosure, the pixel circuit further comprises a first power line, a first vertical portion and a first vertical portion. The first power line is connected with a first voltage terminal and configured to provide a first power voltage to the pixel circuit, is in a same layer as a first electrode of the driving transistor, and comprises a first vertical portion and a first lateral portion; the first vertical portion extends in the second direction and is connected to an adjacent sub-pixel; and the first lateral portion is connected with the first vertical portion and extends from the first vertical portion towards the second electrode plate; the first lateral portion is electrically connected with the second electrode plate through a second via.

For example, in the display substrate provided by at least one embodiment of the present disclosure, the first portion of the first electrode plate has a first terminal in the second direction, and a blank notch is surrounded by the first terminal and the second portion; the first signal line is in a same layer as the first electrode plate and is spaced apart from the first electrode plate, and comprises a main portion and a protrusion portion; the main portion passes through the sub-pixel along the first direction and on a first side of the first electrode plate in the second direction; and the protrusion portion is connected with the main portion and protruding from the main portion towards the first electrode plate; the protrusion portion is at least partially located in the notch.

For example, in the display substrate provided by at least one embodiment of the present disclosure, the pixel circuit further comprises a compensation transistor, the compensation transistor is configured to compensate the gate electrode of the driving transistor in response to a second scan signal applied to the gate electrode of the compensation transistor and the data signal; the first signal line providing the first scan signal to the data writing transistor is further configured to provide the second scan signal to the compensation transistor; the compensation transistor comprises a first gate electrode and a second gate electrode, at least part of the protrusion portion constitutes the first gate electrode of the compensation transistor, and a part of the main portion constitutes the second gate electrode of the compensation transistor and the gate electrode of the data writing transistor.

For example, in the display substrate provided by at least one embodiment of the present disclosure, the compensation transistor comprises an active pattern, and the active pattern of the compensation transistor is in a same layer as the active pattern of the driving transistor; the sub-pixel further comprises a shielding portion which is on a side of the active pattern of the compensation transistor away from the base substrate; an orthographic projection of the shielding portion on the base substrate at least partially overlaps with an orthographic projection of the active pattern of the compensation transistor on the base substrate, the shielding portion is electrically connected with the first connection structure.

For example, in the display substrate provided by at least one embodiment of the present disclosure, the shielding portion is in a same layer as the second electrode plate, an orthographic projection of the first connection structure on the base substrate at least partially overlaps with the orthographic projection of the shielding portion on the base substrate, and the first connection structure is electrically connected with the shielding portion through a third via.

For example, in the display substrate provided by at least one embodiment of the present disclosure, the orthographic projection of the first connection structure on the base substrate at least partially overlaps with the orthographic projection of the channel region of the driving transistor on the base substrate; the first connection structure is in a same layer as the first electrode of the driving transistor, and is electrically connected with the first electrode plate through the first via; an orthographic projection of the first via on the base substrate overlaps with an orthographic projection of the second portion of the first electrode plate on the base substrate, and does not overlap with orthographic projections of the first portion of the first electrode plate and the second electrode plate on the base substrate.

For example, in the display substrate provided by at least one embodiment of the present disclosure, the orthographic projection of the first connection structure on the base substrate at least partially overlaps with the orthographic projection of the channel region of the driving transistor on the base substrate; the first connection structure comprises a first inclined portion, the first inclined portion extends along a third direction intersecting the first direction and the second direction, and an orthographic projection of the first inclined portion on the base substrate at least partially overlaps with an orthographic projection of the channel region of the driving transistor on the base substrate.

For example, in the display substrate provided by at least one embodiment of the present disclosure, a planar pattern of the first electrode plate is in an L shape.

For example, in the display substrate provided by at least one embodiment of the present disclosure, the first portion has a first terminal in the second direction, and the first signal line providing the first scan signal to the data writing transistor comprises a bent portion, the bent portion surrounds the first terminal of the first portion.

For example, in the display substrate provided by at least one embodiment of the present disclosure, the pixel circuit further comprises a compensation transistor, the compensation transistor is configured to compensate the gate electrode of the driving transistor in response to a second scan signal applied to the gate electrode of the compensation transistor and the data signal; the first signal line providing the first scan signal to the data writing transistor is further configured to provide the second scan signal to the compensation transistor.

For example, in the display substrate provided by at least one embodiment of the present disclosure, the compensation transistor comprises an active pattern, and the active pattern of the compensation transistor is in a same layer as the active pattern of the driving transistor; the sub-pixel further comprises a shielding portion which is on a side of the active pattern of the compensation transistor away from the base substrate; an orthographic projection of the shielding portion on the base substrate at least partially overlaps with an orthographic projection of the active pattern of the compensation transistor on the base substrate, the shielding portion is electrically connected with the first power line; the shielding portion is in a same layer as the second electrode plate, an orthographic projection of the first power line on the base substrate at least partially overlaps with an orthographic projection of the shielding portion on the base substrate, and the first power line is electrically connected with the shielding portion through a second via.

At least one embodiment of the present disclosure provides a display device, and the display device comprises any one of the display substrates provided by embodiments of the present disclosure.

BRIEF DESCRIPTION OF THE DRAWINGS

In order to demonstrate clearly technical solutions of the embodiments of the present disclosure, the accompanying drawings in relevant embodiments of the present disclosure will be introduced briefly. It is apparent that the drawings may only relate to some embodiments of the disclosure and not intended to limit the present disclosure.

DETAILED DESCRIPTION

Figure 1:
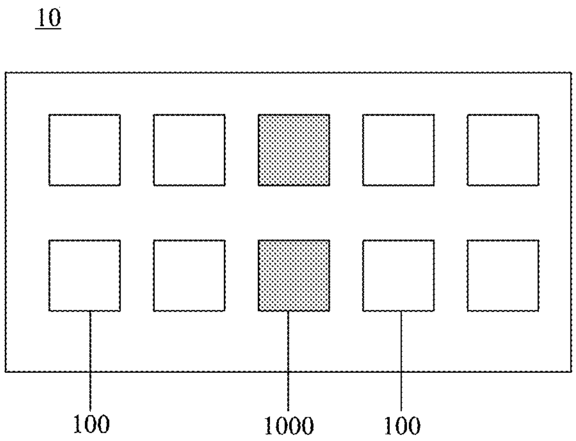
FIG. 1 is a schematic diagram of a display substrate provided by at least one embodiment of the present disclosure.

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or a mechanical connection, but may comprise an electrical connection which is direct or indirect. The terms "on," "under," "left," "right" and the like are only used to indicate relative position relationship, and in a case that the position of an object is described as being changed, the relative position relationship may be changed accordingly.

The scale of the drawings in the present disclosure can be used as a reference in the actual process, but the present disclosure is not limited to this. For example, the width-length ratio of the channel, the thickness and spacing of each layer, and the width and spacing of each signal line can be adjusted according to actual needs. The number of pixels in the display substrate and the number of sub-pixels in each pixel are not limited to the number shown in the drawings. The attached drawings described in the present disclosure are only structural diagrams.

At least one embodiment of the present disclosure provides a display substrate, the display substrate includes a base substrate, a first signal line extending along a first direction as a whole and a second signal line extending along a second direction, intersecting the first direction, as a whole on the base substrate, the first signal line transmits a first scan signal, and the second signal line transmits a data signal; the sub-pixel includes a pixel circuit, and the pixel circuit includes: a light emitting device, a driving transistor and a data writing transistor, the data writing transistor is configured to transmit the data signal to the driving transistor under a control of the first scan signal, the first scan signal is transmitted on the first signal line, and the data signal is transmitted on the second signal line; the driving transistor is configured to control a magnitude of a driving current flowing through the light emitting device according to the data signal, the driving transistor includes an active pattern and a gate electrode, the active pattern includes a channel region, and an orthographic projection of the channel region on the base substrate at least partially overlaps with an orthographic projection of the gate electrode on the base substrate; a planar shape of the channel region of the driving transistor is a strip shape extending along the second direction as a whole; the light emitting device is configured to receive the driving current and is driven by the driving current to emit light. In the display substrate provided by the embodiments of the present disclosure, the channel region of the driving transistor is in a strip shape extending along the second direction as a whole, which increases the length-width ratio of the channel region of the driving transistor and is conducive to saving the layout space of the pixel circuit.

At least one embodiment of the present disclosure provides a display substrate, the display substrate comprises a base substrate, a first signal line and a second signal line on the base substrate, and a sub-pixel. The sub-pixel includes a pixel circuit, and the pixel circuit includes: a light emitting device, a driving transistor, a data writing transistor and a storage capacitor. The data writing transistor is configured to transmit a data signal to the driving transistor under a control of a first scan signal; the first scan signal is transmitted on the first signal line, and the data signal is transmitted on the second signal line; the driving transistor is configured to control a magnitude of a driving current flowing through the light emitting device according to the data signal, the light emitting device is configured to receive the driving current and is driven by the driving current to emit light; the driving transistor includes an active pattern and a gate electrode, the active pattern includes a channel region, and an orthographic projection of the channel region on the base substrate at least partially overlaps with an orthographic projection of the gate electrode on the base substrate; the storage capacitor includes a first electrode plate and a second electrode plate. The first electrode plate is electrically connected with the gate electrode of the driving transistor; an orthographic projection of the second electrode plate on the base substrate at least partially overlaps with an orthographic projection of the first electrode plate on the base substrate, and does not overlap with an orthographic projection of the channel region of the driving transistor on the base substrate. In the display panel provided by the embodiments of the present disclosure, because the second electrode plate is connected with the first power voltage for voltage stabilization, the first power voltage signal will affect the channel region of the driving transistor, in order to reduce its influence on the channel region of the driving transistor, the second electrode plate is made to avoid the channel region of the driving transistor to avoid affecting the performance of the driving transistor.

For example, FIG. 1 is a schematic diagram of a display substrate provided by at least one embodiment of the present disclosure. As shown in FIG. 1, for example, the display substrate 10 includes a plurality of pixels 100 arranged in an array, at least part of the plurality of pixels 100 include a plurality of sub-pixels, and at least part of the plurality of sub-pixels include a light emitting device and a pixel circuit driving the light emitting device to emit light. For example, the pixel circuit may include a 2T1C (i.e., two transistors and one capacitor) pixel circuit, a 4T2C, 5T1C, 7T1C, or nTmC (n, m are positive integers) pixel circuit. For example, in different embodiments, the pixel circuit may also include a compensation sub-circuit, the compensation sub-circuit includes an internal compensation sub-circuit or an external compensation sub-circuit, and the compensation sub-circuit may include a transistor, a capacitor, etc. For example, the pixel circuit may further include a reset circuit, a light emitting control sub-circuit, a detection circuit, etc., as required.

For example, as shown in FIG. 1, the plurality of pixels 100 are located in the display region. For example, in the display substrate 10 provided by some embodiments, some pixels of the plurality of pixels 100 are dummy pixels 1000, the dummy pixels 1000 do not participate in the display operation, and each dummy pixel 1000 includes a plurality of dummy sub-pixels, and does not include sub-pixels playing the role of display driving.

For example, the display substrate 10 is an organic light emitting diode (OLED) display substrate, and the light emitting device is an OLED. The display substrate 10 may also include a plurality of scan lines and a plurality of data lines for providing scan signals (control signals) and data signals for the plurality of sub-pixels to drive the plurality of sub-pixels. As required, the display substrate 10 may further include a power line, a detection line, etc.

Figure 2A:
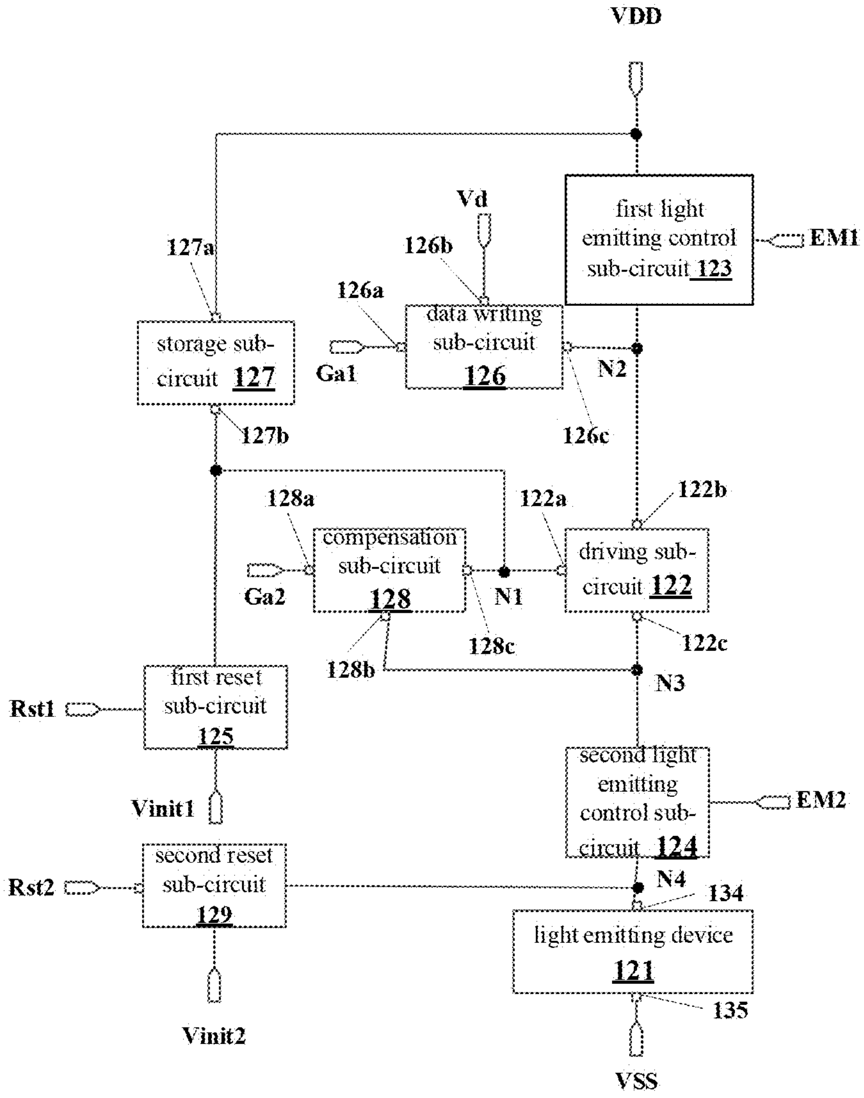
FIG. 2A is a schematic diagram of a pixel circuit provided by at least one embodiment of the present disclosure.

FIG. 2A is a schematic diagram of a pixel circuit provided by at least one embodiment of the present disclosure. As shown in FIG. 2A, the pixel circuit 100 includes a driving sub-circuit 122, a compensation sub-circuit 128, a data writing sub-circuit 126, a storage sub-circuit 127, a first light emitting control sub-circuit 123, a second light emitting control sub-circuit 124, a first reset sub-circuit 125 and a second reset sub-circuit 129.

For example, the driving sub-circuit 122 includes a control terminal 122*a*, a first terminal 122*b* and a second terminal 122*c*, and is configured to be connected to the light emitting device 121 and control the driving current flowing through the light emitting device 121. The control terminal 122*a* of the driving sub-circuit 122 is connected with the first node N1, the first terminal 122*b* of the driving sub-circuit 122 is connected with the second node N2 and configured to receive the first power voltage VDD, and the second terminal 122*c* of the driving sub-circuit 122 is connected with the third node N3.

For example, the data writing sub-circuit 126 includes a control terminal 126*a*, a first terminal 126*b* and a second terminal 126*c*. The control terminal 126*a* is configured to receive the first scan signal Ga1, the first terminal 126B is configured to receive the data signal Vd, and the second terminal 126C is connected with the first terminal 122*b* (that is, the second node N2) of the driving sub-circuit 122. The data writing sub-circuit 126 is configured to write the data signal Vd to the first terminal 122*b* of the driving sub-circuit 122 in response to the first scan signal Ga1. For example, the first terminal 126*b* of the data writing sub-circuit 126 is connected with the data line 12 to receive the data signal Vd, and the control terminal 126*a* is connected with the gate line 11 as a scan line to receive the first scan signal Ga1. For example, in the data writing and compensation stage, the data writing sub-circuit 126 can be turned on in response to the first scan signal Ga1, so that the data signal can be written to the first terminal 122*b* (second node N2) of the driving sub-circuit 122 and stored in the storage sub-circuit 127, so that, for example, in the light emitting stage, the driving current driving the light emitting device 121 to emit light can be generated according to the data signal.

For example, the compensation sub-circuit 128 includes a control terminal 128*a*, a first terminal 128*b* and a second terminal 128*c*. The control terminal 128*a* of the compensation sub-circuit 128 is configured to receive the second scan signal Ga2. The first terminal 128*b* and the second terminal 128*c* of the compensation sub-circuit 128 are electrically connected with the second terminal 122*c* and the control terminal 122*a* of the driving sub-circuit 122 respectively, the compensation sub-circuit 128 is configured to compensate the threshold of the driving sub-circuit 122 in response to the second scan signal Ga2.

For example, the first scan signal Ga1 may be the same as the second scan signal Ga2. For example, the first scan signal Ga1 may be connected to the same signal output terminal as the second scan signal Ga2. For example, the first scan signal Ga1 and the second scan signal Ga2 may be transmitted through the same scan line.

In some other examples, the first scan signal Ga1 may be different from the second scan signal Ga2. For example, the first scan signal Ga1 and the second scan signal Ga2 may be connected to different signal output terminals. For example, the first scan signal Ga1 and the second scan signal Ga2 may be transmitted through different scan lines.

For example, the storage sub-circuit 127 includes a first terminal 127*a* and a second terminal 127*b*, the first terminal 127*a* of the storage sub-circuit is configured to receive the first power voltage VDD, and the second terminal 127*b* of the storage sub-circuit is electrically connected with the control terminal 122*a* of the driving sub-circuit.

For example, the storage sub-circuit 127 is electrically connected with the control terminal 122*a* of the driving sub-circuit 122 and the first voltage terminal vdd, and is configured to store the data signal written by the data writing sub-circuit 126. For example, in the data writing and compensation stage, the compensation sub-circuit 128 can be turned on in response to the second scan signal Ga2, so that the data signal written by the data writing sub-circuit 126 can be stored in the storage sub-circuit 127. For example, at the same time of the data writing and compensation stage, the compensation sub-circuit 128 can electrically connect the control terminal 122*a* and the second terminal 122*c* of the driving sub-circuit 122, so that the relevant information of the threshold voltage of the driving sub-circuit 122 can be stored in the storage sub-circuit accordingly, Thus, for example, in the light emitting stage, the stored data signal and the threshold voltage can be used to control the driving sub-circuit 122, so that the output of the driving sub-circuit 122 can be compensated.

For example, the first light emitting control sub-circuit 123 is connected with the first terminal 122*b* (second node N2) of the driving sub-circuit 122 and the first voltage terminal vdd, and is configured to apply the first power voltage VDD of the first voltage terminal vdd to the first terminal 122*b* of the driving sub-circuit 122 in response to the first light emitting control signal EM1. For example, as shown in FIG. 2A, the first light emitting control sub-circuit 123 is connected with the first light emitting control terminal EM1, the first voltage terminal vdd and the second node N2.

For example, the second light emitting control sub-circuit 124 is connected to the second light emitting control terminal EM2, the first terminal 134 of the light emitting device 121, and the second terminal 122*c* of the driving sub-circuit 122, and is configured to allow the driving current to be applied to the light emitting device 121 in response to the second light emitting control signal.

For example, in the light emitting stage, the second light emitting control sub-circuit 124 is turned on in response to the second light emitting control signal EM2 provided by the second light emitting control terminal EM2, so that the driving sub-circuit 122 can be electrically connected with the light emitting device 121 through the second light emitting control sub-circuit 124, so as to drive the light emitting device 121 to emit light under the control of the driving current; in the non-light emitting stage, the second light emitting control sub-circuit 124 is turned off in response to the second light emitting control signal EM2, so as to avoid current flowing through the light emitting device 121 to make the light emitting device 121 emit light, and improve the contrast of the corresponding display device.

For another example, in the initialization stage, the second light emitting control sub-circuit 124 may also be turned on in response to the second light emitting control signal EM2, so that the reset sub-circuit can be combined to reset the driving sub-circuit 122 and the light emitting device 121.

For example, the second light emitting control signal EM2 may be the same as the first light emitting control signal EM1. For example, the second light emitting control signal EM2 may be connected to the same signal output terminal as the first light emitting control signal EM1. For example, the second light emitting control signal EM2 and the first light emitting control signal EM1 may be transmitted through the same light emitting control line.

In some other examples, the second light emitting control signal EM2 may be different from the first light emitting control signal EM1. For example, the second light emitting control signal EM2 and the first light emitting control signal EM1 may be connected to different signal output terminals. For example, the second light emitting control signal EM2 and the first light emitting control signal EM1 may be transmitted through different light emitting control lines.

For example, the first reset sub-circuit 125 is connected to the first reset voltage terminal Vinit1 and the control terminal 122*a* (first node N1) of the driving sub-circuit 122, and is configured to apply the first reset voltage Vinit1 to the control terminal 122*a* of the driving sub-circuit 122 in response to the first reset control signal Rst1.

For example, the second reset sub-circuit 129 is connected to the second reset voltage terminal Vinit2 and the first terminal 134 (the fourth node N4) of the light emitting device 121, and is configured to apply the second reset voltage Vinit2 to the first terminal 134 of the light emitting device 121 in response to the second reset control signal Rst2.

For example, the first reset sub-circuit 125 and the second reset sub-circuit 129 may be turned on respectively in response to the first reset control signal Rst1 and the second reset control signal Rst2, so that the second reset voltage Vinit2 may be applied to the first node N1 and the first reset voltage Vinit1 may be applied to the first terminal 134 of the light emitting device 121, so that the driving sub-circuit 122, the compensation sub-circuit 128 and the light emitting device 121 can be reset to eliminate the influence of the previous light emitting stage.

Figure 3A:
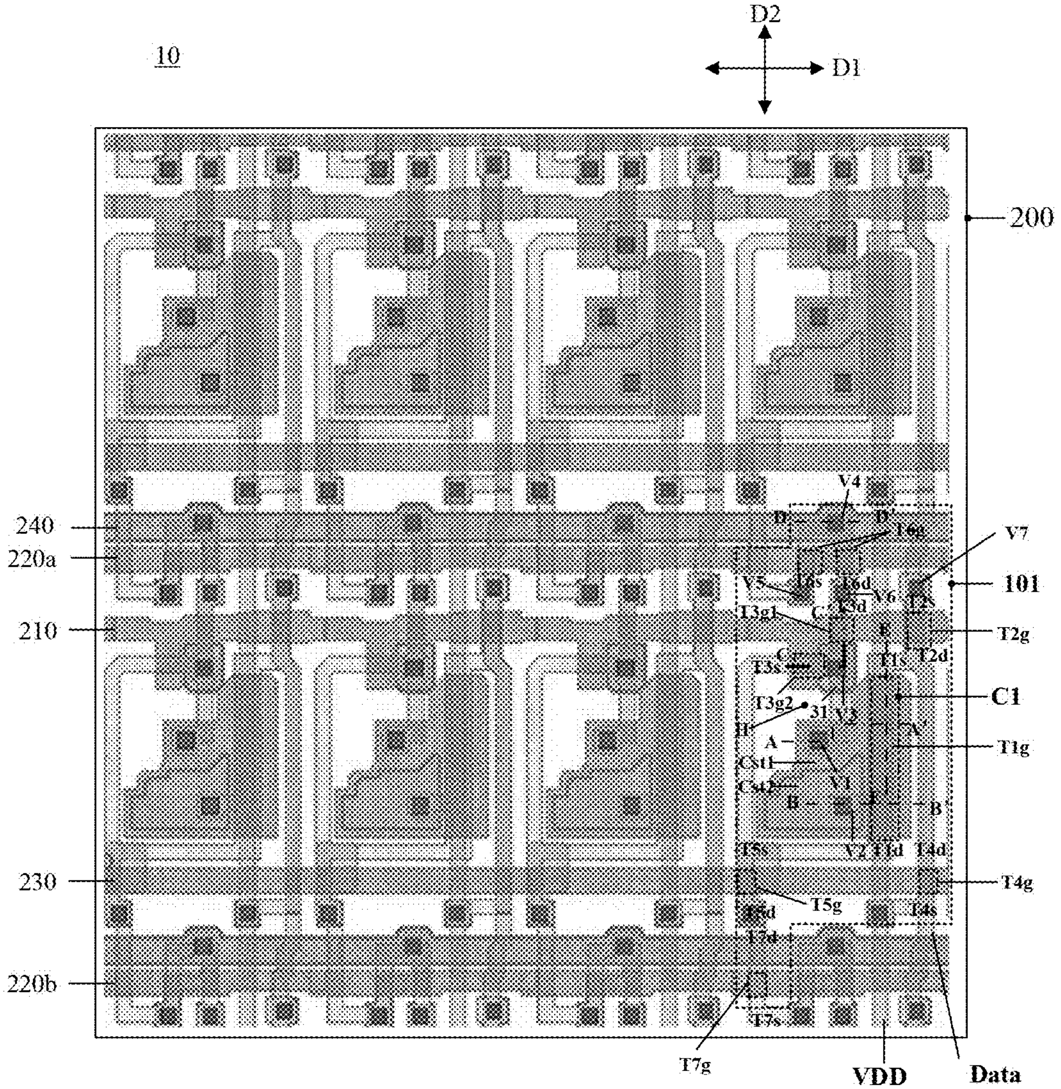
FIG. 3A is a schematic structure diagram of a sub-pixel of a display substrate provided by an embodiment of the present disclosure.

For example, the second reset control signal Rst2 of each row of sub-pixels may be the same signal as the first scan signal Ga1 of the each row of sub-pixels, and the two signals may be transmitted through the same gate line (for example, the reset control line 220*b* in FIG. 3A). For example, the first reset control signal Rst1 of each row of sub-pixels and the first scan signal Ga1 of the previous row of sub-pixels may be transmitted through the same gate line (for example, the reset control line 220*a* in FIG. 3A).

For example, as shown in FIG. 2A, the light emitting device 121 includes a first terminal 134 and a second terminal 135, the first terminal 134 of the light emitting device 121 is configured to be connected to the second terminal 122*c* of the driving sub-circuit 122, and the second terminal 135 of the light emitting device 121 is configured to be connected to a second voltage terminal VSS. For example, in one example, as shown in FIG. 2A, the first terminal 134 of the light emitting device 121 may be connected to the fourth node N4 through the second light emitting control sub-circuit 124. Embodiments of the present disclosure include, but are not limited to, this situation.

It should be noted that, in the description of the embodiments of the present disclosure, the first node N1, the second node N2, the third node N3 and the fourth node N4 do not necessarily represent actual components, but represent the meeting points of related circuit connections in the circuit diagram.

It should be noted that, in the description of the embodiments of the present disclosure, the symbol Vd can represent both the data signal terminal and the level of the data signal. Similarly, the symbols Ga1 and Ga2 can respectively represent the first scan signal and the second scan signal, and can also respectively represent the first scan signal terminal and the second scan signal terminal, the symbol Rst1 can represent both the first reset control terminal and the first reset control signal, and the symbol Rst2 can represent both the second reset control terminal and the first reset control signal, the symbols Vinit1 and Vinit2 can respectively represent both the first reset voltage terminal and the second reset voltage terminal, and can also respectively represent the first reset voltage and the second reset voltage, and the symbol VDD can represent both the first power voltage and the first power line, the symbol VSS can represent both the common power voltage and the common power line. The following embodiments are the same and will not be repeated.

Figure 2B:
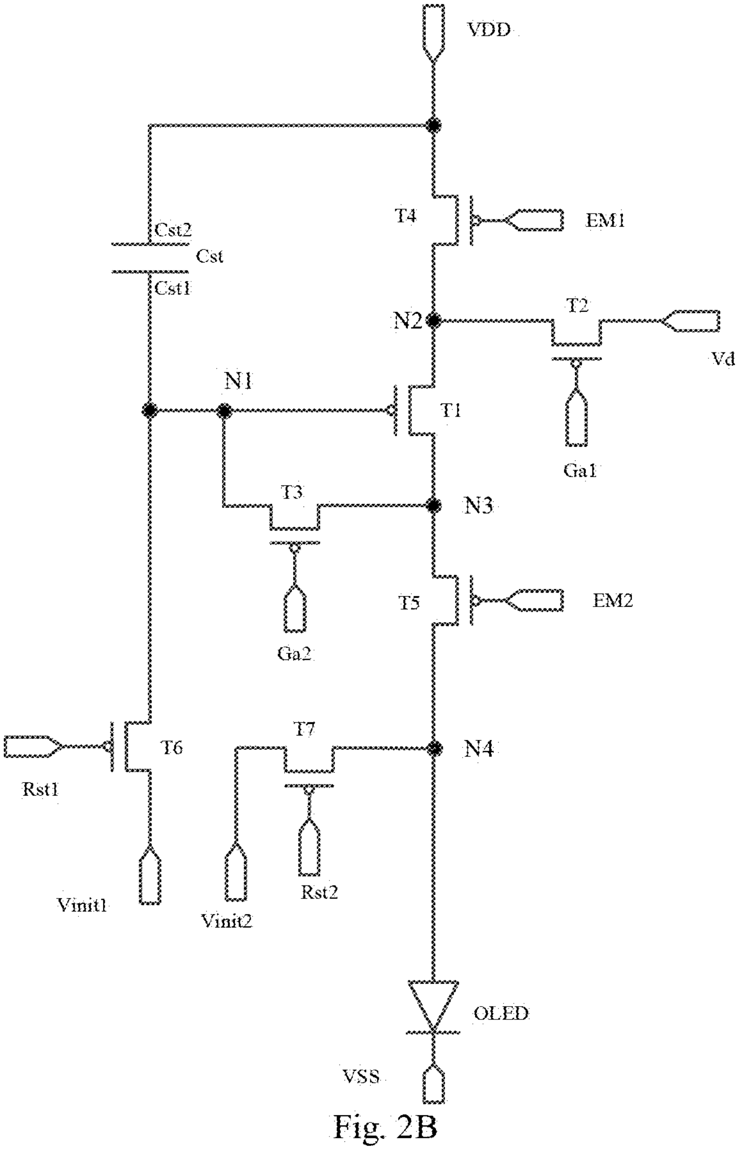
FIG. 2B is a circuit diagram of a specific example of the pixel circuit shown in FIG. 2A.

FIG. 2B is a circuit diagram of a specific implementation example of the pixel circuit shown in FIG. 2A. As shown in FIG. 2B, the pixel circuit includes first to seventh transistors T1, T2, T3, T4, T5, T6, T7 and a storage capacitor Cst. For example, the first transistor T1 is used as the driving transistor, and the other second to seventh transistors are used as switching transistors.

For example, as shown in FIG. 2B, the driving sub-circuit 122 may be implemented as the first transistor T1. The gate electrode of the first transistor T1 serves as the control terminal 122*a* of the driving sub-circuit 122 and is connected to the first node N1; the first electrode of the first transistor T1 serves as the first terminal 122*b* of the driving sub-circuit 122 and is connected to the second node N2; and the second electrode of the first transistor T1 serves as the second terminal 122*c* of the driving sub-circuit 122, and is connected to the third node N3.

For example, as shown in FIG. 2B, the data writing sub-circuit 126 may be implemented as the second transistor T2. The gate electrode of the second transistor T2 is connected to the first scan line (the first scan signal terminal Ga1) to receive the first scan signal, and the first electrode of the second transistor T2 is connected to the data line (the data signal terminal Vd) to receive the data signal, and the second electrode of the second transistor T2 is connected to the first terminal 122*b* (the second node N2) of the driving sub-circuit 122.

For example, as shown in FIG. 2B, the compensation sub-circuit 128 may be implemented as the third transistor T3. The gate electrode, the first electrode and the second electrode of the third transistor T3 serve as the control terminal 128*a*, the first terminal 128*b* and the second terminal 128*c* of the compensation sub-circuit, respectively. The gate electrode of the third transistor T3 is configured to be connected to the second scan line (the second scan signal terminal Ga2) to receive the second scan signal, the first electrode T3*s* of the third transistor T3 is connected to the second electrode T1*d* of the first transistor T1 (the third node N3), and the second electrode T3*d* of the third transistor T3 is electrically connected to the gate electrode T1*g* (the first node N1) of the first transistor T1. For example, as shown in FIG. 2B, the storage sub-circuit 127 may be implemented as a storage capacitor Cst, the storage capacitor Cst includes a first electrode plate Cst1 and a second electrode plate Cst2, and the first electrode plate Cst1 is electrically connected to the first voltage terminal vdd, the second electrode plate Cst2 is electrically connected to the gate electrode T1*g* (the first node N1) of the first transistor T1.

For example, as shown in FIG. 2B, the first light emitting control sub-circuit 123 may be implemented as the fourth transistor T4. The gate electrode of the fourth transistor T4 is connected to the first light emitting control line (the first light emitting control terminal EM1) to receive the first light emitting control signal, and the first electrode of the fourth transistor T4 is connected to the first voltage terminal vdd to receive the first power voltage, the second electrode of the fourth transistor T4 is connected to the first terminal 122*b* (the second node N2) of the driving sub-circuit 122.

For example, the light emitting device 121 is implemented as a light emitting diode (LED), such as an organic light emitting diode (OLED), a quantum dot light emitting diode (QLED), or an inorganic light emitting diode, such as a micro light emitting diode (Micro LED) or a micro OLED. For example, the light emitting device 121 may be a top emission structure, a bottom emission structure or a double-sided emission structure. The light emitting device 121 can emit red light, green light, blue light or white light, and the like. The embodiments of the present disclosure do not limit the specific structure of the light emitting device.

For example, the first terminal of the light emitting device 121 includes a first electrode (for example, an anode), the first electrode is connected to the fourth node N4, and is configured to be connected to the second terminal 122*c* of the driving sub-circuit 122 through the second light emitting control sub-circuit 124, the second terminal of the light emitting device 121 includes a second electrode (for example, a cathode), the second electrode is configured to be connected to the common power voltage terminal VSS to receive the common power voltage VSS, and the current flowing into the light emitting device 121 from the second terminal 122*c* of the driving sub-circuit 122 determines the brightness of the light emitting device. For example, the common power voltage terminal VSS may be grounded, that is, VSS may be 0V. For example, the common power voltage VSS may be a negative voltage.

For example, the second light emitting control sub-circuit 124 may be implemented as the fifth transistor T5. The gate electrode of the fifth transistor T5 is connected to the second light emitting control line (the second light emitting control terminal EM2) to receive the second light emitting control signal, the first electrode of the fifth transistor T5 is connected to the second terminal 122*c* (the third node N3) of the driving sub-circuit 122, and the second electrode of the fifth transistor T5 is connected to the first terminal 134 (the fourth node N4) of the light emitting device 121.

For example, the first reset sub-circuit 125 may be implemented as the sixth transistor T6, and the second reset sub-circuit may be implemented as the seventh transistor T7. The gate electrode of the sixth transistor T6 is configured to be connected to the first reset control terminal Rst1 to receive the first reset control signal Rst1, and the first electrode of the sixth transistor T6 is connected to the first reset voltage terminal Vinit1 to receive the first reset voltage Vinit1, the second electrode of the sixth transistor T6 is configured to be connected to the first node N1. The gate electrode of the seventh transistor T7 is configured to be connected to the second reset control terminal Rst2 to receive the second reset control signal Rst2, and the first electrode of the seventh transistor T7 is connected to the second reset voltage terminal Vinit2 to receive the second reset voltage Vinit2, the second electrode of the seventh transistor T7 is configured to be connected to the fourth node N4.

It should be noted that, the transistors used in the embodiments of the present disclosure may all be thin film transistors, field effect transistors, or other switching devices with the same characteristics, and the thin film transistors are taken as examples in the embodiments of the present disclosure. The source and drain electrodes of the transistors used here may be symmetrical in structure, so the source and drain electrodes of the transistors may be indistinguishable in structure. In the embodiments of the present disclosure, in order to distinguish the two electrodes of the transistors except the gate electrode, one electrode is directly described as the first electrode, and the other electrode is the second electrode.

In addition, transistors can be divided into N-type and P-type transistors according to their characteristics. In the case that the transistor is a P-type transistor, the turn-on voltage is a low-level voltage (for example, 0V, −5V, −10V, or other suitable voltages), and the turn-off voltage is a high-level voltage (for example, 5V, 10V, or other suitable voltages); in the case that the transistor is an N-type transistor, the turn-on voltage is a high-level voltage (for example, 5V, 10V or other suitable voltages), and the turn-off voltage is a low-level voltage (for example, 0V, −5V, −10V or other suitable voltages). For example, as shown in FIG. 2B, the first to seventh transistors T1-T7 are all P-type transistors, such as low temperature polysilicon thin film transistors. However, the embodiments of the present disclosure do not limit the type of the transistor, and when the type of the transistor changes, the connection relationship in the circuit can be adjusted accordingly.

Figure 2C:
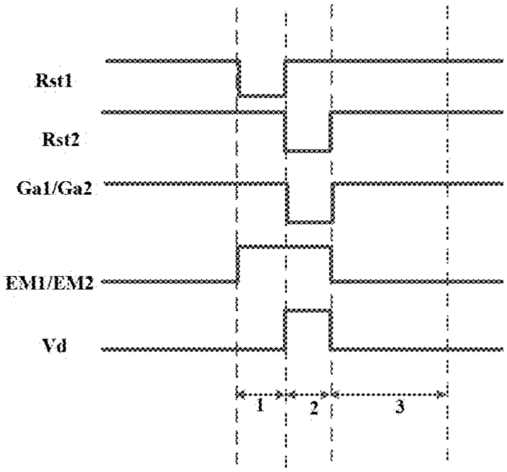
FIG. 2C is a signal timing diagram of a driving method of a pixel circuit provided by at least one embodiment of the present disclosure.

The working principle of the pixel circuit shown in FIG. 2B will be described below with reference to the signal timing diagram shown in FIG. 2C. As shown in FIG. 2C, the display process of each frame of image includes three stages, which are respectively an initialization stage 1, a data writing and compensation stage 2, and a light emitting stage 3.

As shown in FIG. 2C, in this embodiment, the first scan signal Ga1 and the second scan signal Ga2 adopt the same signal, the first light emitting control signal EM1 and the second light emitting control signal EM2 adopt the same signal; and the waveforms of the second reset control signal Rst2 and the first scan signal Ga1/the second scan signal Ga2 are the same, that is, the second reset control signal Rst2, the first scan signal Ga1/the second scan signal Ga2 can adopt the same signal; the first reset signal Rst1 of the sub-pixels in the current row has the same waveform as the first scan signal Ga1/second scan signal Ga2 of the sub-pixels in the previous row, that is, the same signal is adopted. However, this is not a limitation of the present disclosure. In other embodiments, different signals may be adopted as the first scan signal Ga1, the second scan signal Ga2, the first reset control signal Rst1, and the second reset control signal Rst2, respectively, and different signals are adopted as the first light emitting control signal EM1 and the second light emitting control signal EM2, respectively.

In the initialization stage 1, the first reset control signal Rst1 is input to turn on the sixth transistor T6, and the first reset voltage Vinit1 is applied to the gate electrode of the first transistor T1, thereby resetting the first node N1.

In the data writing and compensation stage 2, the first scan signal Ga1, the second scan signal Ga2 and the data signal Vd are input, the second transistor T2 and the third transistor T3 are turned on, and the data signal Vd is written into the second node N2 by the second transistor T2, and the first node N1 is charged through the first transistor T1 and the third transistor T3 until the potential of the first node N1 changes to Vd+Vth, the first transistor T1 is turned off, where Vth is the threshold voltage of the first transistor T1. The potential of the first node N1 is stored in the storage capacitor Cst and kept, that is to say, the voltage information with the data signal and the threshold voltage Vth is stored in the storage capacitor Cst, so as to be used in the subsequent light emitting stage to provide the grayscale display data and compensate for the threshold voltage of the first transistor T1 itself.

In the data writing and compensation stage 2, the second reset control signal Rst2 may also be input to turn on the seventh transistor T7, and the second reset voltage Vinit2 is applied to the fourth node N4, thereby resetting the fourth node N4. For example, the reset of the fourth node N4 may also be performed in the initialization stage 1, for example, the first reset control signal Rst1 and the second reset control signal Rst2 may be the same. The embodiments of the present disclosure are not limited in this aspect.

In the light emitting stage 3, the first light emitting control signal EM1 and the second light emitting control signal EM2 are input to turn on the fourth transistor T4, the fifth transistor T5 and the first transistor T1, and the fifth transistor T5 applies the driving current to the OLED to emit light. The value of the driving current Id flowing through the OLED can be obtained according to the following formula:

$$Id=K(VGS-Vth)2=K[(Vd+Vth-VDD)-Vth]2=K(Vd-VDD)2,$$ where $K$ is the conductivity coefficient of the first transistor.

In the above formula, Vth represents the threshold voltage of the first transistor T1, VGS represents the voltage between the gate electrode and the source electrode (here, the first electrode) of the first transistor T1, and K is a constant value related to the first transistor T1 itself. It can be seen from the above calculation formula of Id that the driving current Id flowing through the OLED is no longer related to the threshold voltage Vth of the first transistor T1, so that the compensation of the pixel circuit can be realized, and the problem of threshold voltage drift of the driving transistor (the first transistor T1 in the embodiments of the present disclosure) due to the process and long-term operation is solved, and the influence on the driving current Id is eliminated, so that the display effect of the display device using the display substrate can be improved.

FIG. 3A is a schematic structure diagram of a sub-pixel of a display substrate provided by an embodiment of the present disclosure; FIGS. 3B-3I are schematic planar views of a semiconductor layer, a first conductive layer, a second conductive layer, a third conductive layer in the display substrate shown in FIG. 3A and a first electrode; FIG. 4A is a cross-sectional view along a line A-A' in FIG. 3A; FIG. 4B is a cross-sectional view along a line B-B' in FIG. 3A; FIG. 4C is a cross-sectional view along a line C-C' in FIG. 3A; FIG. 4D is a cross-sectional view along a line D-D' in FIG. 3A; FIG. 4E is a cross-sectional view along a line E-E' in FIG. 3A; FIG. 4F is a schematic planar view of a channel region of another driving transistor of a display substrate provided by at least one embodiment of the present disclosure; and FIG. 4G is a partially enlarged schematic diagram of a sub-pixel in FIG. 3A. The structure of the display substrate provided by at least one embodiment of the present disclosure will be exemplarily described below by taking the pixel circuit shown in FIG. 2B as an example and in conjunction with FIGS. 3B-3I and FIGS. 4A-4G.

Referring to FIG. 3A, FIG. 4B and FIG. 4G, the display substrate 10 includes a base substrate 200, a first signal line extending along the first direction D1 as a whole and a second signal line extending along the second direction D2, intersecting the first direction D1, as a whole on the base substrate 200; for example, the first signal line intersects the second signal line to define a sub-pixel, for example, a plurality of sub-pixels. It should be noted that the boundary of each of the plurality of sub-pixels is not necessarily the first signal line and the second signal line. The first signal line intersecting the second signal line to define a sub-pixel means that the arrangement of the sub-pixels is consistent with the arrangement of the plurality of regions defined by the intersection of the first signal line and the second signal line, that is, the plurality of sub-pixels correspond to the plurality of regions in one-to-one correspondence. For example, the first signal line is a gate line serving as a scan signal line, and the second signal line is a data line; or, in some other embodiments, the first signal line is a data line, and the second signal line is a gate line serving as a scan signal line. Each of at least part sub-pixels in the plurality of sub-pixels includes a pixel circuit 101, and the pixel circuit 101 includes the above-mentioned light emitting device, the driving transistor T1, and the data writing transistor T2. For example, the above at least part sub-pixels refer to sub-pixels that perform the display function, instead of dummy sub-pixels. The data writing transistor T2 is configured to transmit the data signal Vd to the driving transistor T1 under the control of the first scan signal Ga1, the first scan signal Ga1 is transmitted on the first signal line, and the data signal Vd is transmitted on the second signal line; the driving transistor T1 is configured to control the magnitude of the driving current flowing through the light emitting device 121 according to the data signal Vd, the driving transistor T1 includes an active pattern T1*a* and a gate electrode T1*g*, and the active pattern T1*a* includes a channel region C1 (the dashed frame in the planar view shown in FIG. 3A and shown in FIG. 4A), an orthographic projection of the channel region C1 on the base substrate 200 overlaps with an orthographic projection of the gate electrode T1*g* on the base substrate 200; a planar shape of the channel region C1 of the driving transistor T1 is a strip shape extending along the second direction D2 as a whole; the light emitting device is configured to receive the driving current and is driven by the driving current to emit light. In the display substrate 10 provided by the embodiments of the present disclosure, the planar shape of the channel region C1 of the driving transistor T1 is a stripe shape extending along the second direction D2 as a whole, and this feature can increase the length (the length along the second direction D2) of the channel region of the driving transistor T1, thereby increasing the length-width ratio of the channel region of the driving transistor to ensure that in the black state, the current leakage of the driving transistor T1 can be small and the driving is stable; the greater the length of the channel region of the driving transistor T1, the closer the output curve of the driving transistor T1 in the saturation region is to the ideal linear state, so that the display substrate such as the OLED display substrate works in the saturation region of the driving transistor T1, and the brightness of the display panel using the display substrate can be better controlled by the driving transistor T1; in addition, this feature is beneficial to save the layout space of the pixel circuit. The channel region C1 is different from the existing channel with a shape of "ЛL", or a shape of "S" and the like which extends along the first direction D1 and has an obvious bending part.

It should be noted that the feature "strip shape extending along the second direction D2 as a whole" includes the case that the strip shape extends generally along the second direction D2, that is, extends along the second direction D2 as a whole. For example, in some examples, the strip shape extending along the second direction D2 as a whole may have a certain curved portion, for example, it may be a wave shape extending along the second direction D2 as a whole as shown in FIG. 4F; alternatively, in some examples, the edge of the strip shape extending along the second direction D2 as a whole may not be a very smooth line, for example, the edge may have burrs or serrations. In short, it suffices to satisfy the strip shape extending along the second direction D2 as a whole.

Figure 3B:
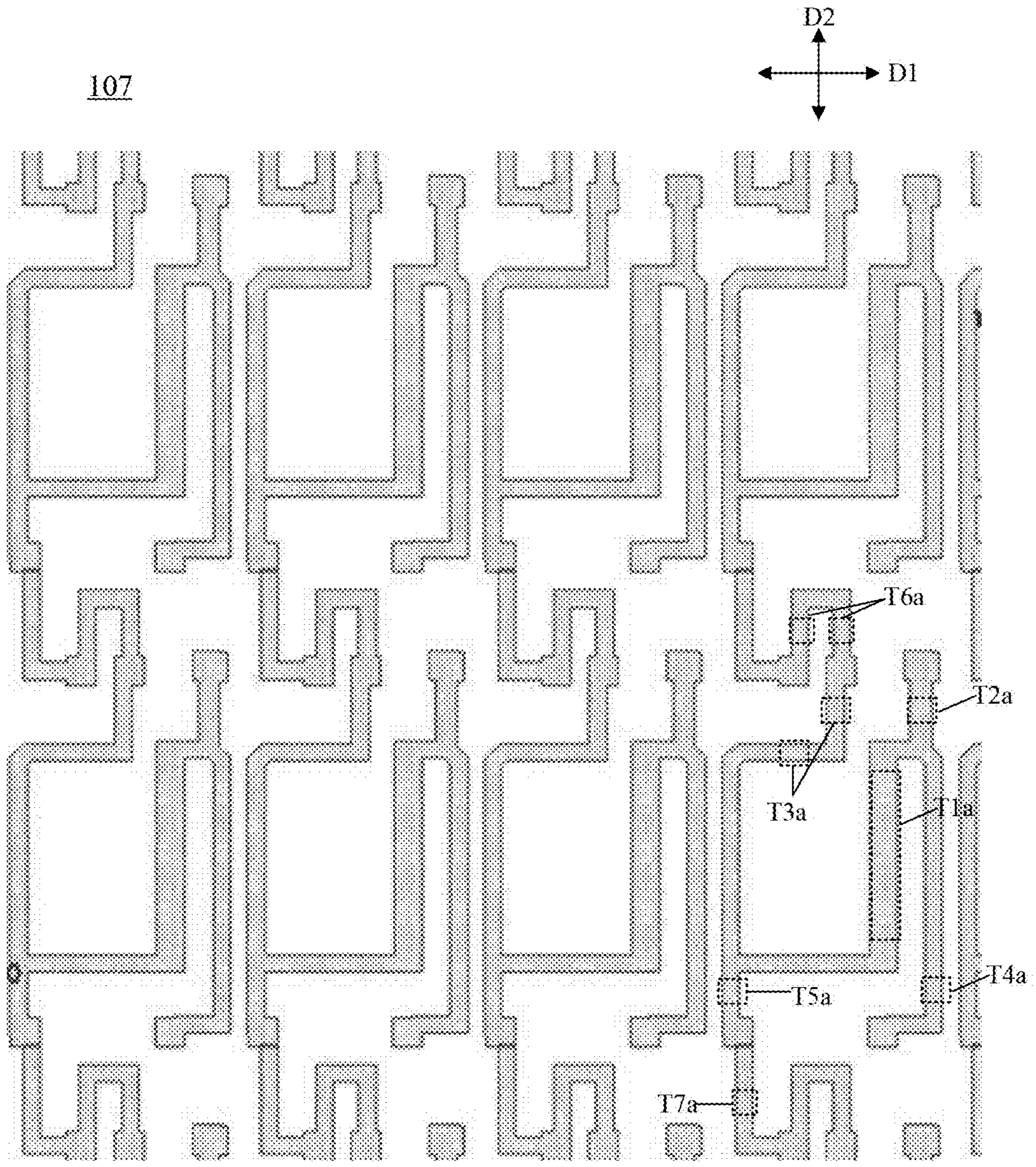
FIG. 3B is a schematic planar view of a semiconductor layer in the display substrate shown in FIG. 3A.
Figure 4A:
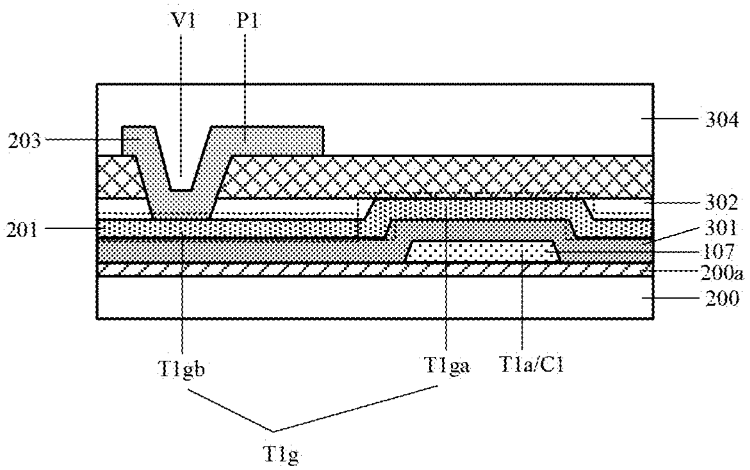
FIG. 4A is a cross-sectional view along a line A-A' in FIG. 3A.
Figure 4B:
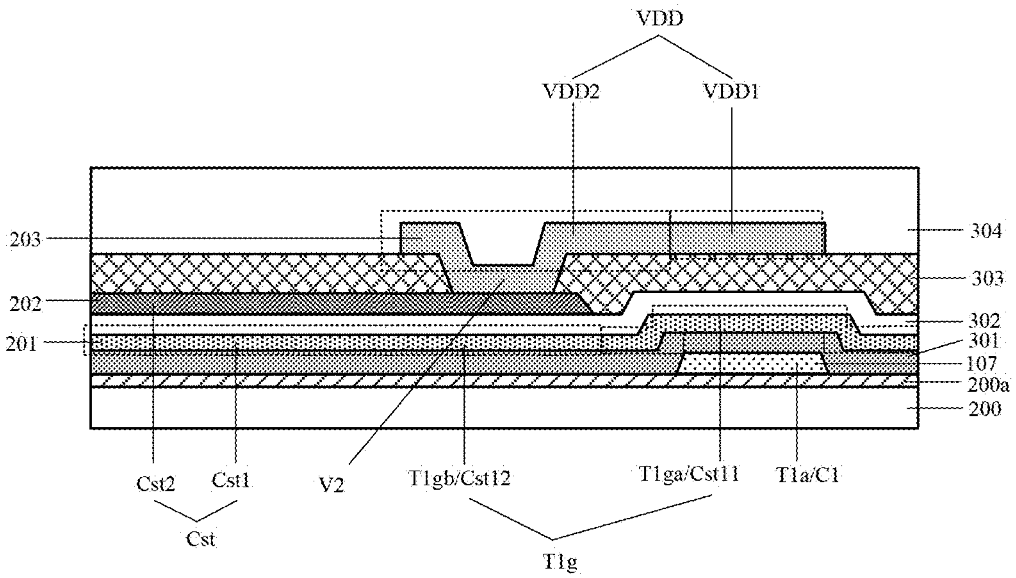
FIG. 4B is a cross-sectional view along a line B-B' in FIG. 3A.
Figure 4C:
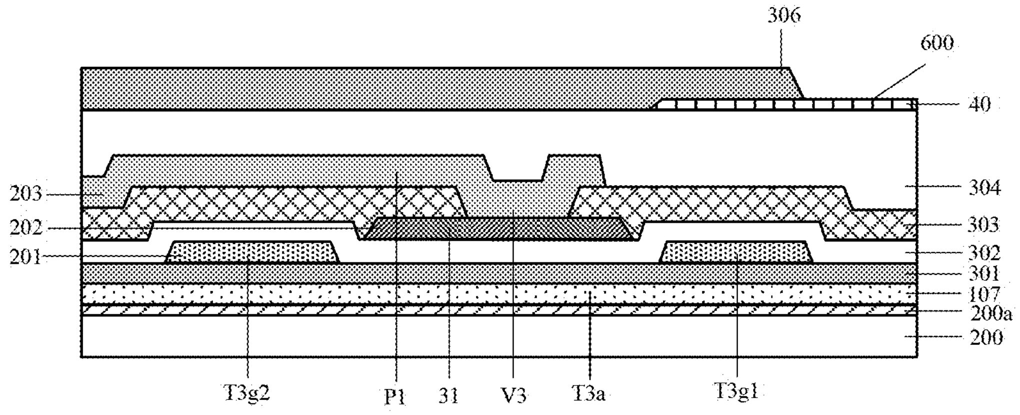
FIG. 4C is a cross-sectional view along a line C-C' in FIG. 3A.
Figure 4D:
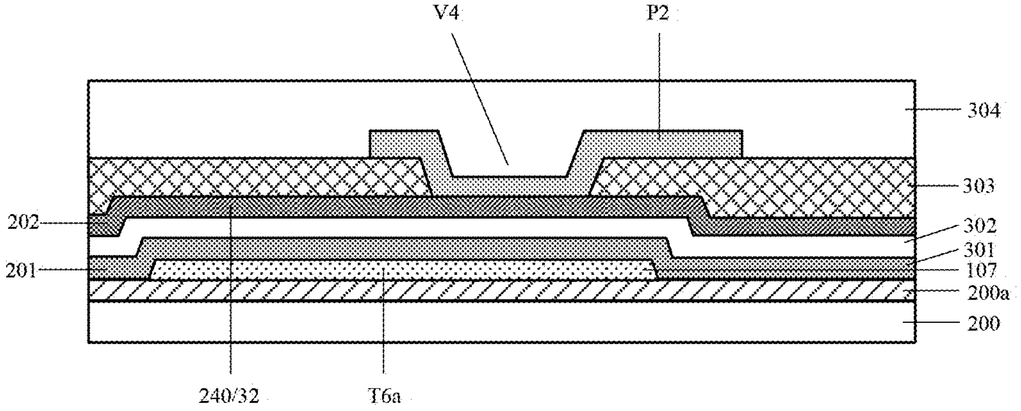
FIG. 4D is a cross-sectional view along a line D-D' in FIG. 3A.
Figure 4E:
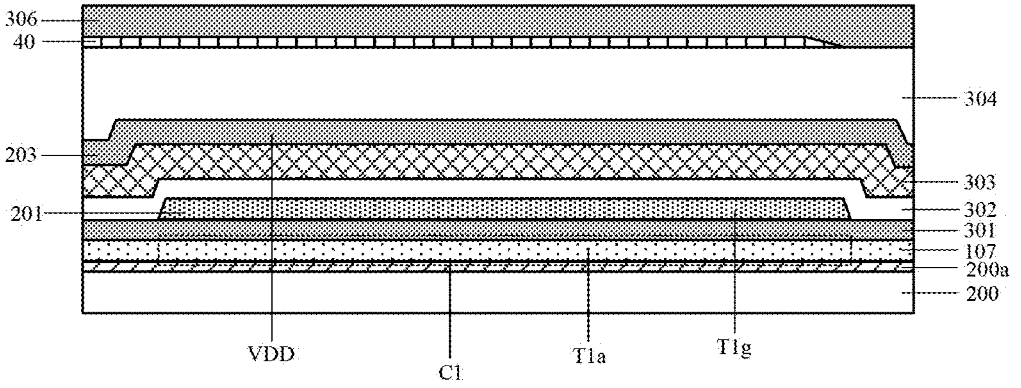
FIG. 4E is a cross-sectional view along a line E-E' in FIG. 3A.
Figure 4F:
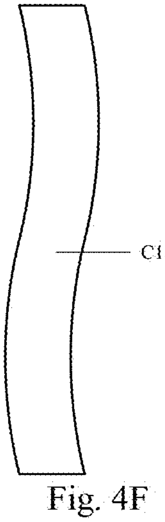
FIG. 4F is a schematic planar view of a channel region of another driving transistor of a display substrate provided by at least one embodiment of the present disclosure.
Figure 4G:
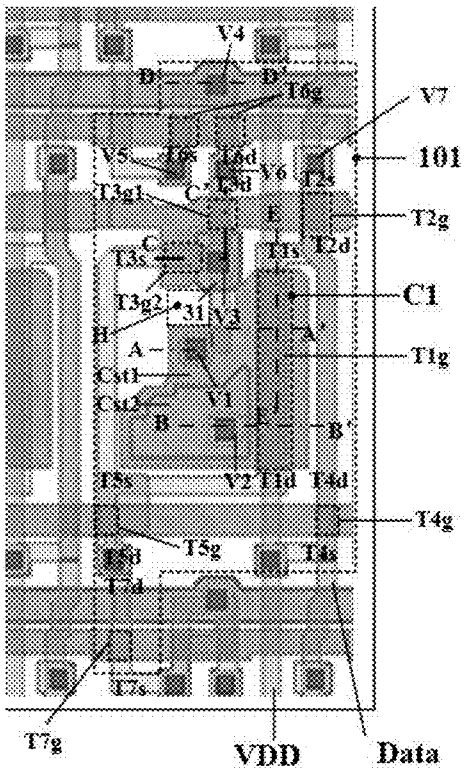
FIG. 4G is a partially enlarged schematic diagram of a sub-pixel in FIG. 3A.

For example, as shown in FIG. 3A and FIG. 3B, the planar shape of the channel region C1 of the driving transistor T1 is a straight strip shape extending along the second direction D2, so as to better increase the length-width ratio of the channel region C1 of the driving transistor T1 and make the planar shape of the channel region C1 of the driving transistor T1 more regular, so as to facilitate manufacture and better save the layout space of the pixel circuit.

Referring to FIGS. 3B-3G and FIGS. 4A-4D, the display substrate 10 includes a semiconductor layer 107, a first insulating layer 301, a first conductive layer 201, a second insulating layer 302, a second conductive layer 202, a third insulating layer 303, a third conductive layer 203, a fourth insulating layer 304 and a fourth conductive layer 204 that are sequentially arranged on the base substrate 200.

For example, as shown in FIG. 3B, the semiconductor layer 107 includes the first to the seventh active patterns T1a-T7a respectively of the first to seventh transistors T1-T7. As shown in FIG. 3B, the first to the seventh active patterns T1a-T7a respectively of the first to seventh transistors T1-T7 are connected to each other to constitute a continuous and integral structure. For example, the semiconductor layers 107 in each column of sub-pixels are connected to each other to form a continuous and integral structure, and the semiconductor layers in two adjacent columns of sub-pixels are spaced apart from each other.

Figure 3C:
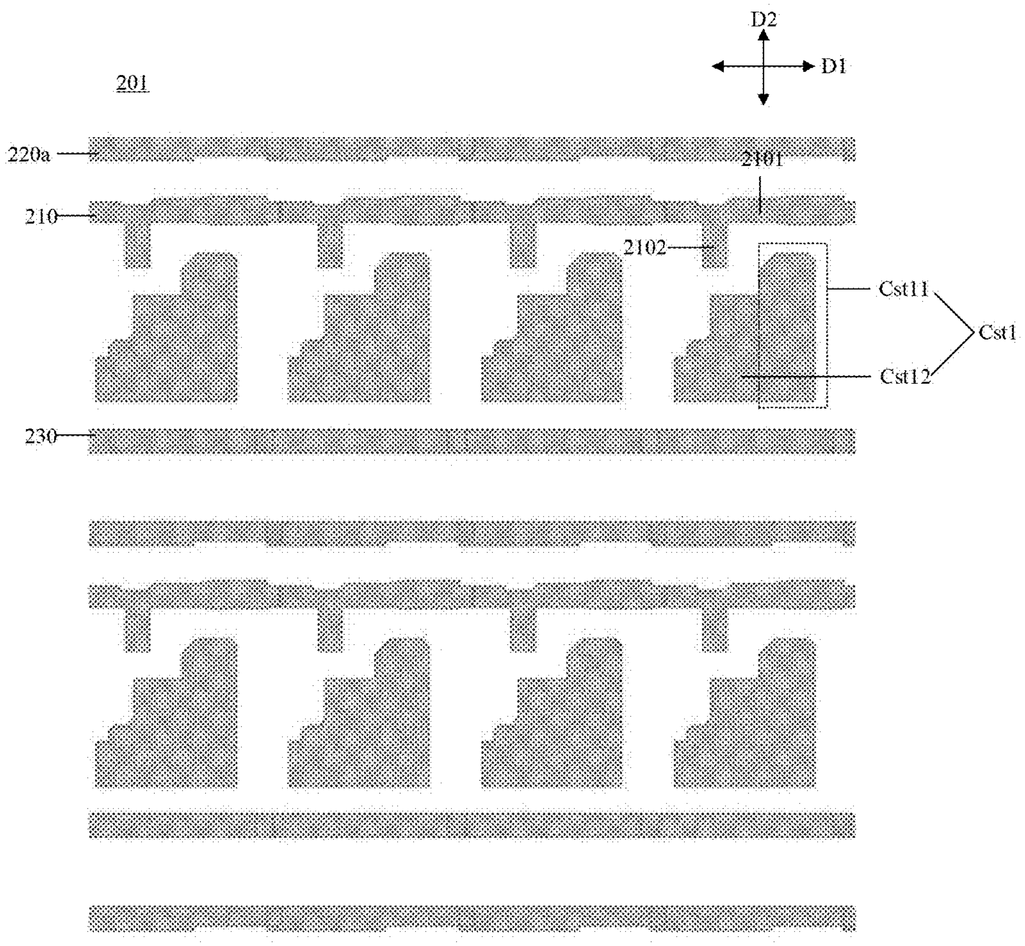
FIG. 3C is a schematic planar view of a first conductive layer in the display substrate shown in FIG. 3A.
Figure 3D:
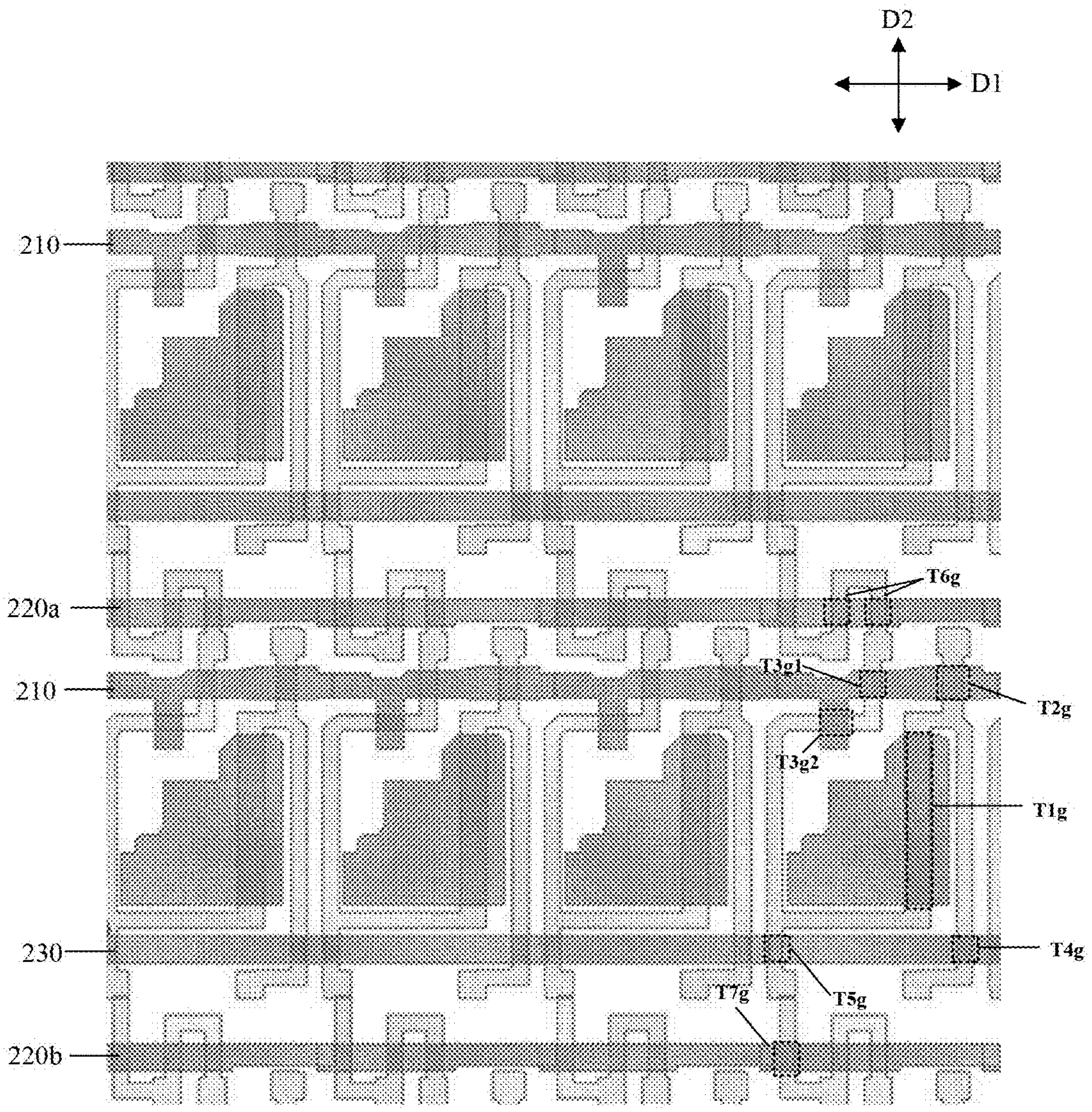
FIG. 3D is a schematic planar view of the stacking of a semiconductor layer and a first conductive layer in the display substrate shown in FIG. 3A.

For example, as shown in FIGS. 3C-3D, the first conductive layer 201 includes the gate electrode of each transistor and some scan lines and control lines. The region where the pixel circuit of each sub-pixel is located is shown by a large dashed frame in FIG. 3A, and the first to seventh gate electrodes T1g-T7g respectively of the first to seventh transistors T1-T7 in one pixel circuit unit 100 are shown by a small dashed frame in FIG. 3D.

For example, as shown in FIGS. 3C-3D, the first conductive layer 201 includes the first to seventh gate electrodes T1g-T7g of the first to seventh transistors T1-T7. For example, the display substrate 10 adopts a self-alignment process, and uses the first conductive layer 201 as a mask to perform a conductive treatment (for example, a doping treatment) on the semiconductor layer 107, so that the portion of the semiconductor layer 107 that is not covered by the first conductive layer 201 is conducted, and therefore portions of the active pattern of each transistor on both sides of the channel region are turned to be electrically conductive to form the first electrode and the second electrode of the transistor, respectively.

For example, the first conductive layer 201 further includes a plurality of gate lines insulated from each other, and the gate lines include, for example, a plurality of scan lines 210, a plurality of reset control lines 220a/220b and a plurality of light emitting control lines 230. Here, the gate line refers to a signal line directly connected to the gate electrode of the transistor to provide a scan signal or a control signal. For example, each row of sub-pixels is respectively connected to one scan line 210, two reset control lines and one light emitting control line 230, and the two reset control lines are respectively a first reset control line 220a and a second reset control line 220b.

For example, as shown in FIG. 3A and FIG. 3D, the gate electrode Tog of the sixth transistor T6 of the pixel circuit of the current row is electrically connected to the first reset control line 220a corresponding to the current row to receive the first reset control signal Rst1. The gate electrode of the seventh transistor T7 of the pixel circuit of the current row is electrically connected to the second reset control line 220b corresponding to the pixel circuit of the next row (that is, according to the scan sequence of the scan lines, the row of pixel circuits where the scan line, sequentially turned on after the scan line of the current row, is located) to receive the second reset control signal Rst2.

The scan line 210 is electrically connected (or in an integral structure) to the gate electrode of the second transistor T2 in the corresponding row of sub-pixels to provide the first scan signal Ga1, and one reset control line 220 is electrically connected to the gate electrode T6 of the sixth transistor in the corresponding row of sub-pixels to provide the first reset control signal Rst1, and the light emitting control line 230 is electrically connected to the gate electrode of the fourth transistor T4 in the corresponding row of sub-pixels to provide the first light emitting control signal EM1.

For example, as shown in FIG. 3A, the scan line 210 is also electrically connected to the gate electrodes T3g1/T3g2 of the third transistor T3 to provide the second scan signal Ga2, that is, the first scan signal Ga1 and the second scan signal Ga2 may be the same signal; a part of the scan line 210 constitutes the first gate electrode T3g1 and the second gate electrode T3g2 of the third transistor T3. The light emitting control line 230 is also electrically connected to the gate electrode T5g of the fifth transistor T5 to provide the second light emitting control signal EM2, that is, the first light emitting control signal EM1 and the second light emitting control signal EM2 are the same signal; and a part of the light emitting control line 230 constitutes the gate electrode T5g of the fifth transistor T5.

For example, with reference to FIG. 3A and FIG. 4B, the pixel circuit 101 further includes a storage capacitor Cst, and the storage capacitor Cst includes a first electrode plate Cst1 and a second electrode plate Cst2. The first electrode plate Cst1 is electrically connected to the gate electrode T1g of the driving transistor T1; an orthographic projection of the second electrode plate Cst2 on the base substrate 200 at least partially overlaps with an orthographic projection of the first electrode plate Cst1 on the base substrate 200, and does not overlap with an orthographic projection of the channel region C1 of the driving transistor T1 on the base substrate 200. Because the second electrode plate Cst2 is connected to the first power voltage VDD for voltage stabilization, the first power voltage signal will affect the channel region C1 of the driving transistor T1, in order to reduce the impact on the channel region C1 of the driving transistor T1, the second electrode plate Cst2 is made to avoid the channel region C1 of the driving transistor T1, so as to avoid the performance of the driving transistor from being affected.

For example, the first electrode plate Cst1 includes a first portion Cst11 and a second portion Cst12. The first portion Cst11 of the first electrode plate Cst1 extends along the second direction D2, for example, the planar pattern of the first electrode plate Cst1 is in an L shape; and an orthographic projection of the first portion Cst11 of the first electrode plate Cst1 on the base substrate 200 overlaps with an orthographic projection of the channel region C1 of the driving transistor T1 on the base substrate 200; the second portion Cst12 of the first electrode plate Cst1 is connected to the first portion Cst11, and extends from the first portion Cst11 of the first electrode plate Cst1 along the first direction D1 to protrude from the first portion Cst11 of the first electrode plate Cst1, an orthographic projection of the second portion Cst12 of the first electrode plate Cst1 on the base substrate 200 at least partially overlaps with an orthographic projection of the second electrode plate Cst2 on the base substrate 200.

For example, as shown in FIG. 4B, the first electrode plate Cst1 and the gate electrode T1*g* of the driving transistor T1 are disposed in the same layer and have an integral structure, for example, both are located in the first conductive layer 201 to simplify the structure of the display substrate 10, and the first electrode plate Cst1 and the gate electrode T1*g* of the driving transistor T1 can be formed by the same patterning process performed on the same layer through the same mask, which simplifies the manufacturing process of the display substrate 10. In this case, the first portion Cst11 of the first electrode plate Cst1 is the first portion T1*ga* of the gate electrode of the driving transistor T1, and the second portion Cst12 is the second portion T1*gb* of the gate electrode of the driving transistor T1.

It should be noted that the "in a/the same layer" in the present disclosure refers to two (or more than two) structures formed by the same deposition process and patterned by the same patterning process, the materials of the two (or more than two) structures can be the same or different. The "integral structure" in the present disclosure refers to a structure in which the two (or more than two) structures are connected to each other by patterning the same layer through the same patterning process, and their materials may be the same or different.

For example, referring to FIG. 3A and FIG. 4A, the pixel circuit further includes a first connection structure P1, the first connection structure P1 is electrically connected to the gate electrode T1*g* of the driving transistor T1 and the first electrode plate Cst1, and an orthographic projection of the first connection structure on the base substrate 200 does not overlap with an orthographic projection of the second electrode plate Cst2 on the base substrate 200. For example, the second electrode plate Cst2 is located in the second conductive layer 202, and the second conductive layer 202 is located on the side of the first conductive layer 201 away from the base substrate 200, a second insulating layer 302 is disposed between the second conductive layer 202 and the first conductive layer 201, in this way, the first connection structure P1 needs to be electrically connected to the first electrode plate Cst1 through a via, and the first connection structure P1 will not pass through the second electrode plate Cst2 of the storage capacitor Cst, so as to increase the area of the second electrode plate Cst2 to increase the capacitance of the storage capacitor.

Figure 3E:
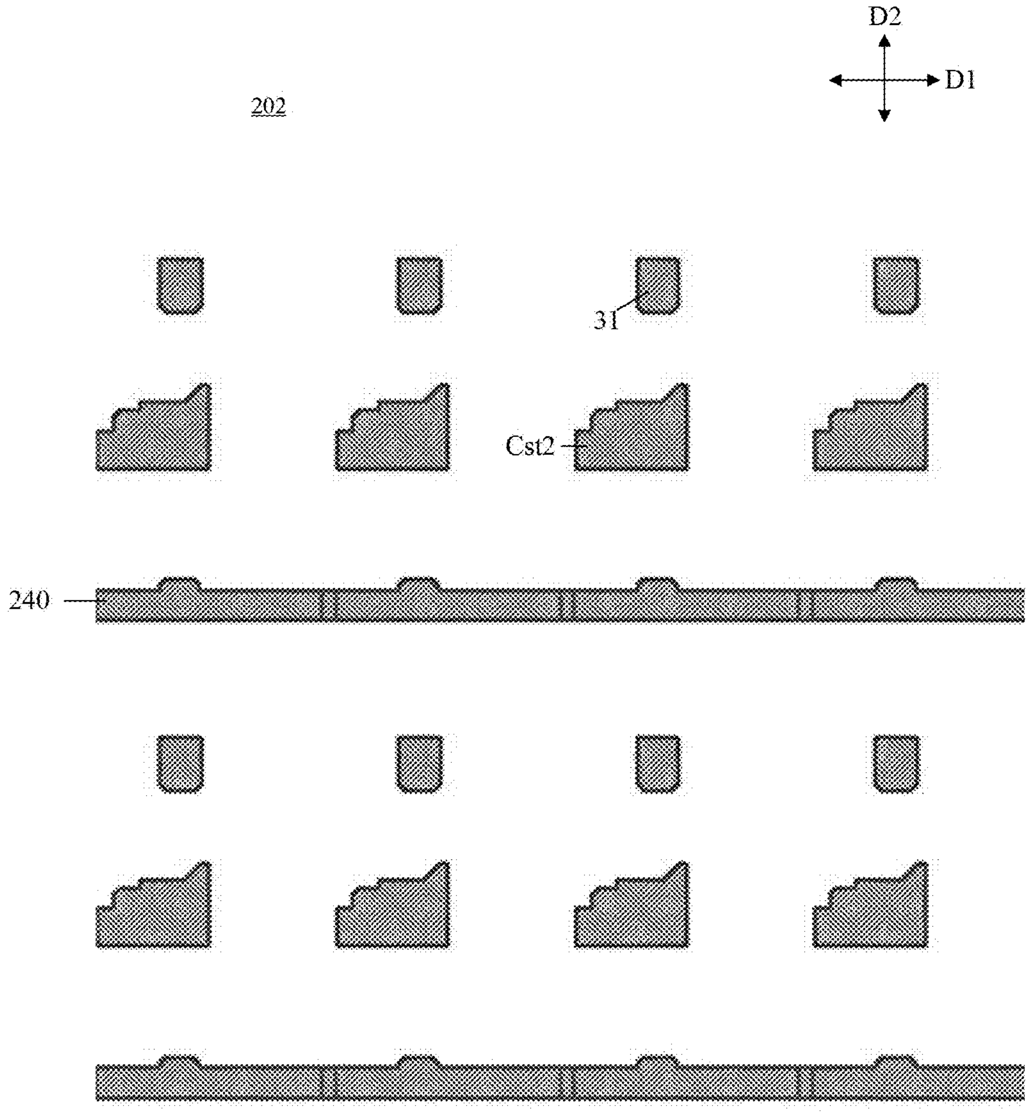
FIG. 3E is a schematic planar view of a second conductive layer in the display substrate shown in FIG. 3A.
Figure 3F:
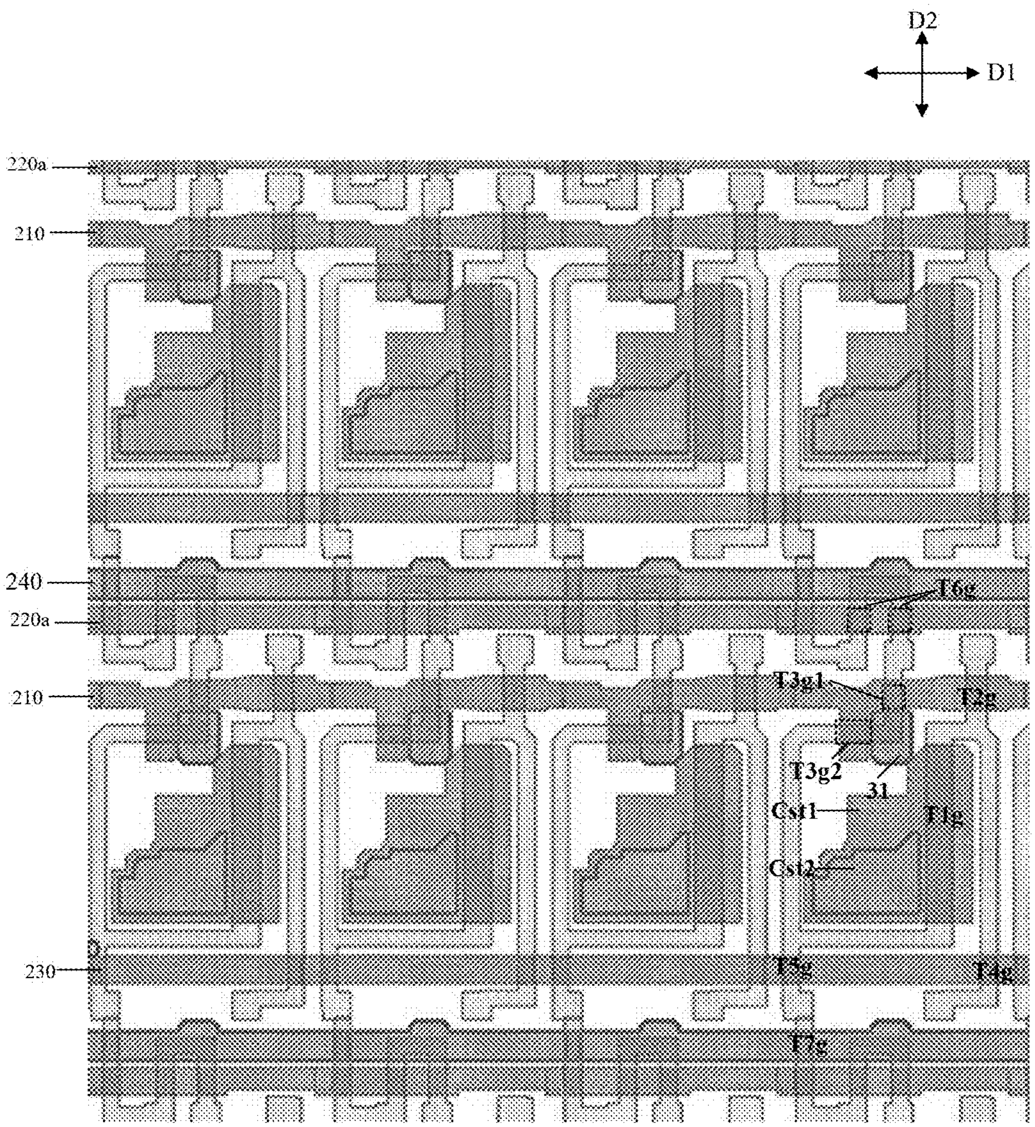
FIG. 3F is a schematic planar view of the stacking of a semiconductor layer, a first conductive layer and a second conductive layer in the display substrate shown in FIG. 3A.
Figure 3G:
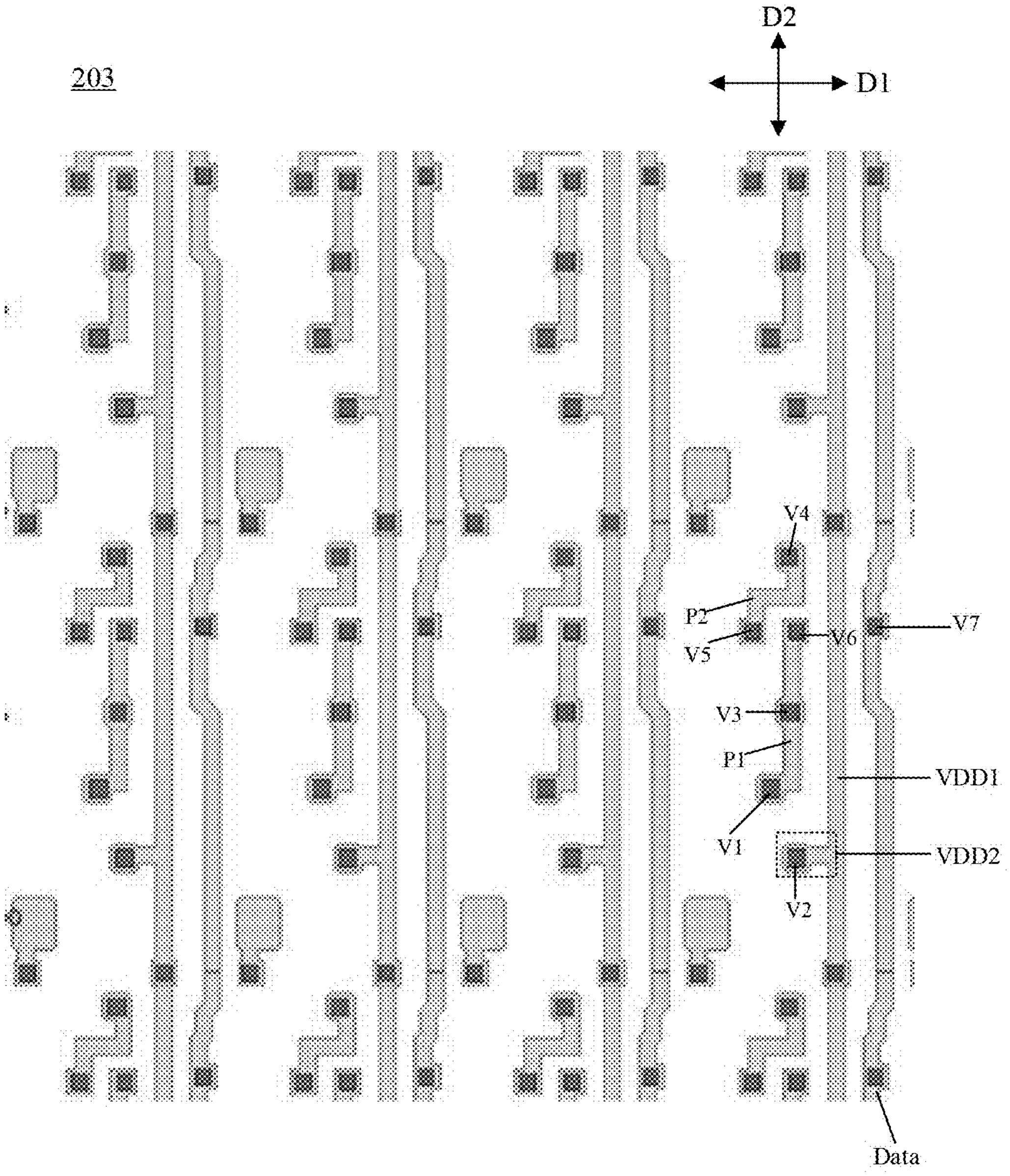
FIG. 3G is a schematic planar view of a third conductive layer in the display substrate shown in FIG. 3A.

For example, as shown in FIG. 3A, FIG. 3G and FIG. 4A, the first connection structure P1 and the first electrode T1*s* of the driving transistor T1 are arranged in the same layer, and the first connection structure P1 is electrically connected to the first electrode plate Cst1 (that is, the gate electrode T1*g* of the driving transistor T1) through the first via V1; an orthographic projection of the first via V1 on the base substrate 200 overlaps with an orthographic projection of the second portion Cst12 of the first electrode plate Cst1 on the base substrate 200, and does not overlap with an orthographic projection of the second electrode plate Cst2 on the base substrate 200. Therefore, the first via V1 does not pass through the second electrode plate Cst2 of the storage capacitor Cst, thereby increasing the area of the second electrode plate Cst2 to increase the capacitance of the storage capacitor.

For example, as shown in FIGS. 3A and 4A, the orthographic projection of the first connection structure P1 on the base substrate 200 does not overlap with the orthographic projection of the channel region C1 of the driving transistor T1 on the base substrate 200. The orthographic projection of the first connection structure P1 on the base substrate 200 at least partially overlaps with the orthographic projection of the second portion of the first electrode plate Cst1 on the base substrate 200, so as to avoid the electric signal on the first connection structure P1 from affecting the channel region C1 of the driving transistor T1.

For example, in the embodiment shown in FIG. 3A, the first connection structure P1 is in a straight strip shape extending along the second direction D2, which is beneficial to saving space and arranging other structures of the pixel circuit under the condition of rational utilization of limited space, which is very important for the pixel design of the display substrate, and can solve the important technical problem of how to effectively improve the PPI.

For example, as shown in FIG. 3A, FIG. 3G and FIG. 4B, the pixel circuit further includes a first power line VDD, the first power line VDD is connected to the first voltage terminal and is configured to provide a first power voltage to the pixel circuit, and the first power line VDD is arranged in the same layer as the first electrode T1*s* of the driving transistor T1, for example, both the first power line VDD and the first electrode T1*s* of the driving transistor T1 are located in the third conductive layer 203. The first power line VDD includes a first vertical portion VDD1 and a first lateral portion VDD2. The first vertical portion VDD1 extends along the second direction D2 and is connected to an adjacent sub-pixel; the first lateral portion VDD2 is connected to the first vertical portion VDD1 and extends from the first vertical portion VDD1 toward the second electrode plate Cst2 in the first direction D1; and the first lateral portion VDD2 is electrically connected to the second electrode plate Cst2 through the second via V2.

For example, the orthographic projection of the end of the first lateral portion VDD2 away from the first vertical portion VDD1 on the base substrate does not exceed the orthographic projection of the second electrode plate Cst2 on the base substrate in the first direction D1.

For example, in the embodiment shown in FIG. 3A, the first power line VDD and the data line Data are located in the same side of the storage capacitor Cst; in other embodiments, the first power line VDD and the data line Data may be located on different sides of the storage capacitor Cst, respectively.

For example, in the embodiment shown in FIG. 3A, the first power line VDD and the data line Data are located in the same layer, and both are located in the third conductive layer 203; in other embodiments, the first power line VDD and the data line Data may be respectively in different layers. For example, in at least one embodiment, the display substrate further includes a fourth conductive layer located on a side of the third conductive layer 203 away from the base substrate 200. For example, the first power line VDD is located in the third conductive layer 203, and the data line Data is located in the fourth conductive layer; or, the first power line VDD is located in the fourth conductive layer, and the data line Data is located in the third conductive layer 203.

For example, as shown in FIG. 3A, FIG. 3C and FIG. 4G, the first portion Cst11 of the first electrode plate Cst1 has a first terminal in the second direction D2, and the first terminal and the second portion Cst12 of the first electrode plate Cst1 surrounds or forms a blank notch H (in the dashed frame indicated by the symbol H in FIG. 4G); the first signal line, i.e. the scan line 210, providing the first scan signal to the data writing transistor, i.e. the second transistor T2, and the first electrode Cst1 are arranged in the same layer and are spaced apart from each other, and the scan line 210 includes a main portion 2101 and a protrusion portion 2102. The main portion 2101 passes through the sub-pixels along the first direction D1, that is, extends along the first direction D1 and is connected from one sub-pixel to an adjacent sub-pixel, and the main portion 2101 is located on the first side of the first electrode plate Cst1 in the second direction D2, the protrusion portion 2102 is connected to the main portion 2101 and protrudes from the main portion 2101 toward the first electrode plate Cst1, and the protrusion portion 2102 is at least partially located in the notch H. This design makes the arrangement compact, which rationally utilizes the limited space.

For example, a portion of the main portion 2101 of the scan line 210 constitutes the first gate electrode T3*g*1 of the third transistor T3, and the protrusion portion 2102 of the scan line 210 constitutes the second gate electrode T3*g*2.

For example, the pixel circuit further includes a compensation transistor, that is, the third transistor T3, the third transistor T3 is configured to compensate the gate electrode T1*g* of the driving transistor T1 in response to the second scan signal Ga2 applied to the gate electrode T3*g* of the compensation transistor T3 and the data signal Vd. As shown in FIG. 3A, the first signal line 210, that is, the scan line 210, providing the first scan signal Ga1 to the data writing transistor T2, is also configured to provide the second scan signal Ga2 to the compensation transistor T3. The compensation transistor T3 includes a first gate electrode T3*g*1 and a second gate electrode T3*g*2; at least part of the protrusion portion 2102 of the scan line 210 constitutes the first gate electrode T3*g*1 of the compensation transistor, and a part of the main portion 2101 of the scan line 210 constitutes the second gate electrode T3*g*2 of the compensation transistor T3 and the gate electrode T2*g* of the data writing transistor T2. The first gate electrode T3*g*1 extends along the first direction D1, and the second gate electrode T3*g*2 extends along the second direction D2.

For example, as shown in FIG. 3B, the compensation transistor T3 includes an active pattern T3*a*, and the active pattern T3*a* of the compensation transistor T3 and the active pattern T1*a* of the driving transistor T1 are disposed in the same layer. As shown in FIG. 4C, the sub-pixel further includes a shielding portion 31, and the shielding portion 31 is located on a side of the active pattern T3*a* of the compensation transistor T3 away from the base substrate 200. The orthographic projection of the shielding portion 31 on the base substrate 200 at least partially overlaps with the orthographic projection of the active pattern T3*a* of the compensation transistor T3 on the base substrate 200, and the shielding portion 31 is electrically connected to the first connection structure P1. Therefore, the shielding portion 31 shields the active pattern T3*a* of the compensation transistor T3, for example, shields the channel region of the compensation transistor T3 to prevent light from affecting the performance of the channel region of the compensation transistor T3, and connects the shielding portion 31 to the first connection structure P1, that is, the electrical signal of the N1 node in FIG. 2B, which can better stabilize the potential of the N1 node. It should be noted that the active pattern T3*a* shielded by the shielding portion 31 is a conductive portion around the channel region of the compensation transistor T3, and does not include the channel region of the compensation transistor T3.

For example, as shown in FIG. 4B and FIG. 4C, the shielding portion 31 and the second electrode plate Cst2 are disposed in the same layer, for example, both are located in the second metal layer 202, so that the two can be formed by one patterning process performed on one same layer using one same mask, which simplifies the structure and manufacturing process of the display substrate. For example, the orthographic projection of the first connection structure P1 on the base substrate 200 at least partially overlap with the orthographic projection of the shielding portion 31 on the base substrate 200, and the first connection structure P1 is electrically connected to the shielding portion 31 through the third via V3, so as to realize the electrical connection between the first connection structure P1 and the shielding portion 31.

For example, the pixel circuit 101 further includes a reset transistor, for example, the pixel circuit 101 includes a first reset transistor, namely the sixth transistor T6, and a second reset transistor, namely the seventh transistor T7; as shown in FIG. 3A and FIG. 3E, the pixel circuit further includes a reset voltage line 240, the reset voltage line 240 is arranged in the same layer as the second electrode plate Cst2, for example, both are located in the second conductive layer 202; in addition, as shown in FIG. 4D, the reset voltage line 240 is electrically connected to the first electrode T6*s* of the first reset transistor T6, so as to provide the first reset voltage Vinit1 to the first reset transistor T6.

For example, as shown in FIG. 3A and FIG. 3E, the second conductive layer 202 includes a plurality of reset voltage lines 240 that extend along the first direction D1, and the plurality of reset voltage lines 240 are connected to the plurality of rows of sub-pixels in one-to-one correspondence. The reset voltage line 240 is electrically connected to the first electrode of the sixth transistor T6 in the corresponding row of sub-pixels to provide the first reset voltage Vinit1 for the sixth transistor T6 in the corresponding row of sub-pixels, and the first electrode T7*s* of the seventh transistor T7 in the current row of sub-pixels is electrically connected to the reset voltage line 240 corresponding to the next row of sub-pixels to receive the second reset voltage Vinit2.

For example, as shown in FIG. 3A, FIG. 3G and FIG. 4D, the pixel circuit 101 further includes a second connection structure P2, and the reset voltage line 240 is electrically connected to the first electrode T6*s* of the first reset transistor T6 through the second connection structure P2. For example, the second connection structure P2 is in the same layer as the first connection structure P1, the first terminal of the second connection structure P2 is electrically connected to the reset voltage line 240 through the fourth via V4, and the second terminal, opposite to the first terminal, of the second connection structure P2 is electrically connected to the first electrode T6*s* of the first reset transistor T6 through the fifth via V5.

For example, as shown in FIG. 3A and FIG. 4E, the orthographic projection of the first power line VDD on the base substrate 200 overlaps with the orthographic projection of the channel region C1 of the driving transistor T1 on the base substrate 200, so that the first power line VDD shields the channel region C1 of the driving transistor T1, so as to use the existing structure to prevent the influence of light on the performance of the channel region C1 of the driving transistor T1 under the condition of saving layout space.

For example, as shown in FIG. 4C, the light emitting device 121 of the sub-pixel includes a first electrode 40, a second electrode (not shown in the figure), and a light emitting layer (not shown in the figure) located between the first electrode 40 and the second electrode); the sub-pixel further includes a pixel definition layer 306 located on the side of the first electrode 40 of the light emitting device away from the base substrate 200, an opening is formed in the pixel definition layer 306 to expose at least part of the first electrode 40 to define an opening region (that is, the light emitting region) 600 of each sub-pixel of the display substrate. The light emitting layer of the light emitting device is formed at least in the opening region 600 (the light emitting layer may also cover part of the surface of the pixel definition layer away from the first electrode), and the second electrode is formed on the light emitting layer to form the light emitting device. For example, the second electrode is a common electrode, which is formed as an entire surface on the display substrate 10. For example, the first electrode 40 is the anode of the light emitting device, and the second electrode is the cathode of the light emitting device.

For example, the light emitting device 121 is a top emission structure, the first electrode 40 is reflective and the second electrode is transmissive or semi-transmissive. For example, the first electrode 40 includes a high work function material to act as an anode, such as an ITO/Ag/ITO stacked structure; the second electrode includes a low work function material to act as a cathode, such as a semi-transmissive metal or metal alloy material, such as Ag/Mg alloy materials.

Figure 3H:
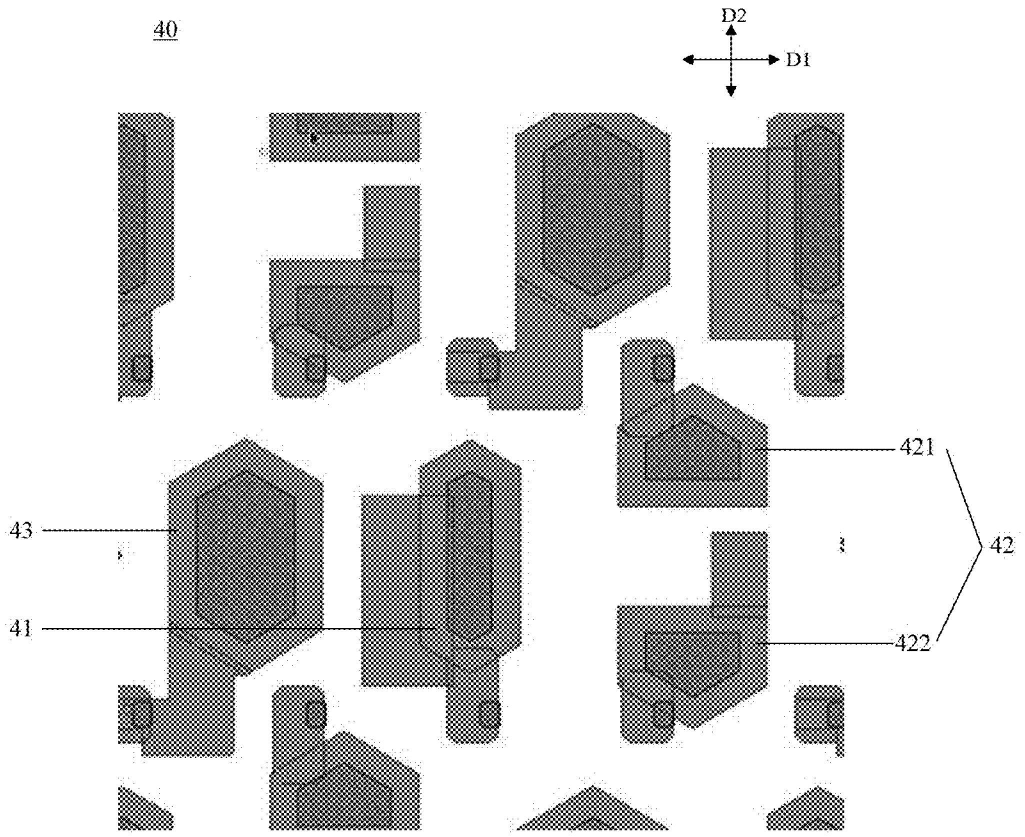
FIG. 3H is a schematic planar view of a first electrode provided by at least one embodiment of the present disclosure.
Figure 3I:
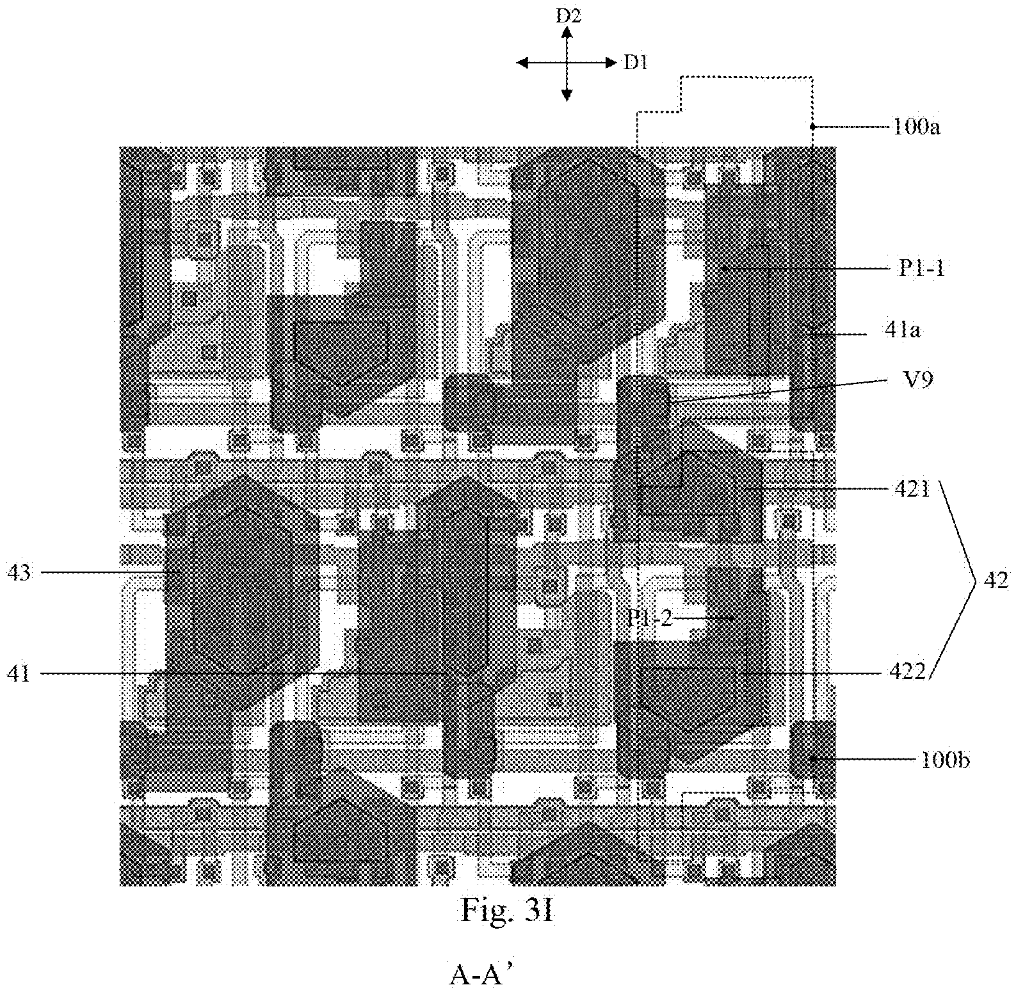
FIG. 3I is a schematic planar view of the stacking of a semiconductor layer, a first conductive layer, a second conductive layer, a third conductive layer of the display substrate shown in FIG. 3A and the first electrode shown in FIG. 3H.

In one sub-pixel, the first electrode 40 is electrically connected to one selected from a group consisting of the first electrode T1*s* of the driving transistor T1 and the second electrode T1*d* of the driving transistor T1. For example, as shown in FIGS. 3H-3I, the plurality of sub-pixels of the display substrate 10 include a first sub-pixel, two adjacent second sub-pixels, and a third sub-pixel, the first sub-pixel, the second sub-pixel and the third sub-pixel emit light of different colors respectively, and the first electrodes of the first sub-pixel, the second sub-pixel and the third sub-pixel are respectively the first electrode 41, the first electrode 42 and the first electrode 43 in the figure. The two adjacent second sub-pixels are respectively an upper second subpixel 100*a* and a lower second sub-pixel 100*b*, the upper second sub-pixel 100*a* includes the first electrode 421, and the lower second sub-pixel 100*b* includes the first electrode 422. For example, the display substrate includes a plurality of first sub-pixels, a plurality of second sub-pixels and a plurality of third sub-pixels, thereby including a plurality of first electrodes 41, a plurality of first electrodes 42 and a plurality of first electrodes 43; the plurality of first electrodes 42 includes the first electrode 421 and the first electrode 422; the plurality of first electrodes 41 include the first electrode 41*a* in FIG. 3I, the first electrode 41*a* is the first electrode of the first sub-pixel adjacent to the upper second sub-pixel 100*a*. For example, the orthographic projection of the first connection structure P1-1 of the upper second sub-pixel 100*a* on the base substrate 200 at least partially overlaps with the orthographic projection of the first electrode 41*a* of the first sub-pixel adjacent to the upper second sub-pixel 100*a* on the base substrate 200, and the orthographic projection of the first connection structure P1-2 of the lower second sub-pixel 100*b* on the base substrate 200 at least partially overlap with both the orthographic projection of the first electrode 422 of the lower second sub-pixel 100*b* on the base substrate 200 and the orthographic projection of the first electrode 421 of the upper second sub-pixel 100*a* on the base substrate 200, that is, the first connection structures P1 (corresponding to the N1 node in the circuit diagram) of the two adjacent second sub-pixels are respectively shielded by the first electrode 41 of the adjacent first sub-pixel, and both the first electrode 41 of the upper second sub-pixel 100*a* and the first electrode 422 of the lower second sub-pixel 100*b*, so that the first connection structures P1 of the two adjacent second sub-pixels are basically shielded by the first electrodes, and the luminous brightness of the two adjacent second sub-pixels tends to be consistent.

It should be noted that, in the present disclosure, the first electrode of one sub-pixel means that the first electrode is connected to the pixel circuit of the sub-pixel through the ninth via V9, and the first electrode is not required that the orthographic projection of the first electrode on the base substrate is located in the orthographic projection of the pixel circuit (for example, each thin film transistor, each signal line, etc.) on the base substrate.

As shown in FIG. 3I, in each sub-pixel having the first electrode, taking the upper second sub-pixel 100*a* as an example, the first electrode 421 is electrically connected to the second terminal T1*d* of the driving transistor T1 through the ninth via V9.

For example, the first sub-pixel emits red light, the second sub-pixel emits green light, and the third sub-pixel emits blue light.

For example, the upper second sub-pixel 100*a* and the lower second sub-pixel 100*b* are arranged along the second direction D2, and the upper second sub-pixel 100*a* and the first sub-pixel adjacent to the upper second sub-pixel 100*a* are arranged along the first direction D1. Of course, in other embodiments, the upper second sub-pixel 100*a* and the lower second sub-pixel 100*b* may also be arranged along the first direction D1, and the upper second sub-pixel 100*a* and the first second sub-pixel 100*a* adjacent to the upper second sub-pixel 100*a* are arranged along the second direction D2. The embodiments of the present disclosure are not limit in this aspect.

For example, as shown in FIG. 3A, the first terminal of the first connection structure P1 is electrically connected to the semiconductor layer through the sixth via V6, and the second terminal of the first connection structure P1 opposite to the first terminal thereof is electrically connected to the first electrode plate Cst1 (that is, the gate electrode T1*g* of the driving transistor T1) through the first via V1; and the data line Data is electrically connected to the semiconductor layer through the seventh via V7.

For example, referring to FIGS. 4A-4E, the display substrate 10 further includes a buffer layer 200*a* on the base substrate 200, the first semiconductor layer 107 is on the buffer layer 200*a*, and the buffer layer 200*a* can prevent contamination and destruction of the base substrate 200 during the manufacturing process, so as to make other structures formed on the base substrate 200 purer and flatter.

In the embodiments of the present disclosure, the first terminal of the transistor is the source electrode, and the second terminal is the drain electrode; or, the first terminal is the drain electrode, and the second terminal is the source electrode.

In the display substrate 10 provided by the embodiments of the present disclosure, for example, the base substrate 200 may be a rigid substrate, such as a glass substrate, a silicon substrate, etc., or may be formed of a flexible material with excellent heat resistance and durability, such as polyimide (PI), polycarbonate (PC), polyethylene terephthalate (PET), polyethylene, polyacrylate, polyaryl compound, polyetherimide, polyethersulfone, polyethylene glycol terephthalate (PET), polyethylene (PE), polypropylene (PP), polysulfone (PSF), polymethyl methacrylate (PMMA), triacetate cellulose (TAC), cyclic olefin polymer (COP) and cyclic olefin copolymer (COC), etc.

For example, the material of the semiconductor layer 107 includes but is not limited to silicon based materials (amorphous silicon a-Si, polycrystalline silicon p-Si, etc.), metal oxide semiconductors (IGZO, ZnO, AZO, IZTO, etc.) and organic materials (hexathiophene, polythiophene, etc.).

For example, the material of the first to fourth conductive layers may include gold (AU), silver (Ag), copper (Cu), aluminum (AL), molybdenum (MO), magnesium (Mg), tungsten (W) and alloy materials composed of the above metals; or transparent conductive metal oxide materials, such as indium tin oxide (ITO), indium zinc oxide (IZO), zinc oxide (ZnO), zinc aluminum oxide (azo), etc.

For example, the first insulating layer 301, the second insulating layer 302, the third insulating layer 303, and the fourth insulating layer 304 are inorganic insulating layers, and their materials include, for example, at least one of oxide of silicon, nitride of silicon, or oxynitride of silicon, such as silicon oxide, silicon nitride, silicon oxynitride, etc., or include metal oxide or nitride insulating material, such as aluminum oxide, titanium nitride, etc. For example, the pixel definition layer 306 and the fourth insulating layer 304 may be organic insulating materials, such as polyimide (PI), acrylate, epoxy resin, polymethyl methacrylate (PMMA) and the like. For example, the fourth insulating layer 304 is a planarization layer. The embodiments of the present disclosure are not limit in this aspect.

Figure 5A:
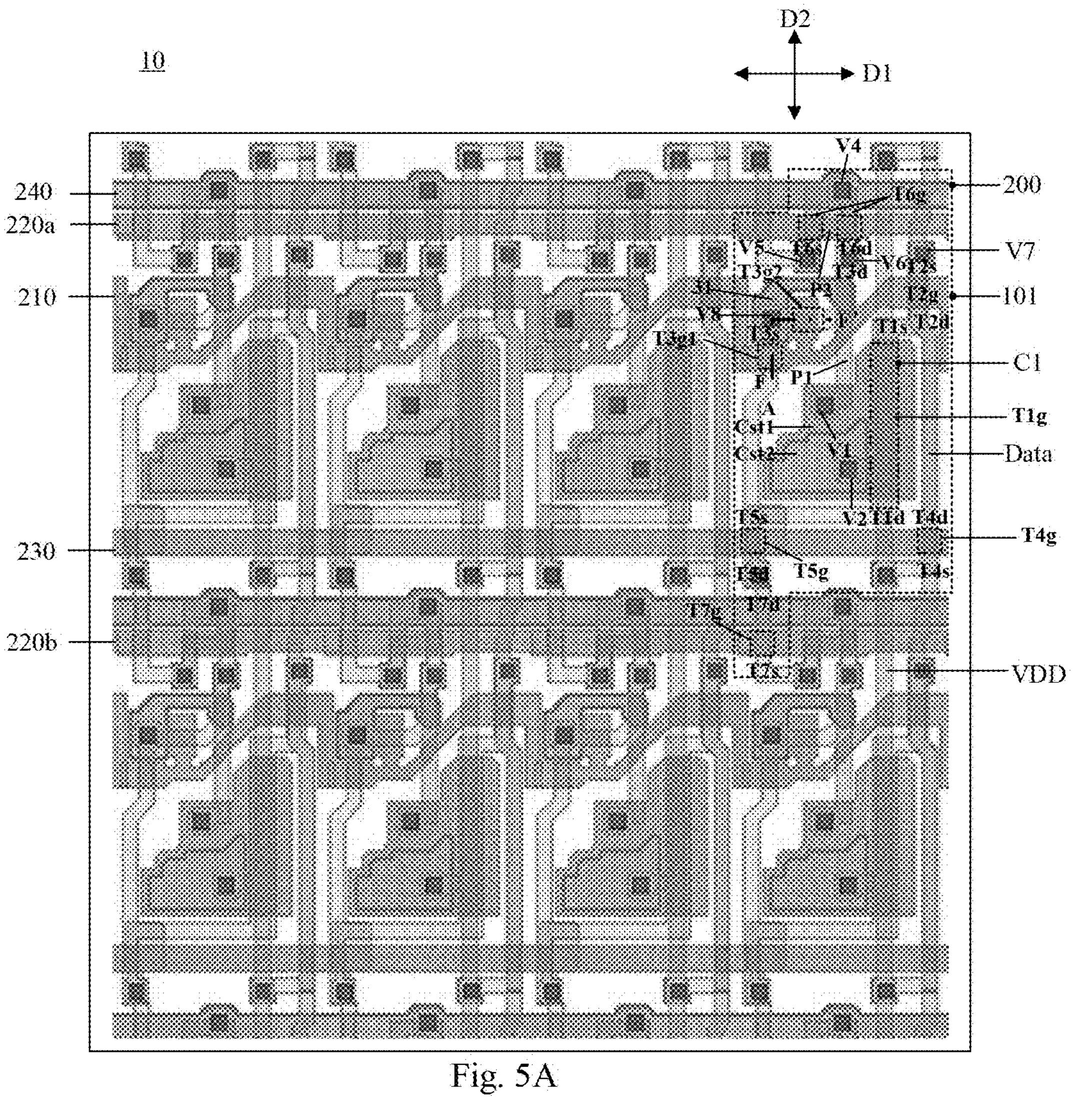
FIG. 5A is a schematic structure diagram of a sub-pixel of another display substrate provided by an embodiment of the present disclosure.
Figure 5B:
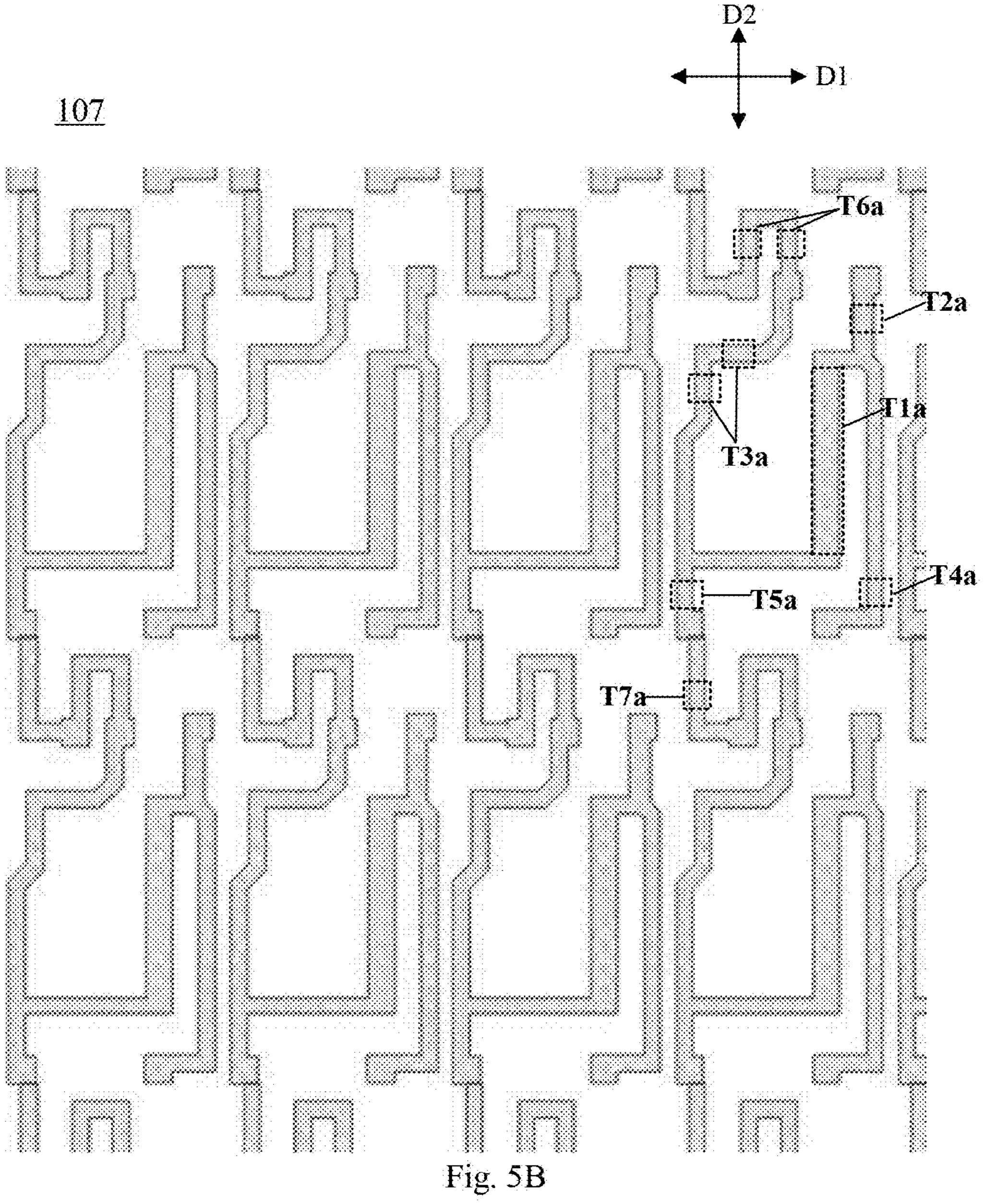
FIG. 5B is a schematic planar view of a semiconductor layer in the display substrate shown in FIG. 5A.
Figure 5C:
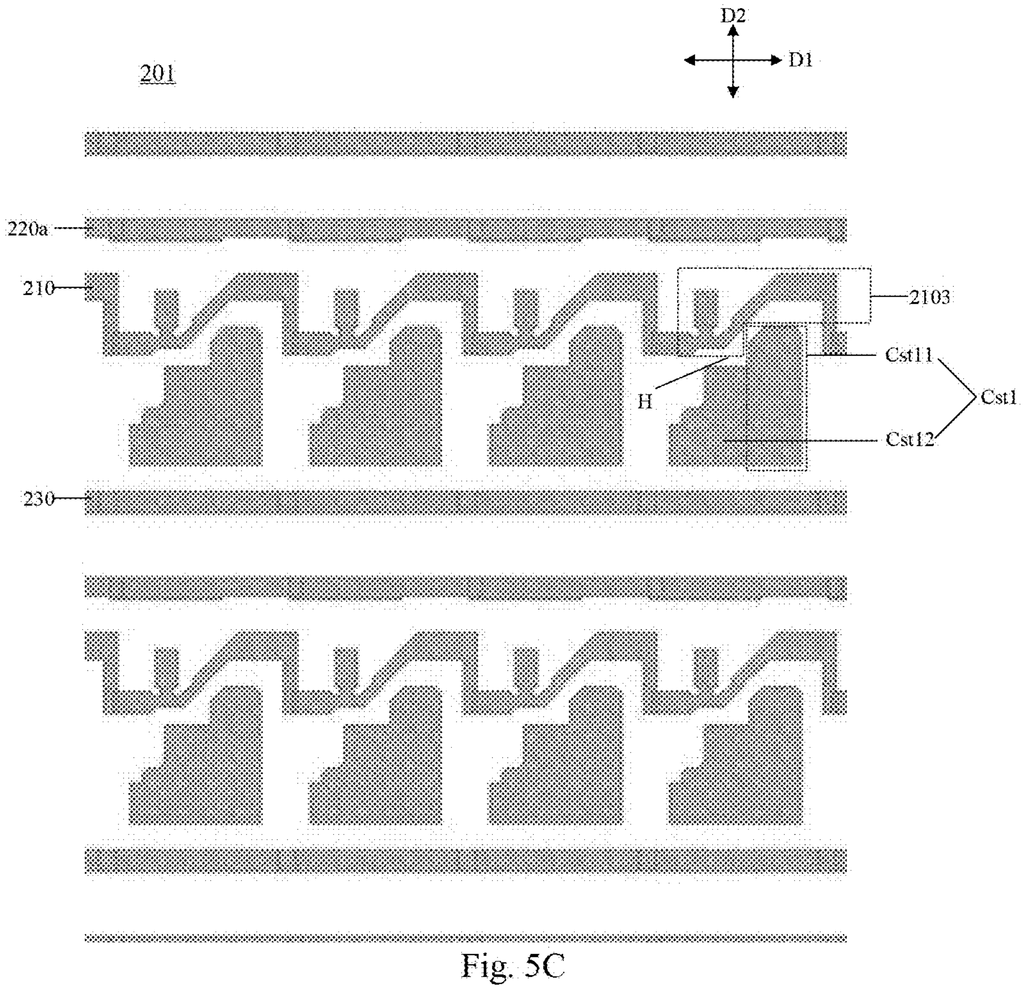
FIG. 5C is a schematic planar view of a first conductive layer in the display substrate shown in FIG. 5A.
Figure 5D:
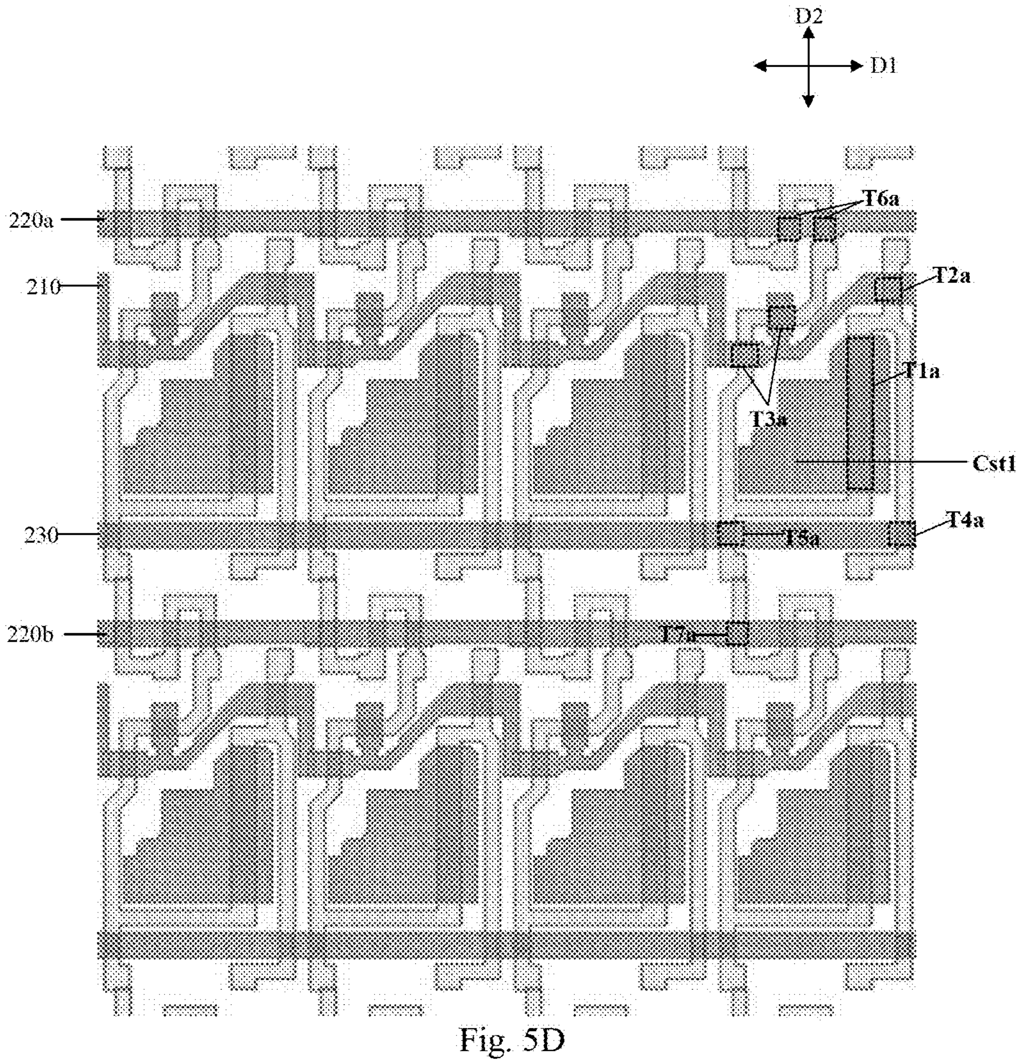
FIG. 5D is a schematic planar view of the stacking of a semiconductor layer and a first conductive layer in the display substrate shown in FIG. 5A.

FIG. 5A is a schematic structure diagram of a sub-pixel of another display substrate provided by an embodiment of the present disclosure; FIGS. 5B-5J are schematic planar views of a semiconductor layer, a first conductive layer, a second conductive layer, each via, a third conductive layer of the display substrate shown in FIG. 5A and a first electrode; FIG. 6A is a cross-sectional view along a line F-F' in FIG. 5A; and FIG. 6B is a partially enlarged schematic diagram of a sub-pixel in FIG. 5A. The pixel circuit of the display substrate provided by the embodiment shown in FIGS. 5B-5J and FIGS. 6A-6B is still as shown in FIG. 2B, and the display substrate provided by the embodiment shown in FIGS. 5B-5J and FIGS. 6A-6B has the following differences from the display substrate provided by the embodiment shown in FIG. 3A.

The wiring design of the first signal line 210 in the embodiment shown in FIG. 5A is different from that in FIG. 3A. As shown in FIG. 5A and FIG. 5C, the first portion Cst11 of the first electrode plate Cst1 has a first terminal in the first direction D1, and the first signal line 210 (that is, the scan line 210) providing the first scan signal Ga1 to the data writing transistor T2 includes a bending portion 2103, and the bending portion 2103 is arranged around the first terminal of the first portion Cst11 of the first electrode plate Cst1; the first terminal of the first portion Cst11 of the first electrode plate Cst1 in the second direction D2 and the second portion Cst12 of the first electrode plate Cst1 form a blank notch H; the part of the bending portion 2103 on the first side of the first electrode plate Cst1 in the second direction D2 is at least partially located in the blank notch H, so as to achieve reasonable wiring and utilize the limited space, which is beneficial to improve the PPI and aperture ratio of the display panel using the display substrate.

Figure 5E:
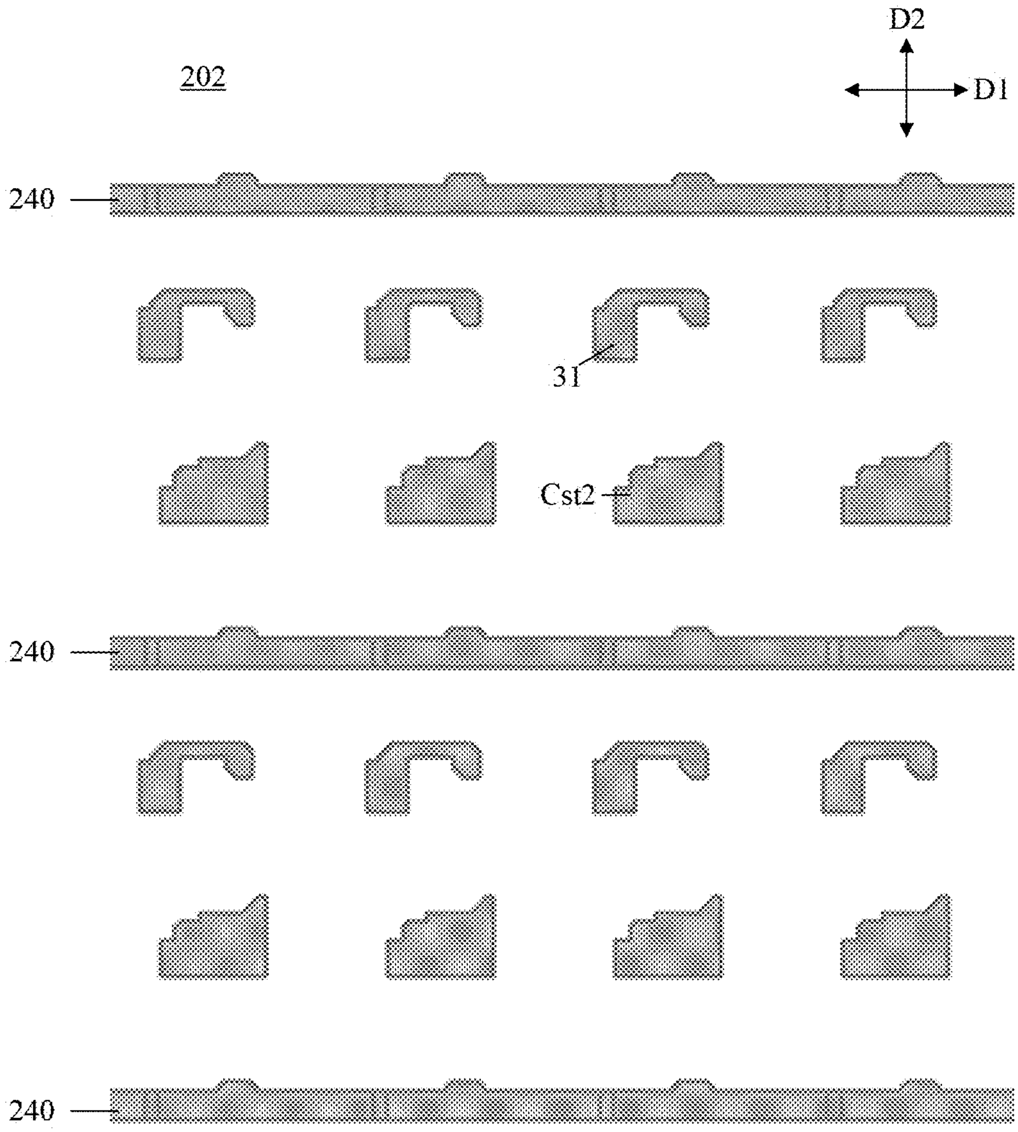
FIG. 5E is a schematic planar view of a second conductive layer in the display substrate shown in FIG. 5A.
Figure 5F:
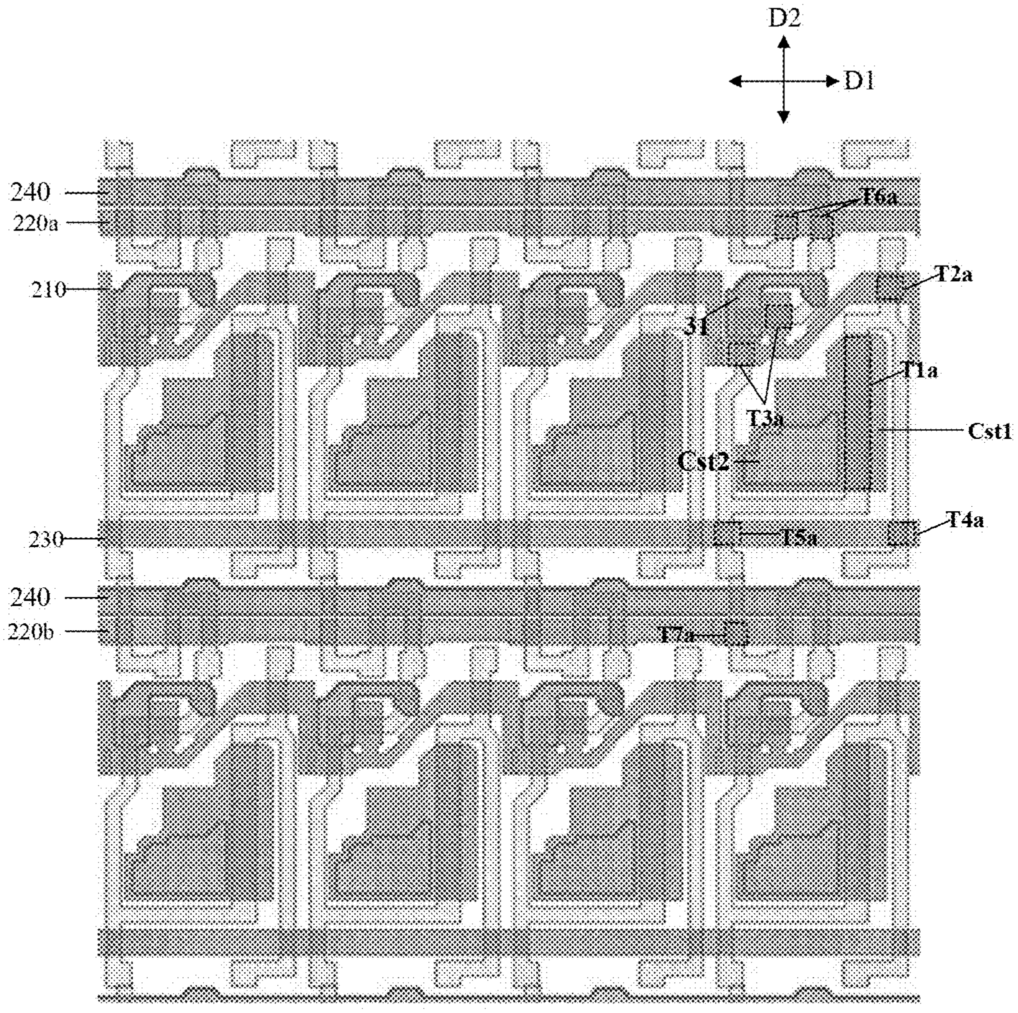
FIG. 5F is a schematic planar view of the stacking of a semiconductor layer, a first conductive layer and a second conductive layer in the display substrate shown in FIG. 5A.
Figure 5G:
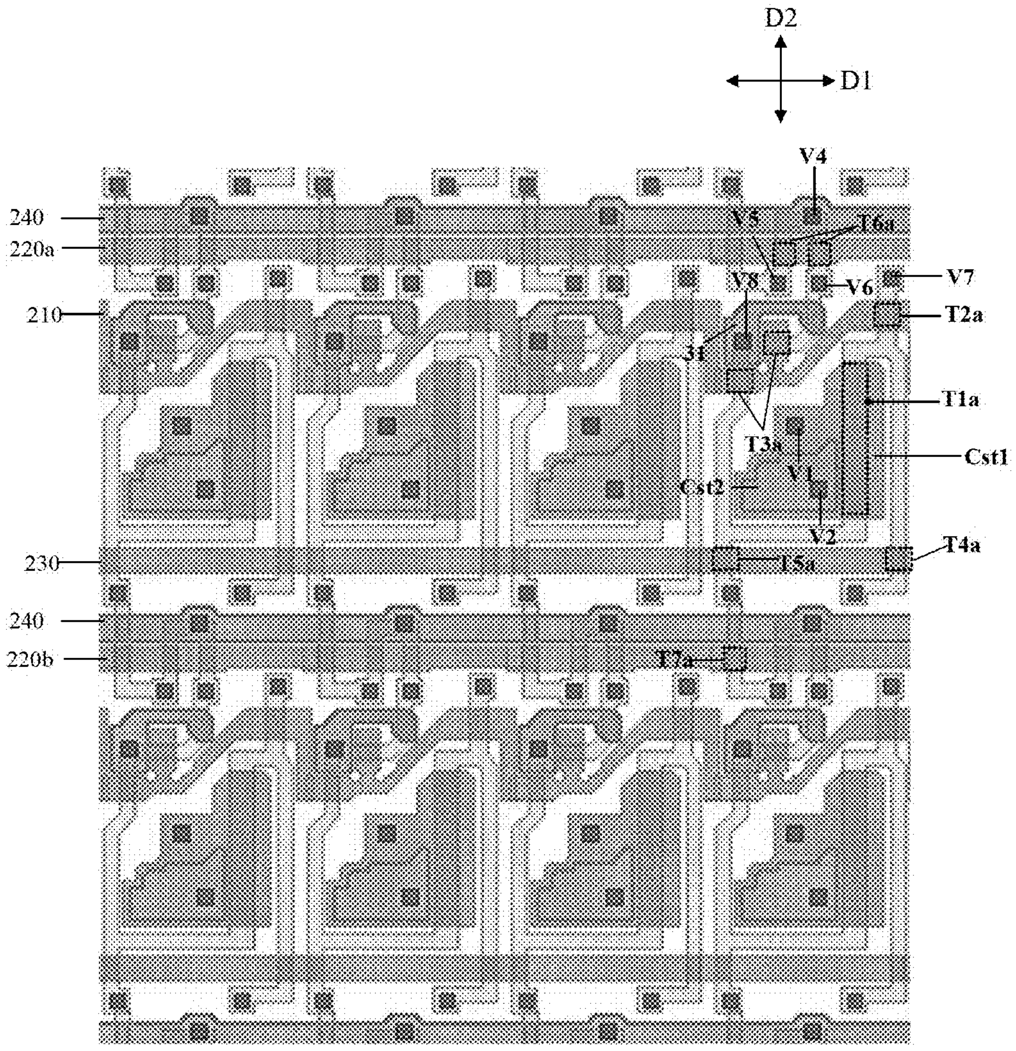
FIG. 5G is a schematic planar view of the structure shown in FIG. 5F and each via.
Figure 5H:
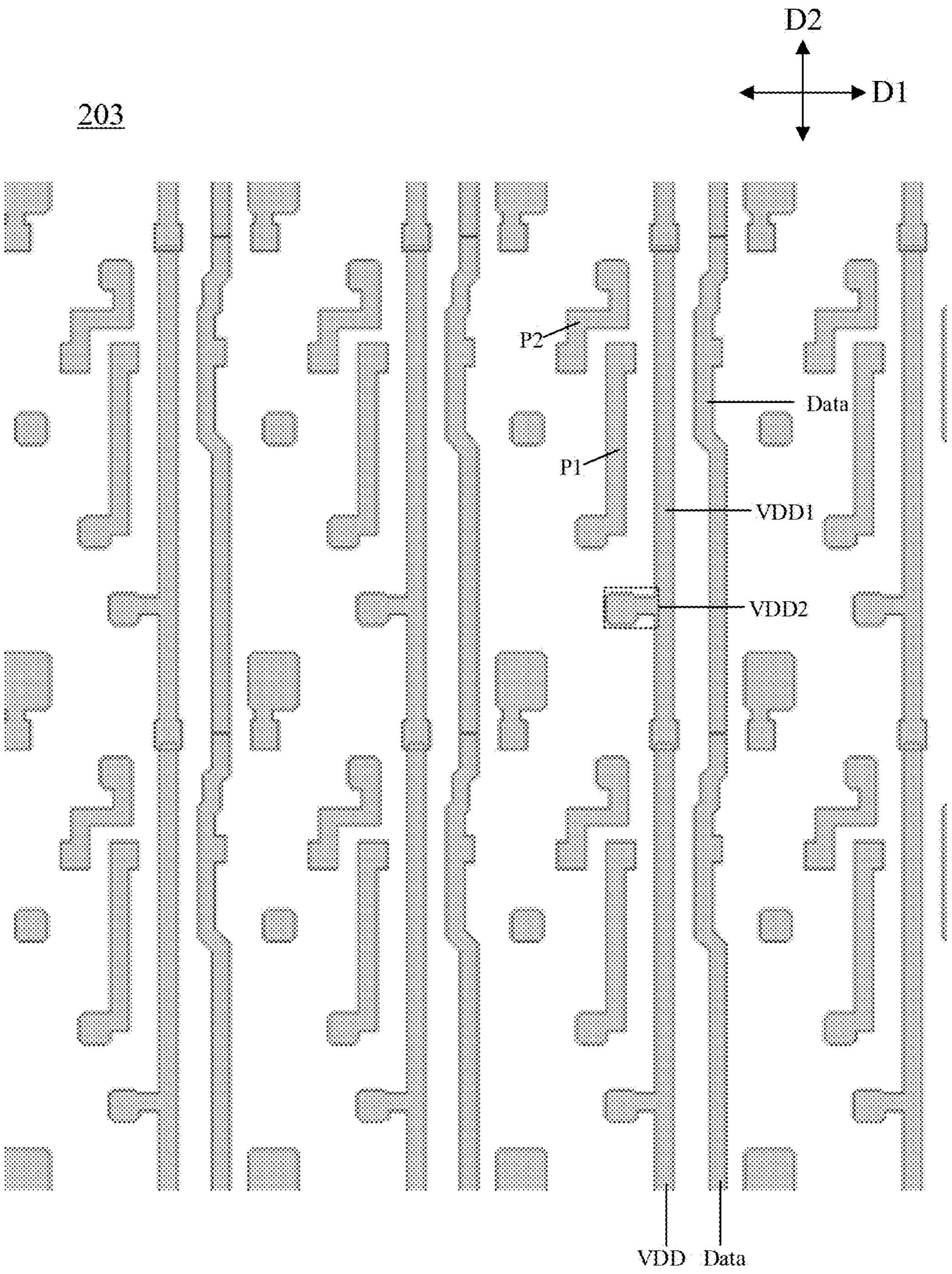
FIG. 5H is a schematic planar view of a third conductive layer in the display substrate shown in FIG. 5A.
Figure 5I:
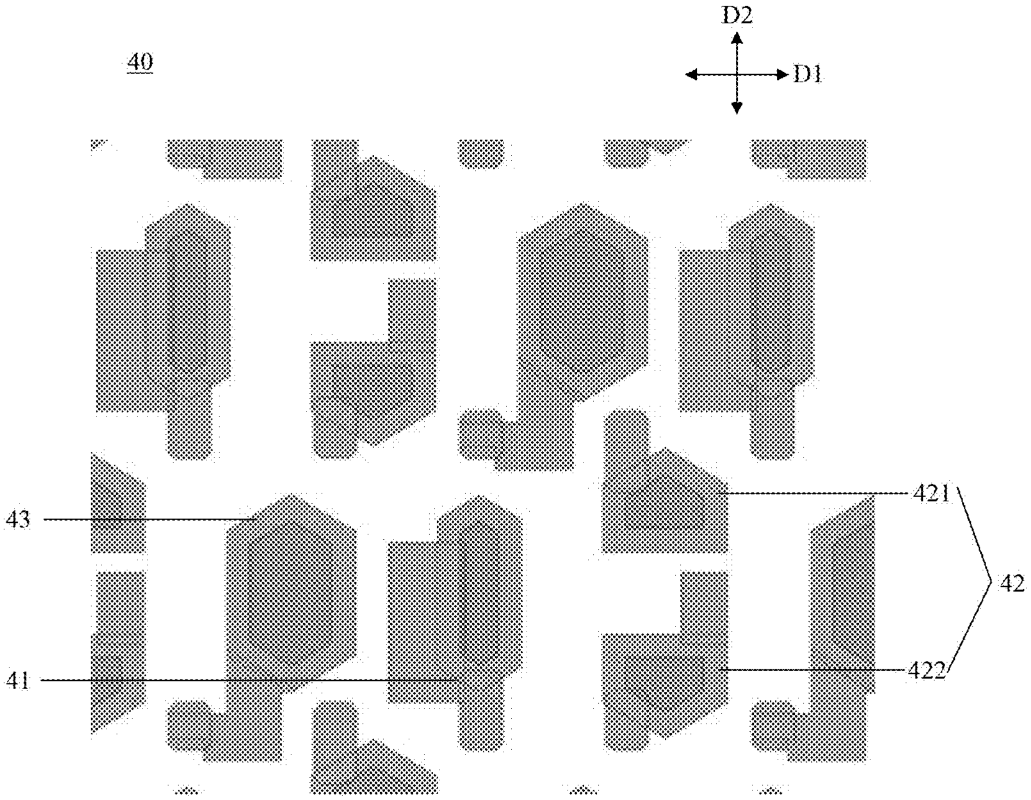
FIG. 5I is a schematic planar view of a first electrode provided by at least one embodiment of the present disclosure.
Figure 5J:
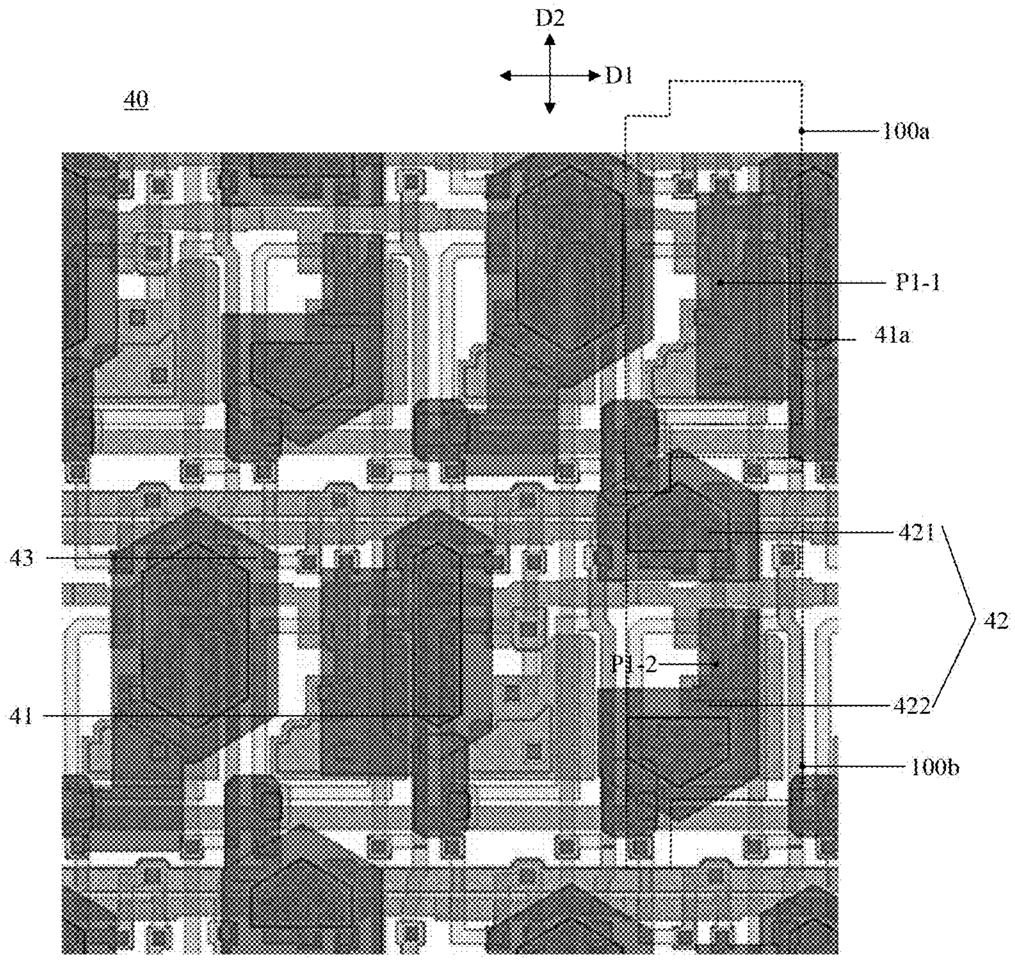
FIG. 5J is a schematic planar view of the stacking of a semiconductor layer, a first conductive layer, a second conductive layer, a third conductive layer of the display substrate shown in FIG. 5A and the first electrode shown in FIG. 5I.
Figure 6A:
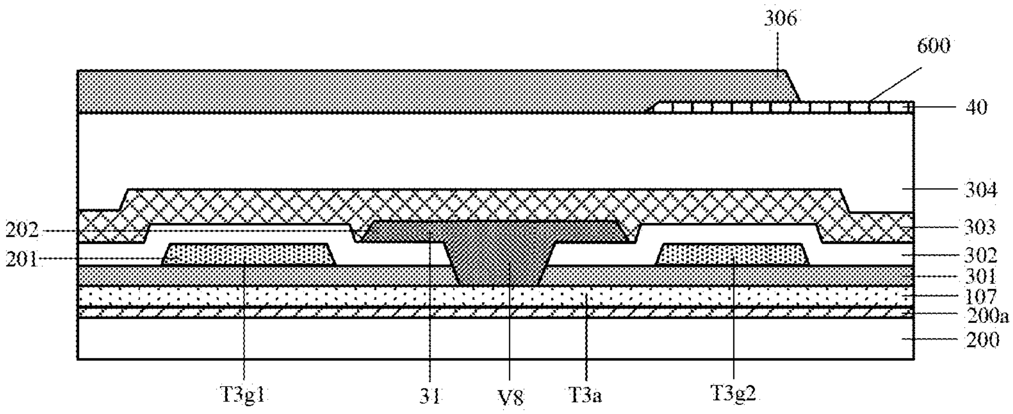
FIG. 6A is a cross-sectional view along a line F-F' in FIG. 5A.
Figure 6B:
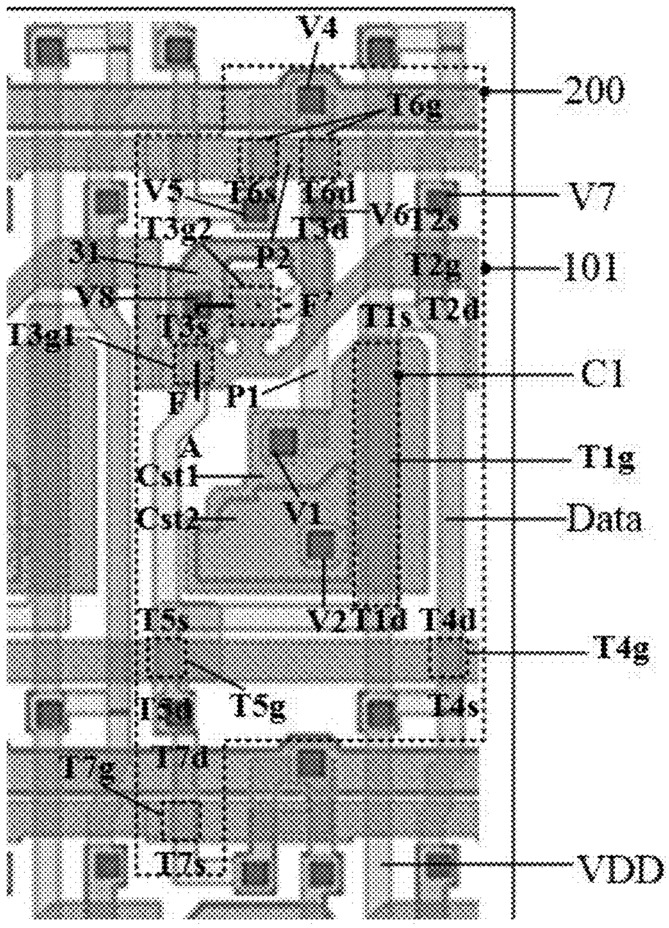
FIG. 6B is a partially enlarged schematic diagram of a sub-pixel in FIG. 5A.

As shown in FIG. 5A, FIG. 5E and FIG. 6A, the sub-pixel includes a shielding portion 31, the shielding portion 31 is located on a side of the active pattern T3*a* of the compensation transistor T3 away from the base substrate 200, and the orthographic projection of the shielding portion 31 on the base substrate 200 at least partially overlaps with the orthographic projection of the active pattern T3*a* of the compensation transistor T3 on the base substrate 200; the shielding portion 31 is electrically connected to the active pattern T3*a* of the compensation transistor T3 through the eighth via V8. Therefore, the shielding portion 31 shields the active pattern T3*a* of the compensation transistor T3, and connects the shielding portion 31 with the first connection structure P1, namely the electrical signal of the N1 node in FIG. 2B, so as to better stabilize the potential of the N1 node.

For example, as shown in FIG. 5A, FIG. 5E and FIG. 6A, the shielding portion 31 and the second electrode plate Cst2 are disposed in the same layer, for example, both are located in the second metal layer 202, so that the shielding portion 31 and the second electrode plate Cst2 can be formed by performing a patterning process on the same layer using the same mask, which simplifies the structure and manufacturing process of the display substrate.

Figure 7A:
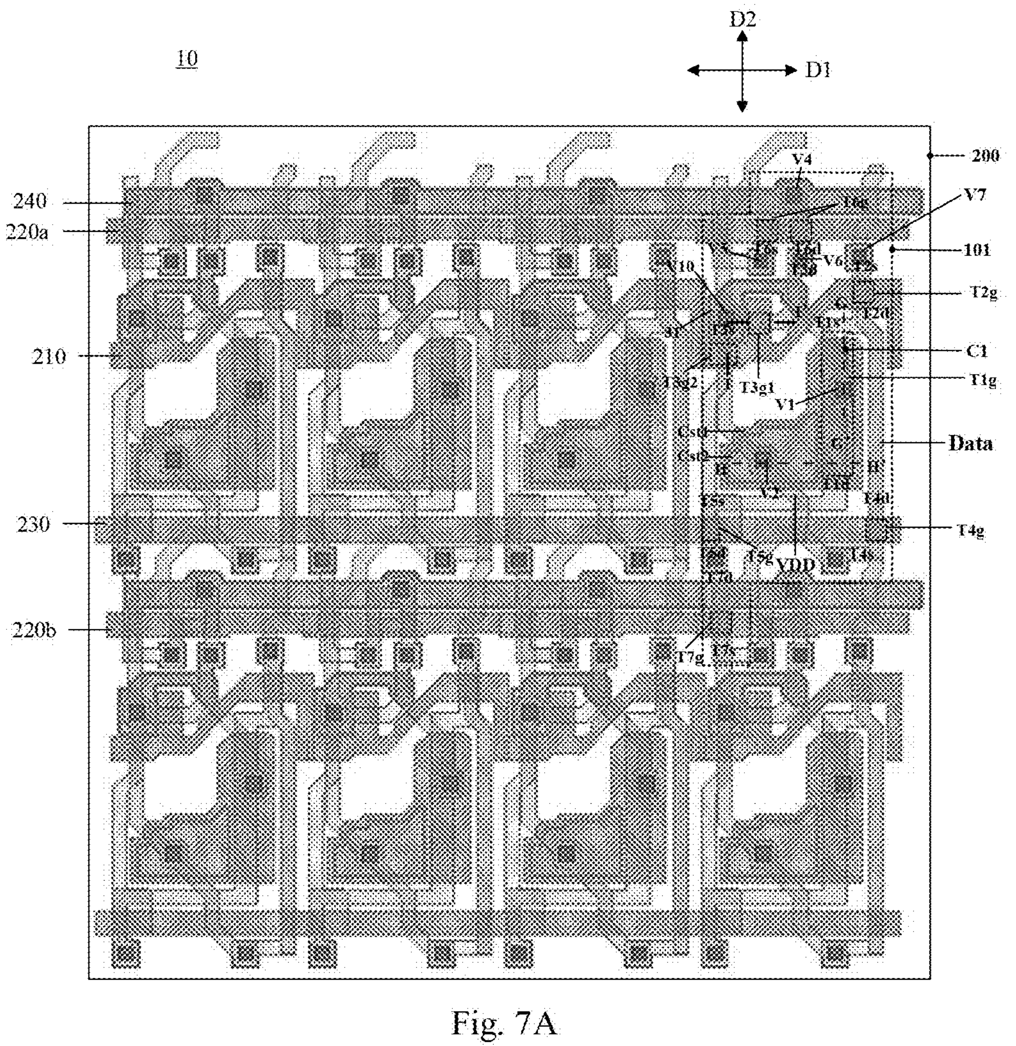
FIG. 7A is a schematic structure diagram of a sub-pixel of further another display substrate provided by an embodiment of the present disclosure.
Figure 7B:
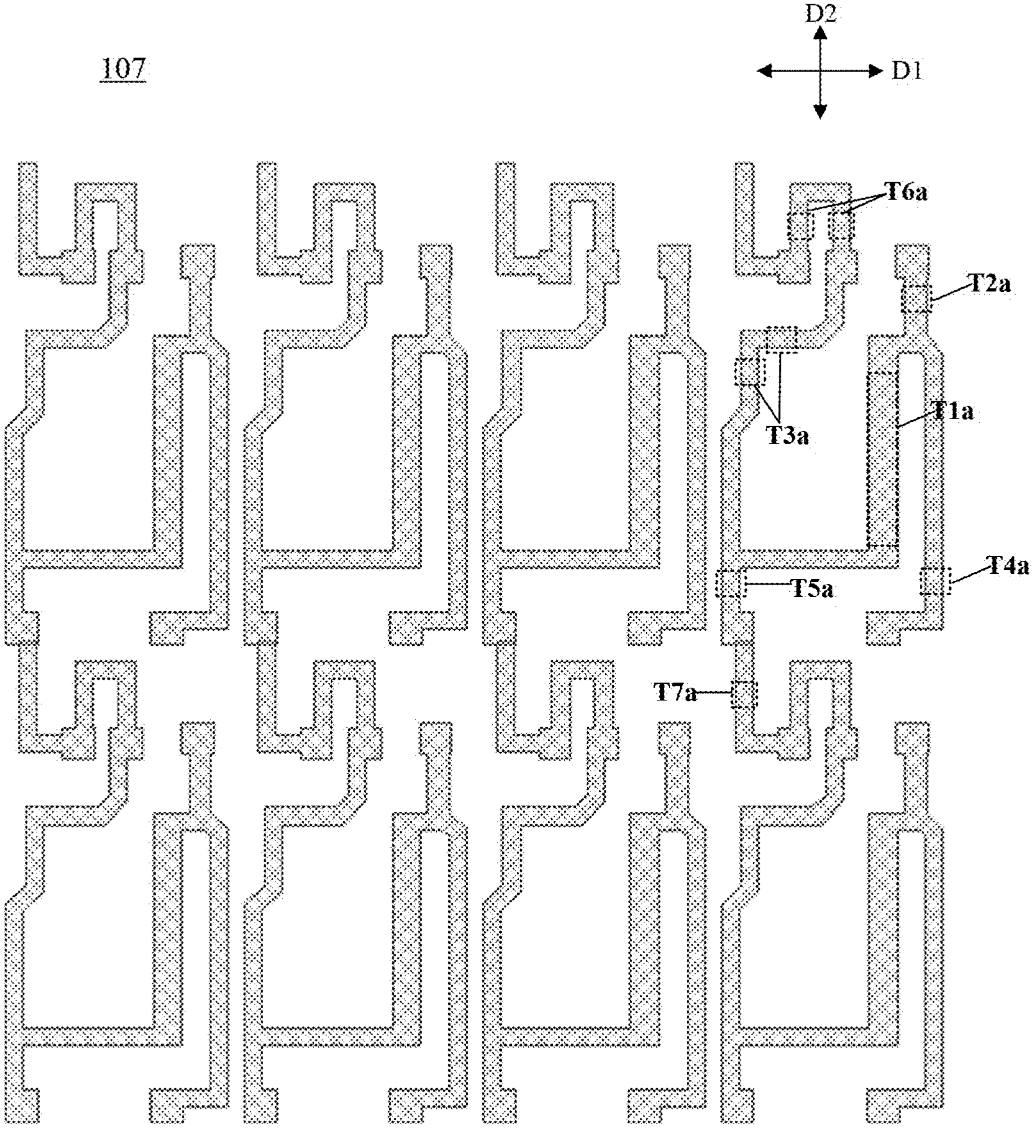
FIG. 7B is a schematic planar view of a semiconductor layer in the display substrate shown in FIG. 7A.
Figure 7C:
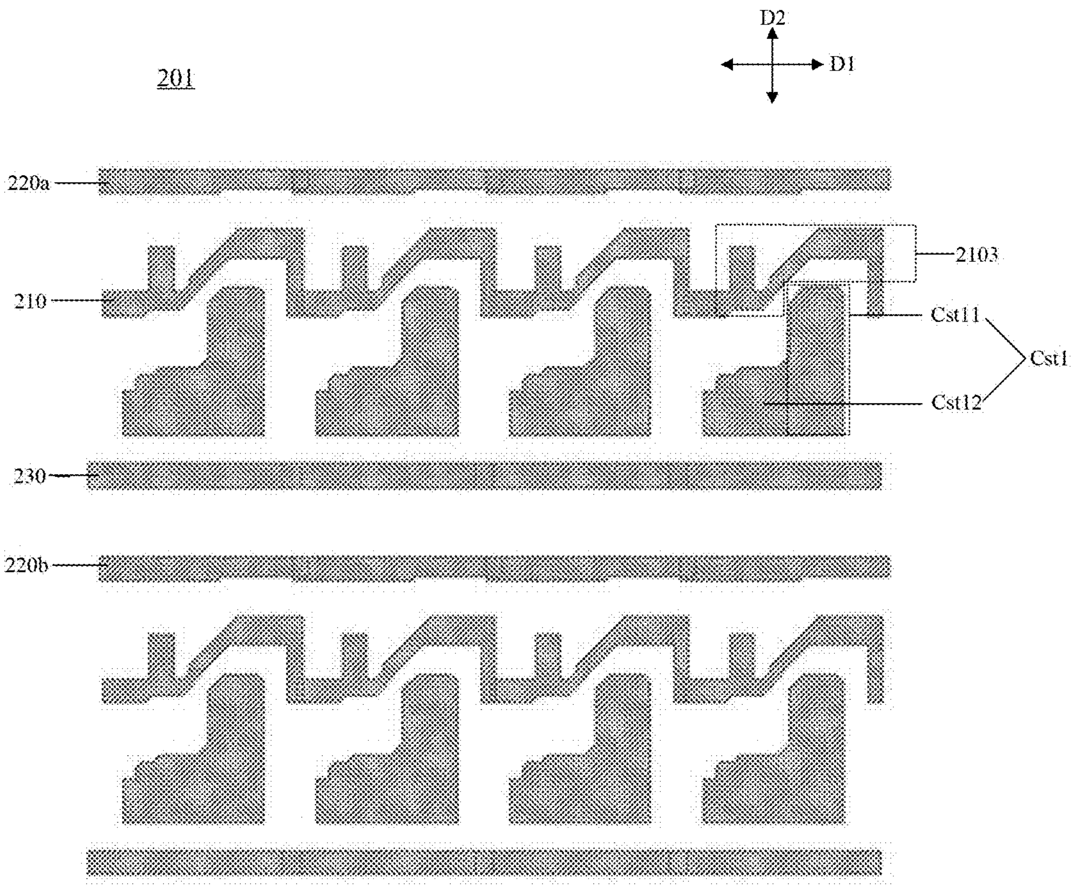
FIG. 7C is a schematic planar view of a first conductive layer in the display substrate shown in FIG. 7A.
Figure 7D:
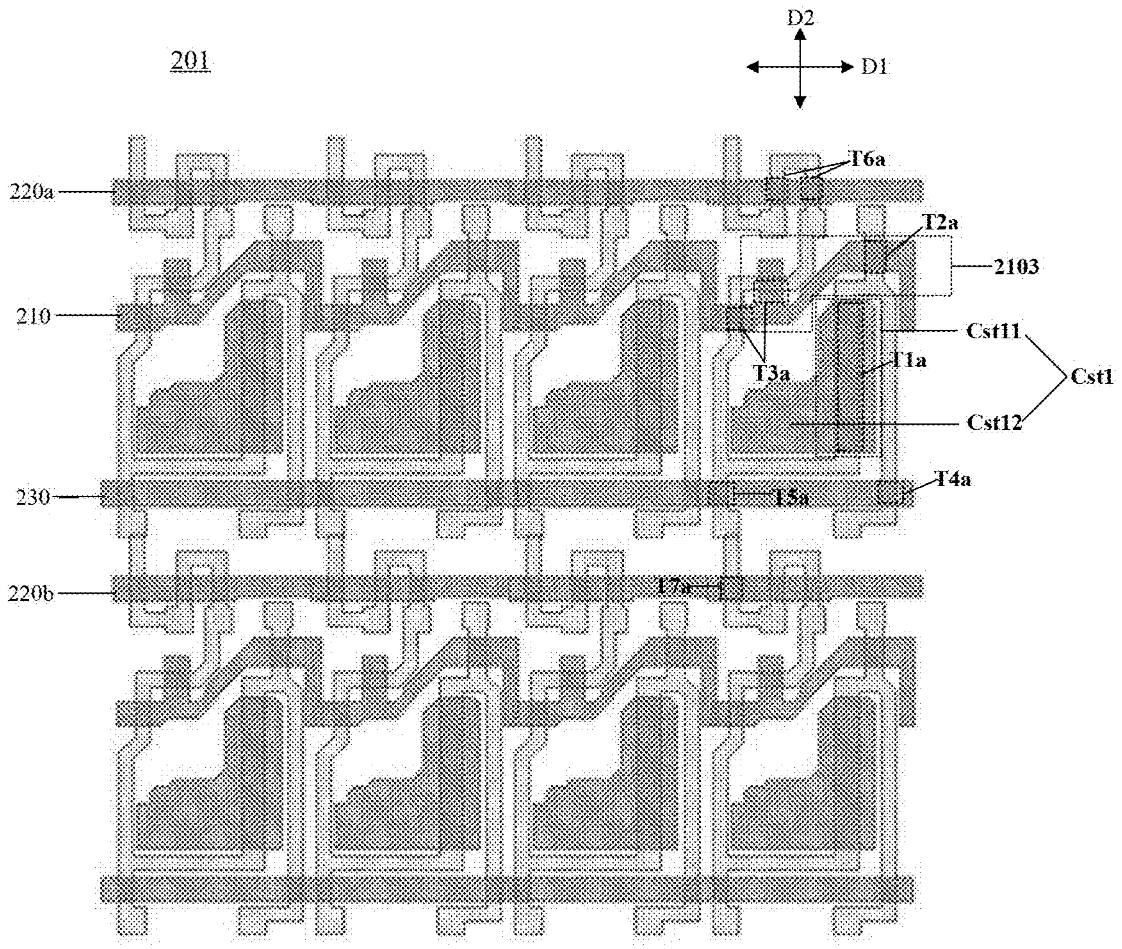
FIG. 7D is a schematic planar view of the stacking of a semiconductor layer and a first conductive layer in the display substrate shown in FIG. 7A.
Figure 7E:
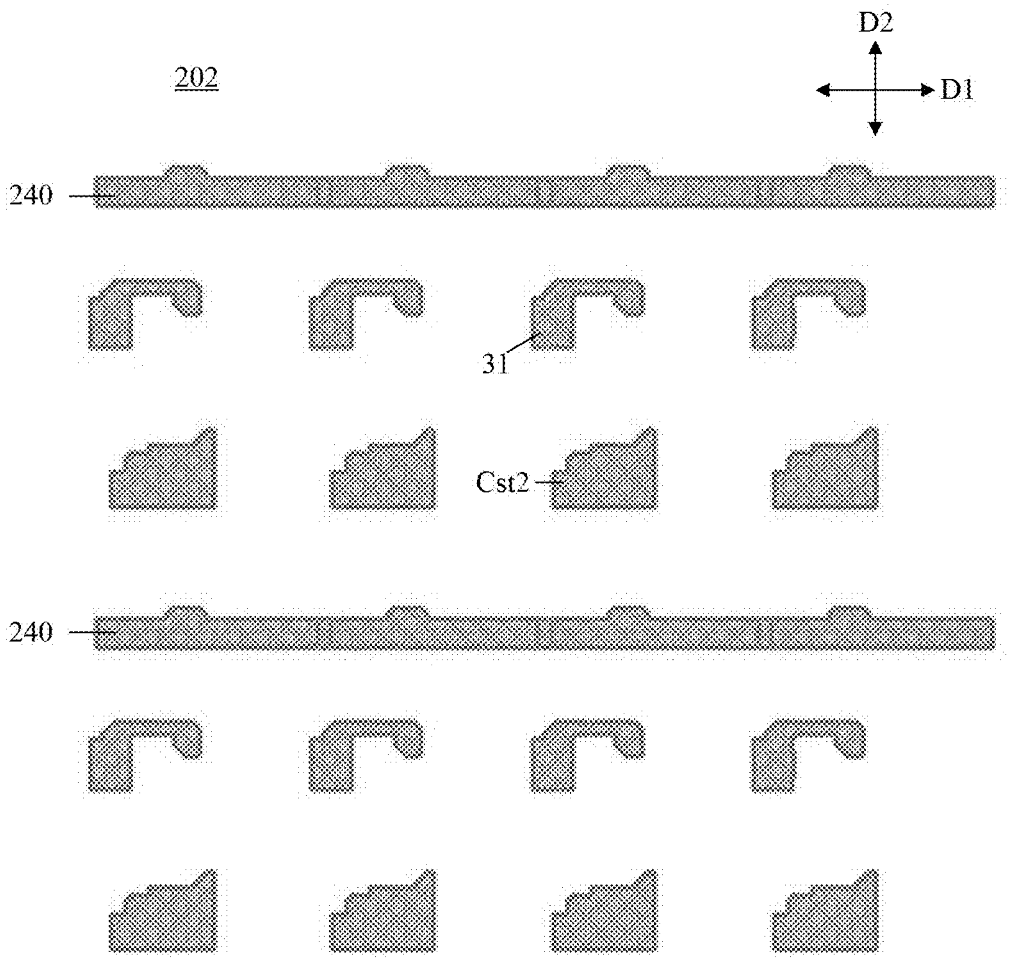
FIG. 7E is a schematic planar view of a second conductive layer in the display substrate shown in FIG. 7A.
Figure 7F:
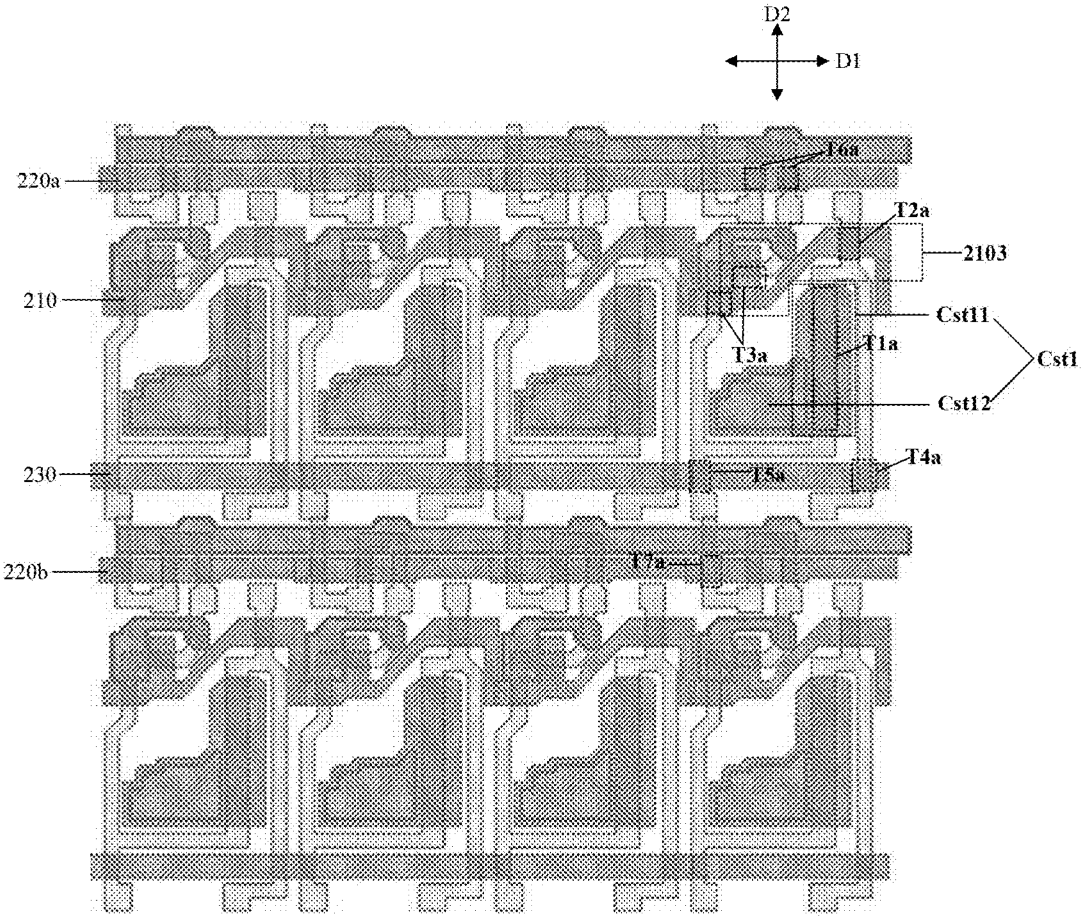
FIG. 7F is a schematic planar view of the stacking of a semiconductor layer, a first conductive layer and a second conductive layer in the display substrate shown in FIG. 7A.
Figure 7G:
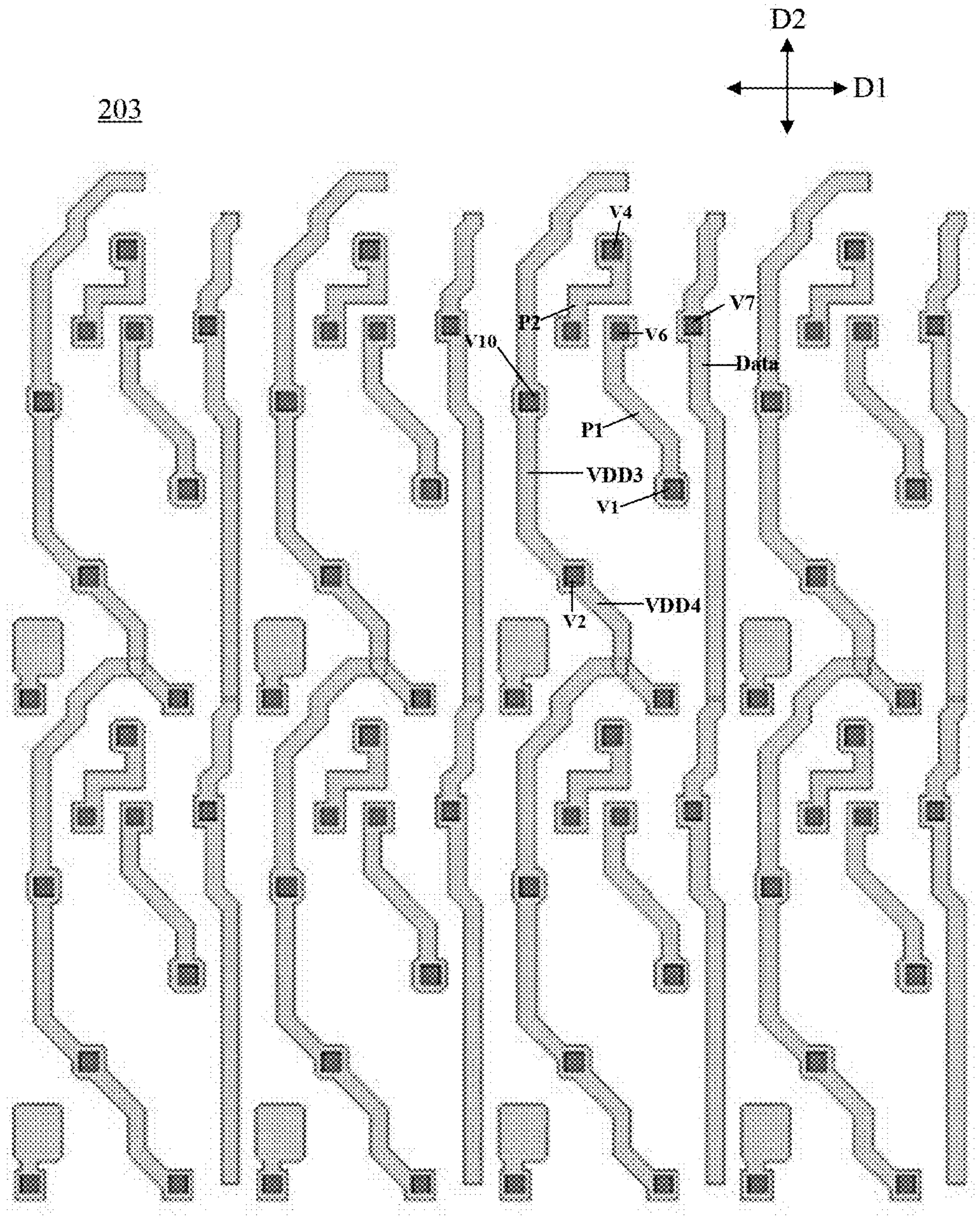
FIG. 7G is a schematic planar view of a third conductive layer in the display substrate shown in FIG. 7A.
Figure 7H:
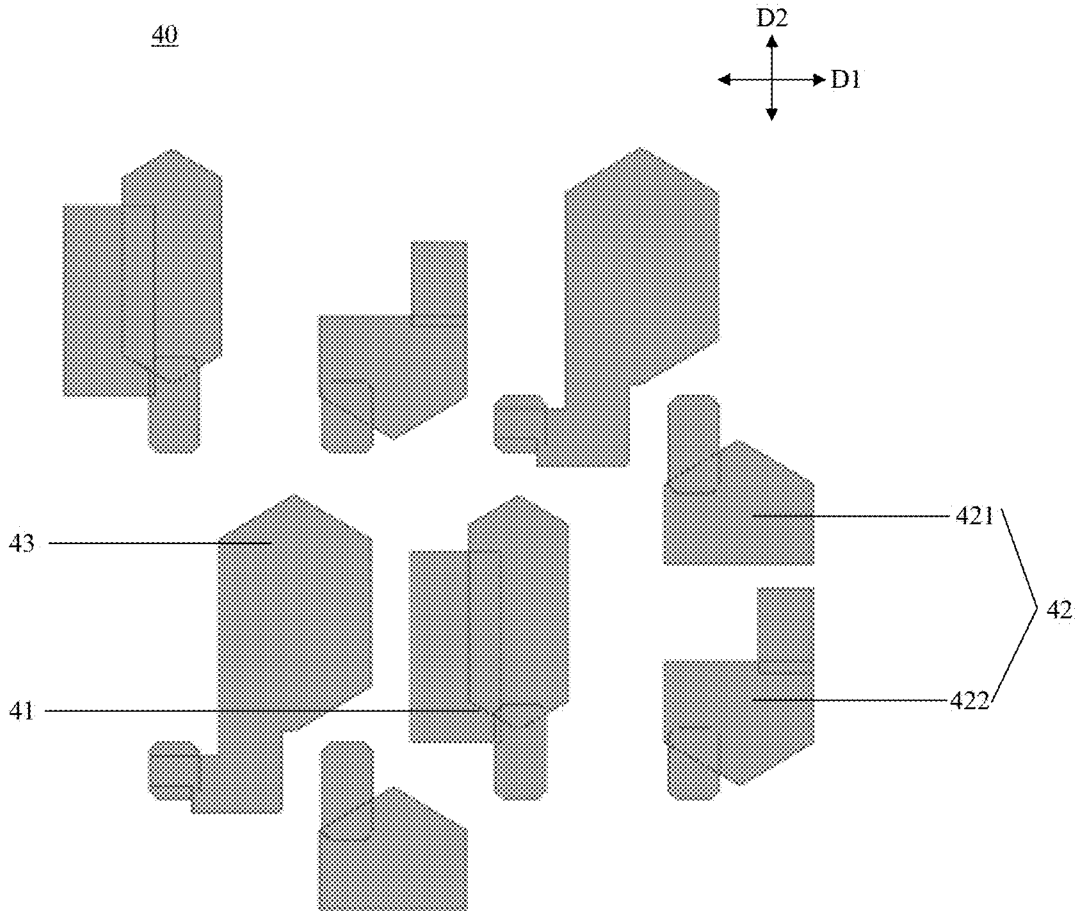
FIG. 7H is a schematic planar view of a first electrode provided by at least one embodiment of the present disclosure.
Figure 7I:
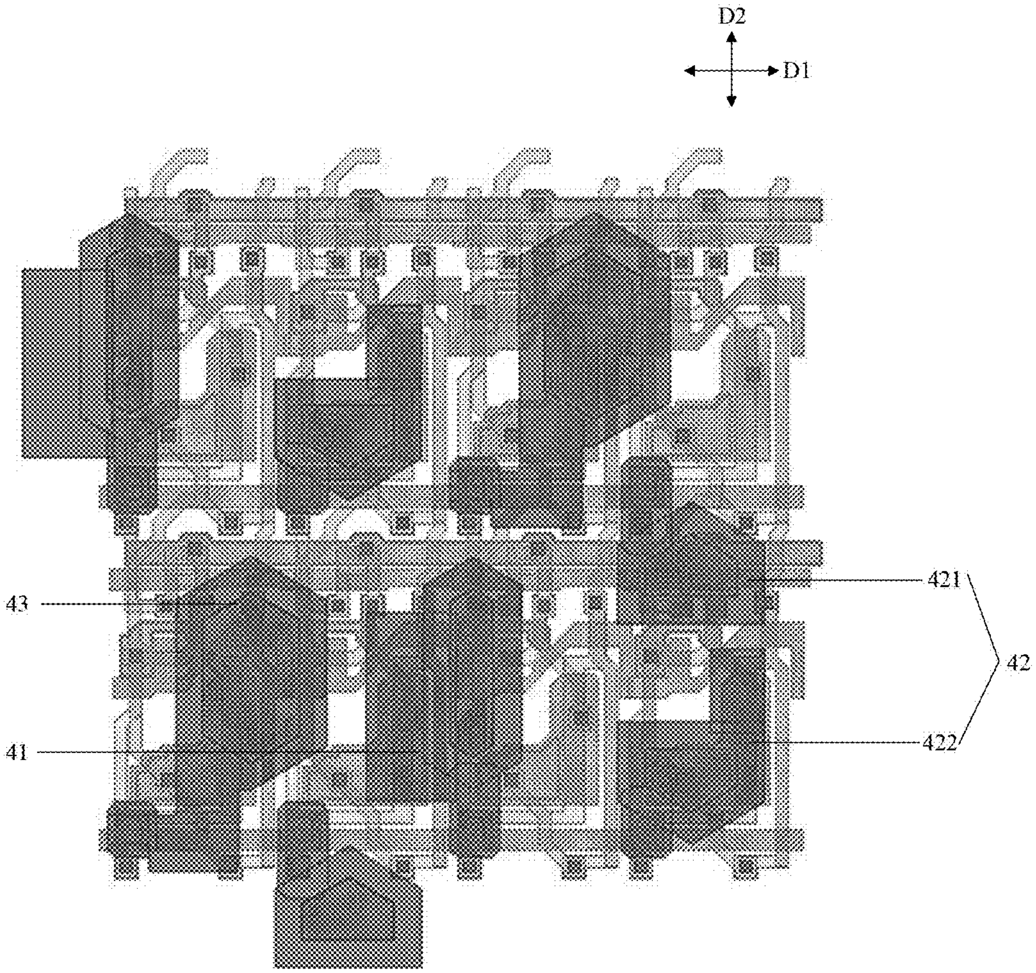
FIG. 7I is a schematic planar view of the stacking of a semiconductor layer, a first conductive layer, a second conductive layer, a third conductive layer of the display substrate shown in FIG. 7A and the first electrode shown in FIG. 7H.
Figure 8A:
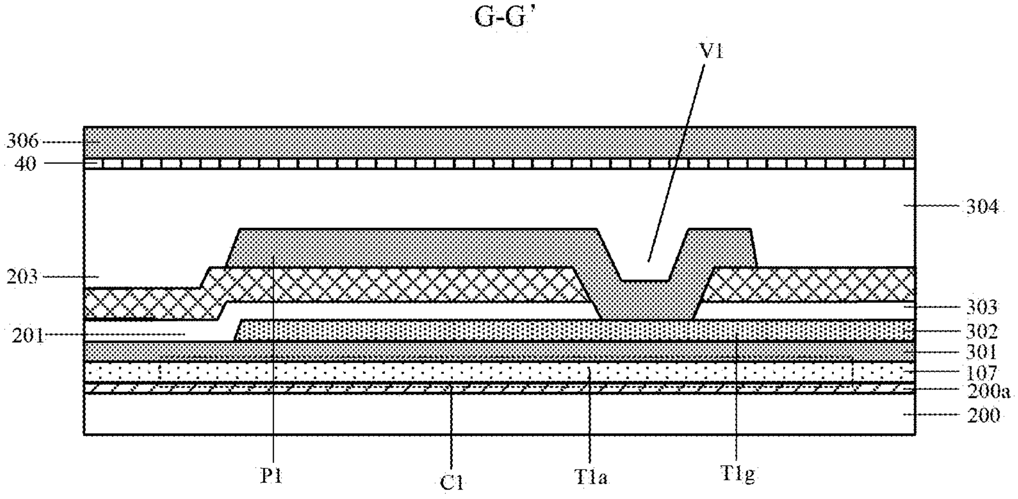
FIG. 8A is a cross-sectional view along a line G-G' in FIG. 7A.
Figure 8B:
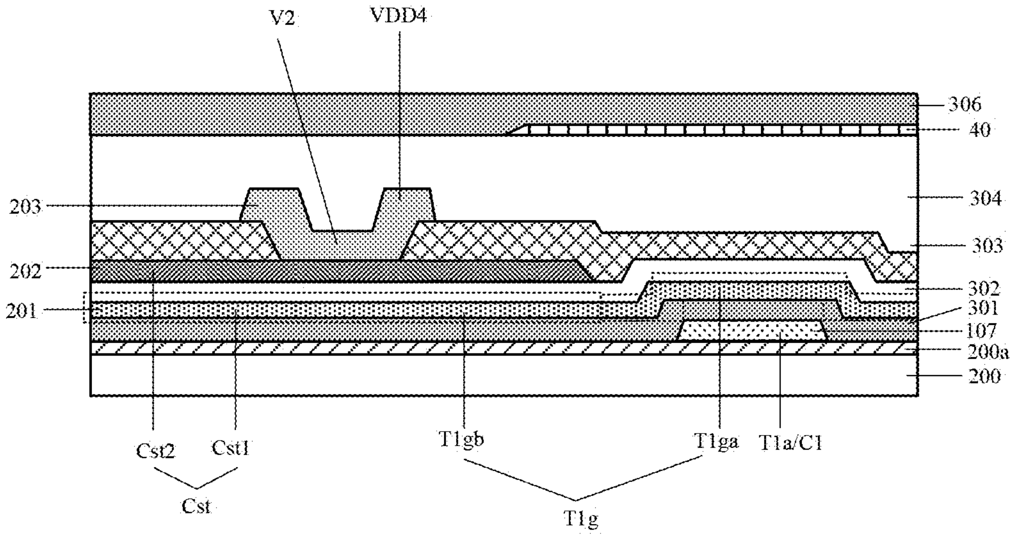
FIG. 8B is a cross-sectional view along a line H-H' in FIG. 7A.
Figure 8C:
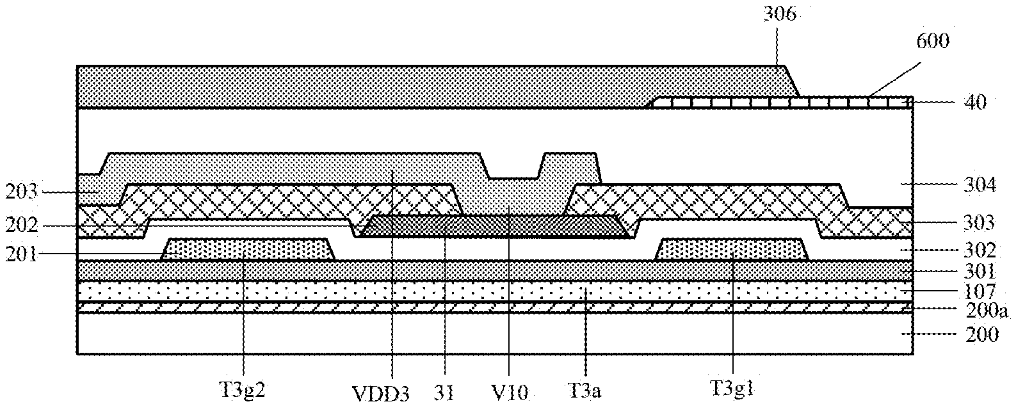
FIG. 8C is a cross-sectional view along a line I-I' in FIG. 7A.
Figure 8D:
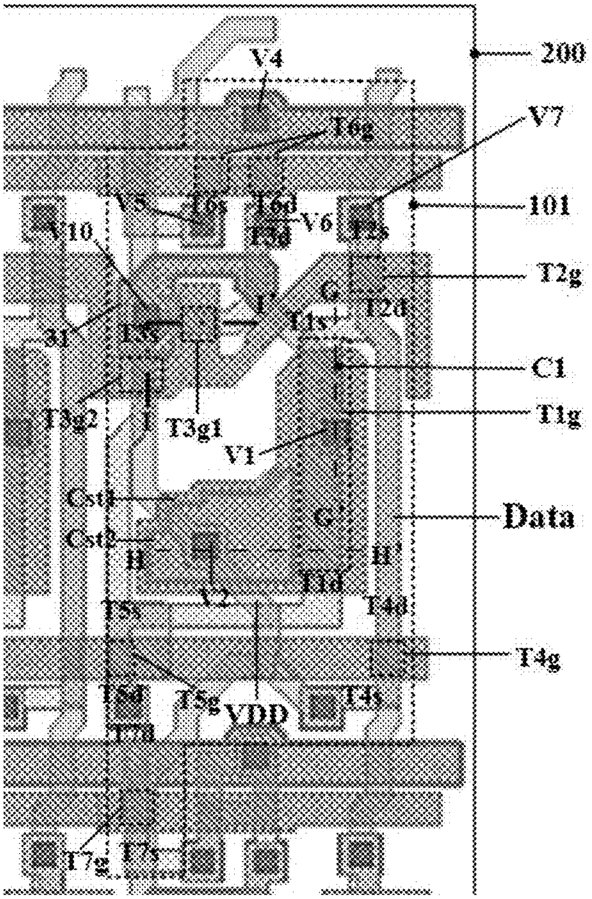
FIG. 8D is a partially enlarged schematic diagram of a sub-pixel in FIG. 7A.

FIG. 7A is a schematic structure diagram of a sub-pixel of further another display substrate provided by an embodiment of the present disclosure, FIGS. 7B-7H are schematic planar views of a semiconductor layer, a first conductive layer, a second conductive layer, each via, a third conductive layer of the display substrate shown in FIG. 7A and a first electrode, FIG. 8A is a cross-sectional view along a line G-G' in FIG. 7A, FIG. 8B is a cross-sectional view along a line H-H' in FIG. 7A, FIG. 8C is a cross-sectional view along a line I-I' in FIG. 7A, and FIG. 8D is a partially enlarged schematic diagram of a sub-pixel in FIG. 7A. The pixel circuit of the display substrate provided by the embodiment shown in FIGS. 7B-7H and FIGS. 8A-8D is still as shown in FIG. 2B, and the display substrate provided by the embodiment shown in FIGS. 7B-7H and FIGS. 8A-8D has the following differences from the display substrate provided by the embodiment shown in FIG. 3A.

As shown in FIG. 7A, FIG. 5E and FIG. 6A, for example, the orthographic projection of the first connection structure P1 of the sub-pixel on the base substrate 200 at least partially overlaps with the orthographic projection of the channel region C1 of the driving transistor T1 on the base substrate 200, so as to save the layout space, and improve the PPI and aperture ratio of the display panel using the display substrate.

For example, referring to FIG. 7A, FIG. 7G and FIG. 8A, the first connection structure P1 and the first electrode T1*s* of the driving transistor T1 are arranged in the same layer, for example, both the first connection structure P1 and the first electrode T1*s* of the driving transistor T1 are located in the third conductive layer 203; and the first connection structure P1 is electrically connected to the first electrode plate Cst1 of the storage capacitor Cst through the via V1.

Referring to FIG. 7A, the orthographic projection of the first via V1 on the base substrate 200 overlaps with the orthographic projection of the first portion Cst11 of the first electrode plate Cst1 on the base substrate 200, and does not overlap with the orthographic projection of the second portion Cst12 of the first electrode plate Cst1 on the base substrate 200 and the orthographic projection of the second electrode plate Cst2 on the base substrate 200.

Different from the embodiment shown in FIG. 3A, the first connection structure P1 is in a strip shape extending in the second direction as a whole, such as a straight strip shape. For example, referring to FIG. 7A and FIG. 7G, the first connection structure P1 includes a first inclined portion P1-3, the first inclined portion P1-3 extends along the third direction intersecting both the first direction D1 and the second direction D2, the orthographic projection of the first inclined portion P1-3 on the base substrate 200 at least partially overlaps with the orthographic projection of the channel region C1 of the driving transistor T1 on the base substrate 200.

For example, as shown in FIGS. 7A and 7C-7D, the first portion Cst11 of the first electrode plate Cst1 has a first terminal in the first direction D1, and the first signal line 210 providing the first scan signal Ga1 to the data writing transistor T2 includes a bending portion 2103, the bending portion 2103 surrounds the first terminal of the first portion Cst11.

For example, the first signal line 210 providing the first scan signal Ga1 to the data writing transistor T2, that is, the scan line 210, is further configured to provide the second scan signal Ga2 to the compensation transistor T3. For example, the compensation transistor T3 includes an active pattern T3*a*, and the active pattern T3*a* of the compensation transistor T3 and the active pattern T1*a* of the driving transistor T1 are disposed in the same layer, for example, both are located in the semiconductor layer. The sub-pixel further includes a shielding portion 31, the shielding portion 31 is located on the side of the active pattern T3*a* of the compensation transistor T3 away from the base substrate 200, and the orthographic projection of the shielding portion 31 on the base substrate 200 at least partially overlaps with the orthographic projection of the active pattern T3*a* of the compensation transistor T3 on the base substrate 200, so that the shielding portion 31 shields the active pattern T3*a* of the compensation transistor T3, for example, the shielding portion 31 shields the channel region of the shielding portion 31, so as to prevent light from affecting the performance of the channel region of the compensation transistor T3. For example, the shielding portion 31 is electrically connected to the first power line to connect the first power voltage VDD signal to the shielding portion 31 for voltage stabilization, so as to prevent unstable voltage jumps on the shielding portion 31 from affecting the stable operation of the pixel circuit.

For example, referring to FIG. 7E, the shielding portion 31 and the second electrode plate Cst2 are disposed in the same layer, for example, both are located in the second metal layer 202, so that the shielding portion 31 and the second electrode plate can be formed by performing the same patterning process on the same layer through the same mask, so as to simplify the manufacturing process of the display substrate 10. For example, the orthographic projection of the first power line VDD on the base substrate 200 at least partially overlaps with the orthographic projection of the shielding portion 31 on the base substrate 200, and the first power line VDD is electrically connected to the shielding portion 31 through the second via V2.

For example, in the display substrate 10 shown in FIG. 7A, the first power line VDD of the pixel circuit is connected to the first voltage terminal and configured to provide the first power voltage to the pixel circuit, and is provided in the same layer as the first electrode T1*s* of the driving transistor T1, for example, both the first power line VDD and the first electrode T1*s* of the driving transistor T1 are located in the third conductive layer 203. Referring to FIG. 7A, FIG. 7G and FIG. 8B, the first power line VDD includes a second vertical portion VDD3 and a second inclined portion VDD4. The second vertical portion VDD3 extends along the second direction D2; the second inclined portion VDD4 extends along the fourth direction intersecting both the first direction D1 and the second direction D2, and is electrically connected to the second electrode plate Cst2 through the second via V2. The second electrode plate Cst2 has a first side and a second side opposite in the second direction D2, the second vertical portion VDD3 is located on the first side of the second electrode plate Cst2, the second inclined portion VDD4 is connected to the second vertical portion VDD3 and extends from the first side of the second electrode plate Cst2 to the second side of the second electrode plate Cst2 along the fourth direction.

In the display substrate 10 shown in FIG. 7A, the first power line VDD and the data line Data are located on different sides of the storage capacitor Cst.

For example, in the embodiment shown in FIG. 3A, the first power line VDD and the data line Data are located in the same layer, and both the first power line VDD and the data line Data are located in the third conductive layer 203; in other embodiments, the first power line VDD and the data line Data may be respectively in different layers. For example, in at least one embodiment, the display substrate further includes a fourth conductive layer located on a side of the third conductive layer 203 away from the base substrate 200. For example, the first power line VDD is located in the third conductive layer 203, and the data line Data is located in the fourth conductive layer; or, the first power line VDD is located in the fourth conductive layer, and the data line Data is located in the third conductive layer 203.

Other unmentioned features and corresponding technical effects of the display substrate shown in FIGS. 7B-7I and 8A-8D are the same as those of the display substrate shown in FIG. 3A, please refer to the previous description and it is not repeated here.

Figure 9A:
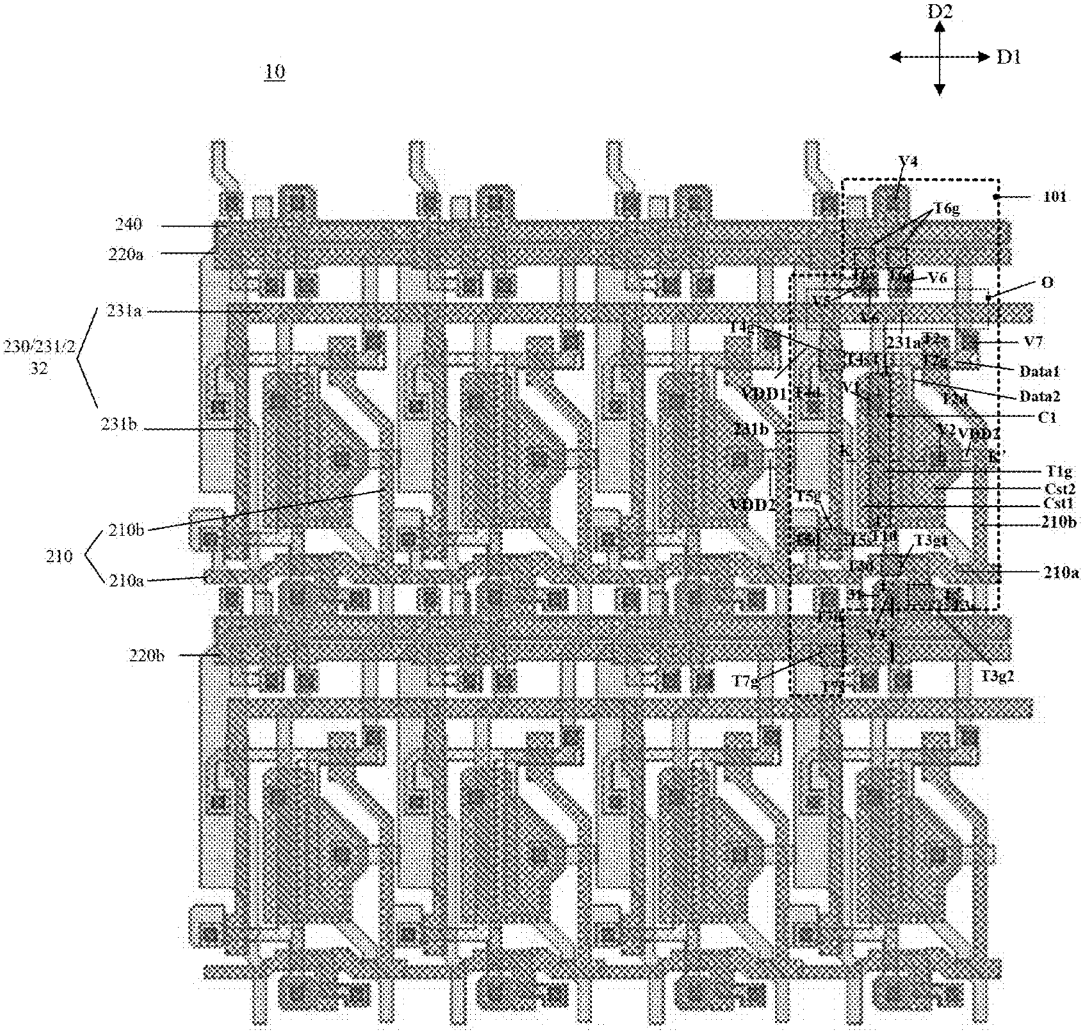
FIG. 9A is a schematic structure diagram of a sub-pixel of further another display substrate provided by an embodiment of the present disclosure.
Figure 9B:
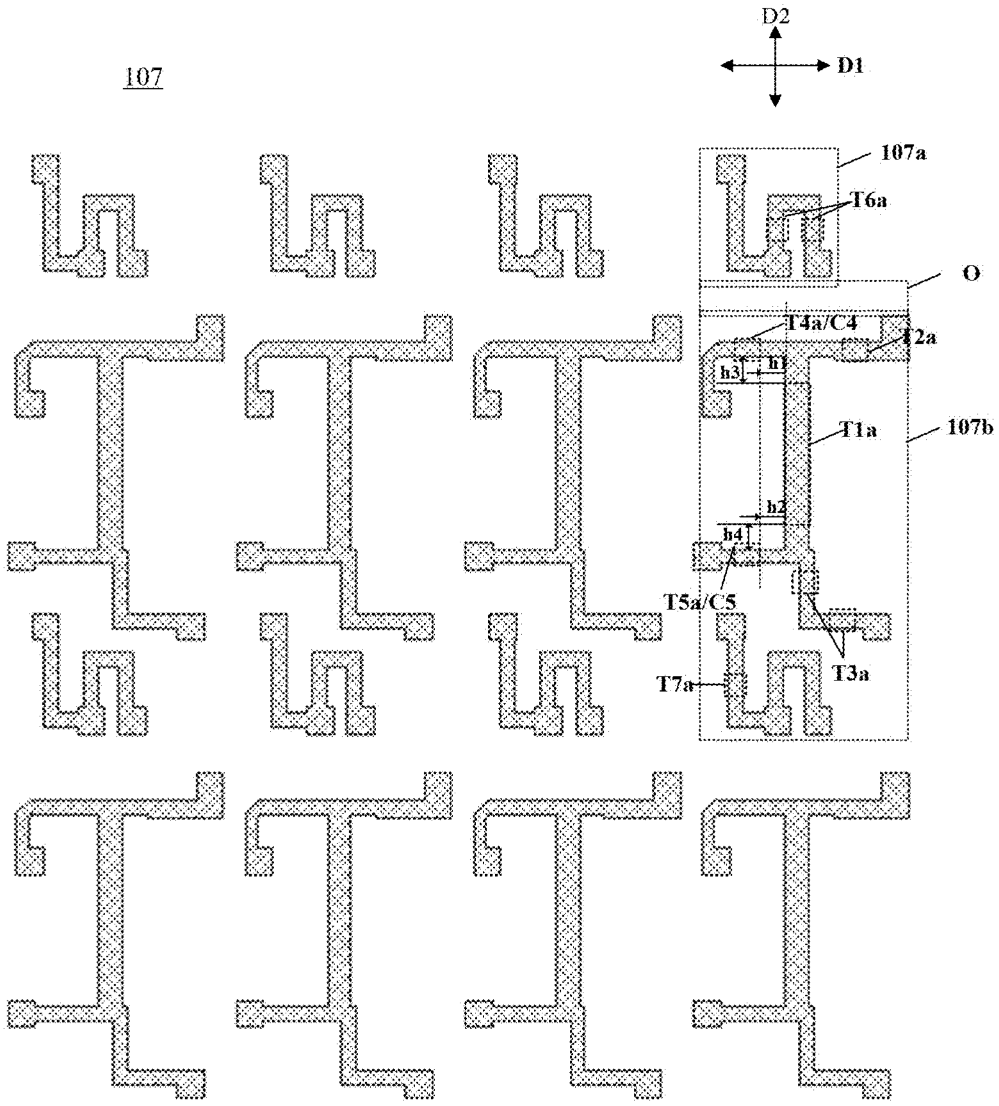
FIG. 9B is a schematic planar view of a semiconductor layer in the display substrate shown in FIG. 9A.

FIG. 9A is a schematic structure diagram of a sub-pixel of further another display substrate provided by an embodiment of the present disclosure; FIG. 9B is a schematic planar view of a semiconductor layer, a first conductive layer, a second conductive layer, each via, a third conductive layer and a first electrode of the display substrate shown in FIG. 9A, FIG. 9J is a partially enlarged schematic diagram of a sub-pixel in FIG. 9A, FIG. 10A is a cross-sectional view along a line J-J' in FIG. 9A, FIG. 10B is a cross-sectional view along a line K-K' in FIG. 9A; and FIG. 10C is a cross-sectional view along a line L-L' in FIG. 9A. The structure of the display substrate provided by at least one embodiment of the present disclosure will be exemplarily described below by taking the pixel circuit shown in FIG. 2B as an example and in conjunction with FIGS. 9B-9I and FIGS. 10A-10C.

As shown in FIG. 9A and FIG. 10B, the display substrate 10 includes a base substrate 200, a first signal line and a second signal line that are disposed on the base substrate 200, and a sub-pixel. For example, the base substrate 200 is provided with a plurality of sub-pixels arranged in an array. Each of at least some sub-pixels in the plurality of sub-pixels include a pixel circuit 101. For example, the at least some sub-pixels refer to sub-pixels that perform a display function, instead of dummy sub-pixels. For example, the pixel circuit 101 includes: a signal line, a second signal line, a light emitting device, a driving transistor T1, a data writing transistor T2, and a storage capacitor Cst. The data writing transistor T2 is configured to transmit the data signal transmitted on the second signal line, for example, to the driving transistor T1 under the control of the first scan signal Ga1, and the first scan signal Ga1 is transmitted on the first signal line 210; the driving transistor T1 is configured to control the magnitude of the driving current flowing through the light emitting device 121 according to the data signal Vd, and the light emitting device is configured to receive the driving current and be driven by the driving current to emit light. The driving transistor T1 includes an active pattern T1*a* and a gate electrode T1*g*, the active pattern T1*a* of the driving transistor T1 includes a channel region C1, and the orthographic projection of the channel region C1 on the base substrate 200 at least partially overlaps with the orthographic projection of the gate electrode on the base substrate 200; the storage capacitor Cst includes: a first electrode plate Cst1 and a second electrode plate Cst2. The first electrode plate Cst1 is electrically connected to the gate electrode of the driving transistor T1; the orthographic projection of the second electrode plate Cst2 on the base substrate 200 at least partially overlaps with the orthographic projection of the first electrode plate Cst1 on the base substrate 200, and does not overlap with the orthographic projection of the channel region C1 of the driving transistor T1 on the base substrate 200. In the display substrate 10 provided by the embodiments of the present disclosure, because the second electrode plate Cst2 is connected to the first power voltage VDD for voltage stabilization, the first power voltage signal will affect the channel region C1 of the driving transistor T1, in order to reduce its influence on the channel region C1 of the driving transistor T1, the second electrode plate Cst2 avoids the channel region C1 of the driving transistor T1, so as to prevent the performance of the driving transistor T1 from being affected.

For example, the first signal line is a gate line as a scan signal line, and the second signal line is a data line; alternatively, in some other embodiments, the first signal line is a data line and the second signal line is a gate line as a scan signal line.

Similar to the embodiment shown in FIG. 3A, combined with FIGS. 9B-9G and 10A-10C, the display substrate 10 includes a semiconductor layer 107, a first insulating layer 301, a first conductive layer 201, a second insulating layer 302, a second conductive layer 202, a third insulating layer 303, a third conductive layer 203, a fourth insulating layer 304 and a fourth conductive layer 204 that are sequentially arranged on the base substrate 200.

For example, as shown in FIG. 9B, the semiconductor layer 107 includes active patterns T1*a*-T7*a* of the first to seventh transistors T1-T7.

Figure 9C:
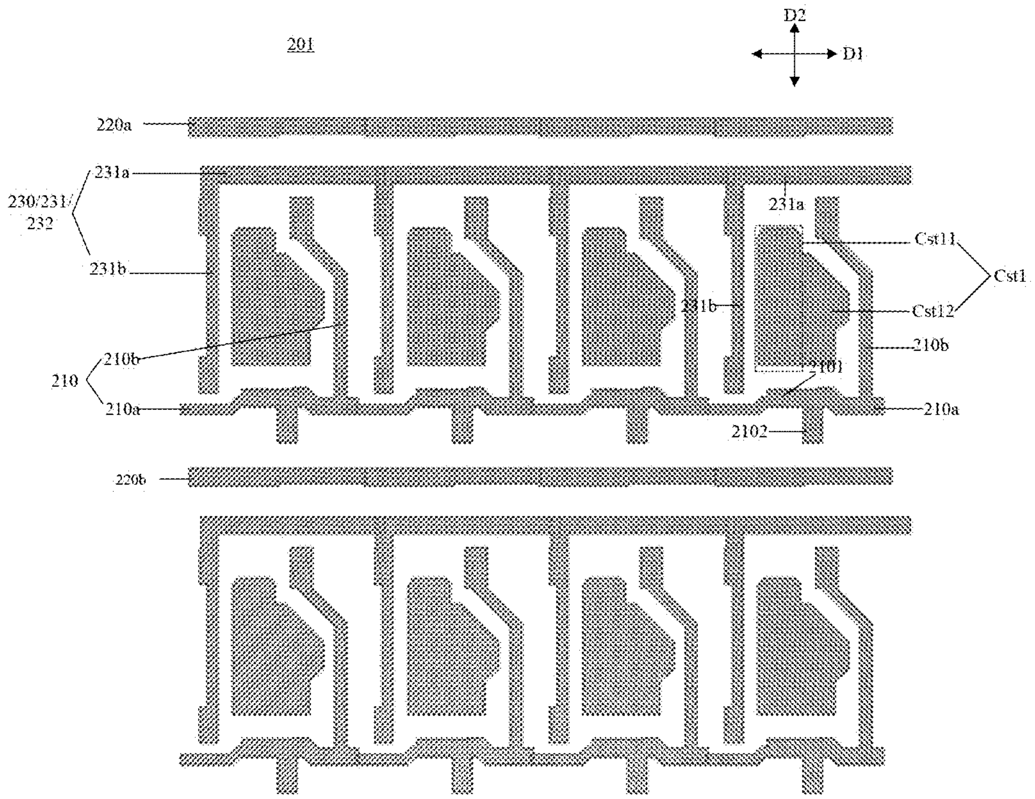
FIG. 9C is a schematic planar view of a first conductive layer in the display substrate shown in FIG. 9A.
Figure 9D:
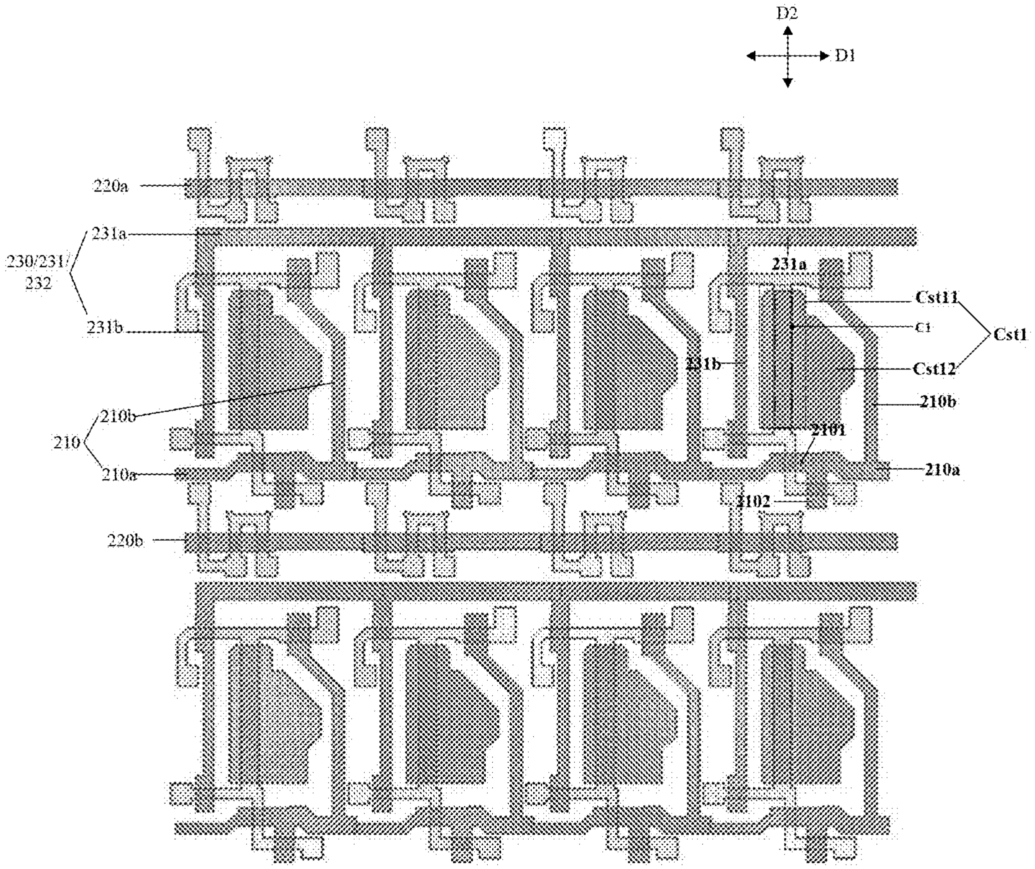
FIG. 9D is a schematic planar view of the stacking of a semiconductor layer and a first conductive layer in the display substrate shown in FIG. 9A.
Figure 9E:
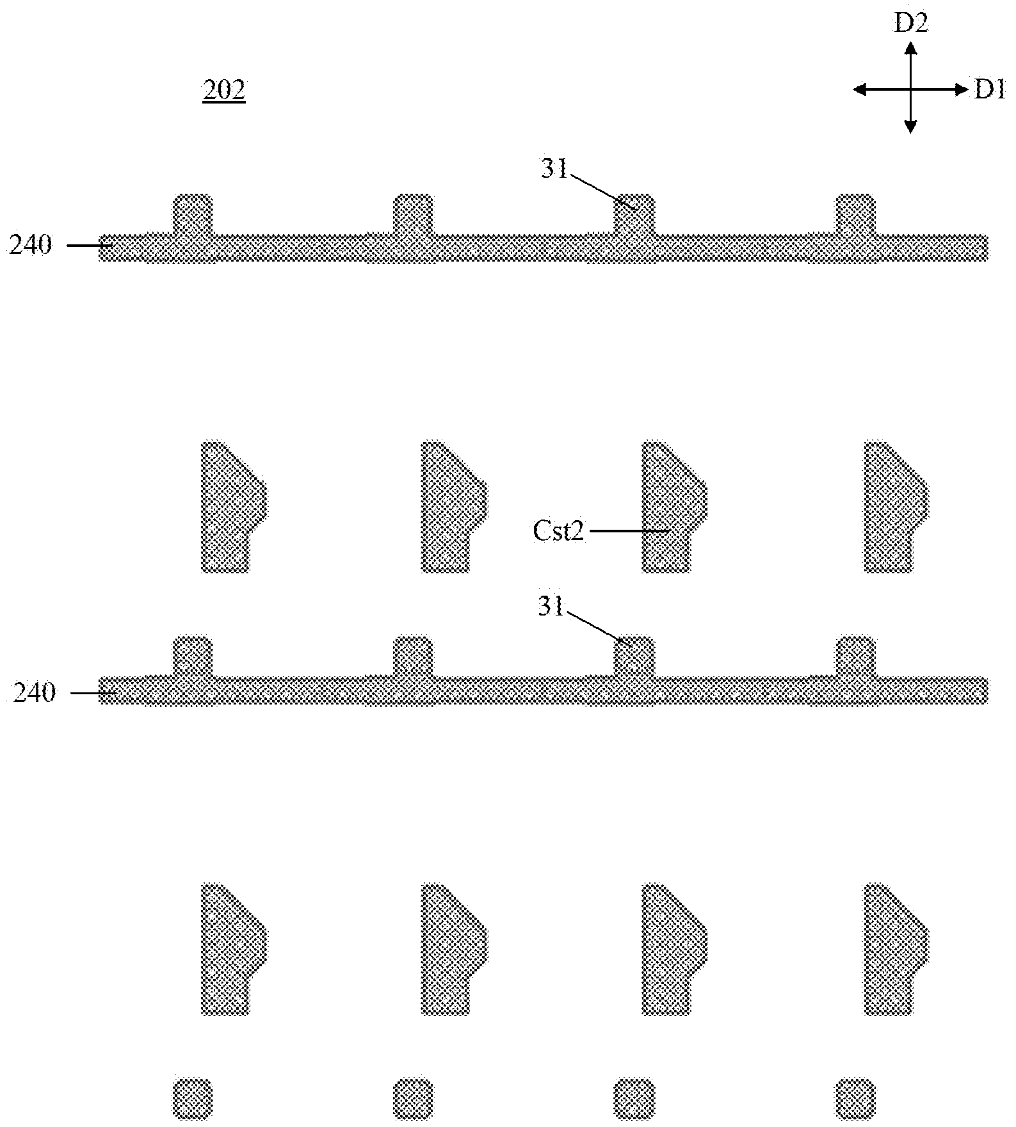
FIG. 9E is a schematic planar view of a second conductive layer in the display substrate shown in FIG. 9A.
Figure 9F:
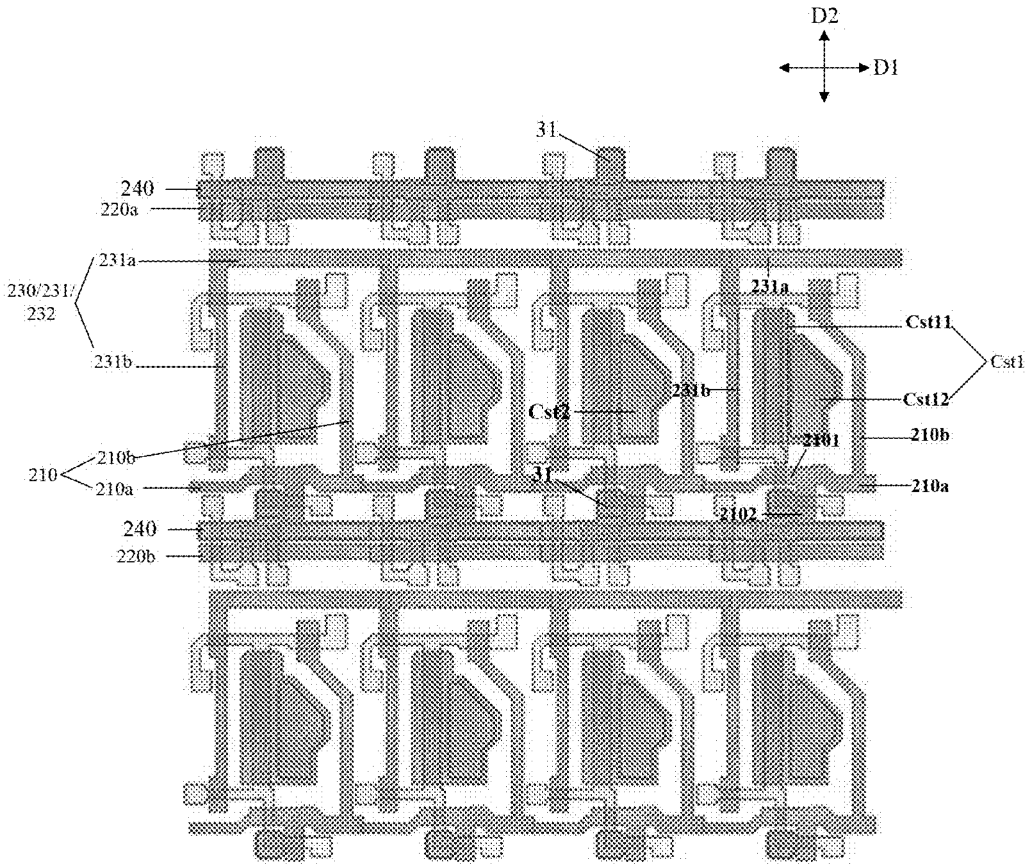
FIG. 9F is a schematic planar view of the stacking of a semiconductor layer, a first conductive layer and a second conductive layer in the display substrate shown in FIG. 7A.
Figure 10A:
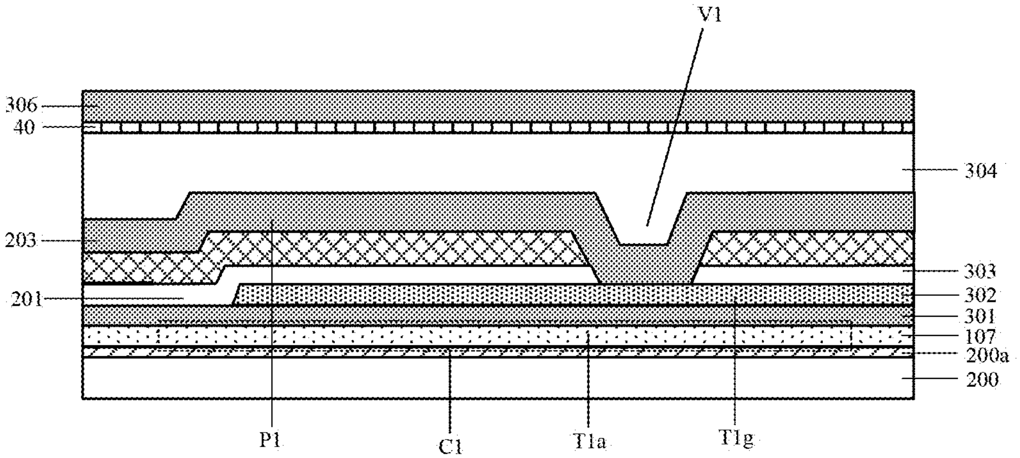
FIG. 10A is a cross-sectional view along a line J-J' in FIG. 9A.
Figure 10B:
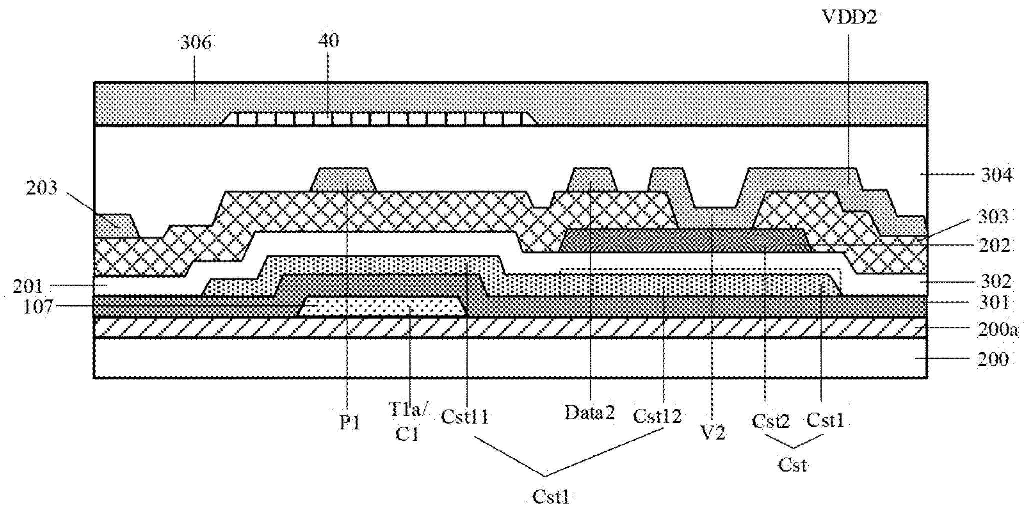
FIG. 10B is a cross-sectional view along a line K-K' in FIG. 9A.
Figure 10C:
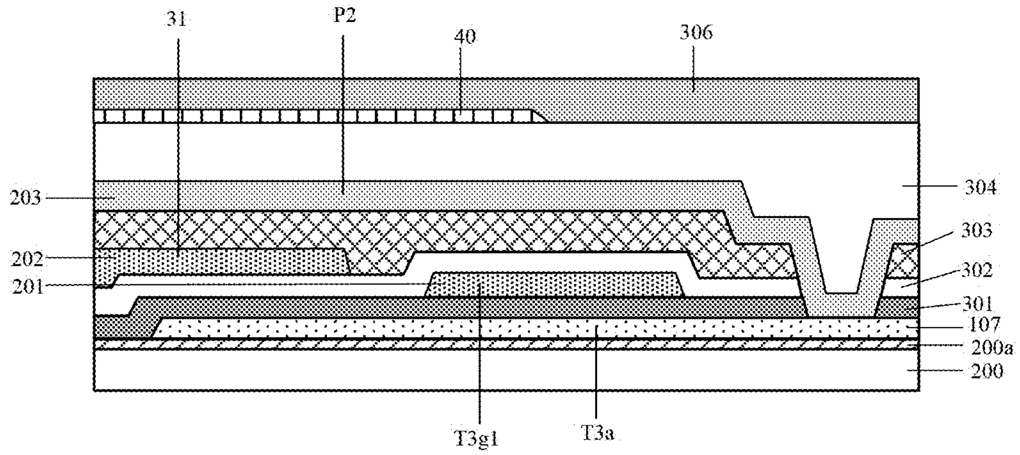
FIG. 10C is a cross-sectional view along a line L-L' in FIG. 9A.

For example, as shown in FIGS. 9C-9D, the first conductive layer 201 includes the gate electrode of each transistor and some scan lines and control lines. FIG. 9A shows the region where the pixel circuit of each sub-pixel is located in a large dotted frame, and FIG. 9B shows the first to seventh gate electrodes T1*g*-T7*g* of the first to seventh transistors T1-T7 in one pixel circuit unit 100 in a small dotted frame.

For example, as shown in FIGS. 9C-9D, the first conductive layer 201 includes the first to seventh gate electrodes T1*g*-T7*g* of the first to seventh transistors T1-T7. For example, the display substrate 10 adopts a self-alignment process, and uses the first conductive layer 201 as a mask to perform a conductive treatment (for example, a doping treatment) on the semiconductor layer 107, so that the portion of the semiconductor layer 107 that is not covered by the first conductive layer 201 is conducted, and therefore portions of the active pattern of each transistor on both sides of the channel region are conducted to form the first electrode and the second electrode of the transistor, respectively.

For example, as shown in FIG. 9A, the gate electrode T6*g* of the sixth transistor T6 of the pixel circuit of the current row is electrically connected to the first reset control line 220*a* corresponding to the current row to receive the first reset control signal Rst1. The gate electrode of the seventh transistor T7 of the pixel circuit of the current row is electrically connected to the second reset control line 220*b* corresponding to the pixel circuit of the next row (that is, according to the scan sequence of the scan lines, the row of pixel circuits where the scan line that is sequentially turned on after the scan line of the current row is turned on) to receive the second reset control signal Rst2.

The scan line 210 is electrically connected (or in an integral structure) to the gate electrode of the second transistor T2 in the corresponding row of sub-pixels to provide the first scan signal Ga1, and one reset control line 220 is electrically connected to the gate electrode of the sixth transistor T6 in the corresponding row of sub-pixels to provide the first reset control signal Rst1, and the light emitting control line 230 is electrically connected to the gate electrode of the fourth transistor T4 in the corresponding row of sub-pixels to provide the first light emitting control signal EM1.

For example, as shown in FIG. 9A and FIG. 9C, the planar shape of the channel region C1 of the driving transistor T1 is a stripe shape extending along the second direction D2 as a whole, and this feature can increase the length of the channel region of the driving transistor (the length along the second direction D2), thereby increasing the length-width ratio of the channel region of the driving transistor to ensure that in the black state, the current leakage of the driving transistor T1 will be small and the driving will be stable. The greater the length of the channel region of the driving transistor T1, the closer the output curve of the driving transistor T1 in the saturation region is to the ideal linear state, so that the display substrate such as the OLED display substrate works in the saturation region of the driving transistor T1, so that the brightness of the display panel using the display substrate is better controlled by the driving transistor T1; in addition, this feature is beneficial to save the layout space of the pixel circuit. The channel region C1 is different from the existing channel with a shape of "几", or a shape of "S" and the like which extends along the first direction D1 and has an obvious bending part. The first direction D1 and the second direction D2 are the same as those in FIG. 3A.

It should be noted that the feature "strip shape extending along the second direction D2 as a whole" includes the case that the strip shape extends generally along the second direction D2, that is, the strip shape extends along the second direction D2 as a whole. For example, in some examples, the strip shape extending along the second direction D2 as a whole may have a certain curved portion, for example, it may be a wave shape extending along the second direction D2 as a whole as shown in FIG. 4F; alternatively, in some examples, the edge of the strip shape extending along the second direction D2 as a whole may not be a smooth line, for example, the edge may have burrs or serrations. In short, it suffices to satisfy the strip shape extending along the second direction D2 as a whole.

For example, as shown in FIG. 9A and FIG. 9C, the planar shape of the channel region C1 of the driving transistor T1 is a straight stripe shape extending along the second direction D2 to better increase the length-width ratio of the channel region C1 of the driving transistor T1, make the channel region C1 more regular, which facilitates manufacture and better saves the layout space of the pixel circuit.

For example, referring to FIGS. 9A-9D, the first electrode plate Cst1 includes a first portion Cst11 and a second portion Cst12. The orthographic projection of the first portion Cst11 of the storage capacitor Cst on the base substrate 200 does not overlap with the orthographic projection of the first electrode plate Cst2 on the base substrate 200; the second portion Cst12 of the storage capacitor Cst is connected to the first portion Cst11, and protrudes from the first portion Cst11, the orthographic projection of the second portion Cst12 on the base substrate 200 at least partially overlaps with the orthographic projection of the first electrode plate Cst2 on the base substrate 200.

For example, in the embodiment shown in FIG. 9A, the first electrode plate Cst1 and the gate electrode T1*g* of the driving transistor T1 are disposed in the same layer and constitute a continuous and integral structure, for example, both the first electrode plate Cst1 and the gate electrode T1*g* of the driving transistor T1 are located in the first conductive layer 201 to simplify the display substrate 10, and the first electrode plate Cst1 and the gate electrode T1*g* of the driving transistor T1 can be formed by performing one same patterning process on one same layer through one same mask, which simplifies the manufacturing process of the display substrate 10. For example, the first portion Cst11 of the first electrode plate Cst1 is in a strip shape extending along the second direction D2, and the second portion Cst12 of the first electrode plate Cst1 protrudes from the first portion along the first direction D1.

For example, as shown in FIG. 9A and FIG. 10B, the pixel circuit 101 further includes a first connection structure P1, and the first connection structure P1 is electrically connected to the gate electrode T1*g* of the driving transistor T1 and the first electrode plate Cst1; the orthographic projection of the first connection structure P1 on the base substrate 200 does not overlap with the orthographic projection of the second electrode plate Cst2 on the base substrate 200. For example, the second electrode plate Cst2 is located in the second conductive layer 202, the second conductive layer 202 is located on a side of the first conductive layer 201 away from the base substrate 200, and a second insulating layer 302 is provided between the second conductive layer 202 and the first conductive layer 201. In this way, the first connection structure P1 needs to be electrically connected to the first electrode plate Cst1 through a via, and the first connection structure P1 will not pass through the second electrode plate Cst2 of the storage capacitor Cst, thereby increasing the area of the second electrode plate Cst2 and increasing the capacitance of the storage capacitor.

For example, as shown in FIG. 9A and FIG. 10B, the orthographic projection of the first connection structure P1 on the base substrate 200 at least partially overlaps with the orthographic projection of the first portion Cst11 on the base substrate 200, for example, overlaps with the channel region C1 of the driving transistor T1 to save space, which is beneficial for arranging other structures of the pixel circuit under the condition of rationally utilizing the limited space, this is very important for the pixel design of the display substrate, and can solve the important technical problem of how to effectively improve the PPI.

For example, the first connection structure P1 and the first electrode T1*s* of the driving transistor T1 are disposed in the same layer, for example, both are located in the third conductive layer 203. The first connection structure P1 is electrically connected to the first electrode plate Cst1 through the first via V1; the orthographic projection of the first via V1 on the base substrate 200 overlaps with the orthographic projection of the first portion Cst11 of first electrode plate Cst1 on the base substrate 200, that is, does not overlap with the orthographic projection of the second electrode plate Cst2 on the base substrate 200.

For example, the first conductive layer 201 further includes a plurality of gate lines insulated from each other, for example, the gate lines include a plurality of scan lines 210, a plurality of reset control lines 220*a*/220*b* and a plurality of light emitting control lines 230. Here, the gate line refers to a signal line directly connected to the gate electrode of the transistor to provide a scan signal or a control signal. For example, each row of sub-pixels is respectively connected to one scan line 210, two reset control lines and one light emitting control line 230, and the two reset control lines are respectively the first reset control line 220*a* and the second reset control line 220*b*.

For example, as shown in FIG. 9A and FIG. 9C, the first signal line 210, that is, the first scan signal line, is connected to the gate electrode of the data writing transistor T2 and is configured to provide the first scan control signal Ga1 to the gate electrode of the data writing transistor T2. The first signal line 210 includes a first lateral portion 210*a* extending along the first direction D1 as a whole and a first vertical portion 210*b* extending along the second direction D2 as a whole, and the first lateral portion 210*a* is connected with the first vertical portion 210*b*. As shown in FIG. 9B, the data writing transistor T2 includes an active pattern T2*a*, and the orthographic projection of the active pattern T2*a* of the data writing transistor T2 on the base substrate 200 at least partially overlaps with the orthographic projection of the first vertical portion 210*b* on the base substrate 200, so that a part of the first vertical portion 210*b* forms the gate electrode T2*g* of the data writing transistor T2. In this way, the first scan control signal Ga1 enters the sub-pixel along the first direction D1, and is applied to the gate electrode T2*g* of the data writing transistor T2 along the second direction D2, that is, drive the data writing transistor T2 along the second direction D2, which can more stably drive the data writing transistor T2, and at the same time, the limited space of the sub-pixel is reasonably utilized for wiring.

For example, as shown in FIG. 9A and FIG. 9C, the first light emitting control transistor T4 of the pixel circuit 101 is connected to the first electrode T1*s* of the driving transistor T1 and the first voltage terminal vdd, and is configured to provide the first power voltage VDD of the first voltage terminal vdd to the first electrode T1*s* of the driving transistor T1 under the control of the first light emitting control signal EM1. The plurality of light emitting control lines 230 include a first light emitting control line 231, the first light emitting control line 231 is connected to the gate electrode of the first light emitting control transistor T4 and configured to provide the first light emitting control signal to the gate electrode of the first light emitting control transistor T4.

For example, as shown in FIGS. 9A-9C, the first light emitting control line 231 includes a second lateral portion 231*a* extending along the first direction D1 as a whole and a second vertical portion 231*b* extending along the second direction D2 as a whole, the first light emitting control transistor T4 includes an active pattern T4*a*, and the orthographic projection of the active pattern T4*a* of the first light emitting control transistor T4 on the base substrate 200 at least partially overlaps with the orthographic projection of the second vertical portion 231*b* on the base substrate 200 to utilize a part of the second vertical portion 231*b* to constitute the gate electrode T4*g* of the first light emitting control transistor T4. In this way, the first light emitting control signal EM1 enters the sub-pixel along the first direction D1, and is applied to the gate electrode T4*g* of the first light emitting control transistor T4 along the second direction D2, that is, drives the first emission control transistor T4 along the second direction D2, which can more stably drive the first light emitting control transistor T4, and at the same time, the limited space of the sub-pixel is rationally utilized for wiring.

For example, as shown in FIGS. 9A-9C, the second light emitting control transistor T5 of the pixel circuit 101 is connected to the second light emitting control terminal vss, the light emitting device and the second electrode T1*d* of the driving transistor T1, and is configured to allow the driving current to be applied to the light emitting device under the control of the second light emitting control signal EM2. The plurality of light emitting control lines 230 further include a second light emitting control line 232, the second light emitting control line 232 is connected to the gate electrode T5*g* of the second light emitting control transistor T5 and configured to provide a second light emitting control signal EM2 to the gate electrode T5*g* of the second light emitting control transistor T5. The first light emitting control line 231 is further used as the second light emitting control line 232, that is, the first light emitting control transistor T4 and the second light emitting control transistor T5 share one light emitting control line; and the second light emitting control transistor T5 includes an active pattern, and the orthographic projection of the active pattern T5*a* of the second light emitting control transistor T5 on the base substrate 200 at least partially overlaps with the orthographic projection of the second vertical portion 231*b* on the base substrate 200, so as to use a part of the second vertical portion 231*b* to form the gate electrode T5*g* of the light emitting control transistor T5. In this way, the second light emitting control signal EM2 enters the sub-pixel along the first direction D1, and is applied to the gate electrode T4*g* of the second light emitting control transistor T5 along the second direction D2, that is, drives the second light emitting control transistor T5 along the second direction D2, which can more stably drive the second light emitting control transistor T5, and at the same time, the limited space of the sub-pixel is rationally utilized for wiring. By using the second vertical portion 231*b* to form the gate electrode T4*g* of the first light emitting control transistor T4 and the gate electrode T5*g* of the second light emitting control transistor T5, the first light emitting control transistor T4 and the second light emitting control transistor T5 are driven in the second direction D2 at the same time, thereby simplifying the structure of the pixel circuit.

For example, the storage capacitor Cst is located between the first vertical portion 210*b* and the second vertical portion 231*b*, and between the first lateral portion 210*a* and the second lateral portion 210*b*, so as to utilize the limited space for rational layout of the first light emitting control line and the second light emitting control line respectively having the lateral portion and the vertical portion, which is beneficial to improve the PPI and aperture ratio of the display panel using the display substrate.

For example, as shown in FIG. 9B, the active pattern of the first light emitting control transistor T4 includes a channel region, and the active pattern of the second light emitting control transistor T5 includes a channel region C5; in the first direction D1, the distance between the channel region C4 of the transistor T4 and the channel region C1 of the driving transistor T1 is h1, the distance between the channel region C5 of the second light emitting control transistor T5 and the channel region C1 of the driving transistor T1 is h2, and in the second direction D2, the distance between the channel region of the first light emitting control transistor T4 and the channel region C1 of the driving transistor T1 is equal to the distance between the channel region of the second light emitting control transistor T5 and the channel region C1 of the driving transistor T1.

It should be noted that the distance h1 refers to the distance between the side of the channel region C4 close to the channel region C1 in the first direction D1 and the side of the channel region C1 close to the channel region C4 in the first direction D1, and the distance h2 refers to the distance between the side of the channel region C5 close to the channel region C1 in the first direction D1 and the side of the channel region C1 close to the channel region C5 in the first direction D1; the distance h3 refers to the distance between the side of the channel region C4 close to the channel region C1 in the second direction D2 and the side of the channel region C1 close to the channel region C4 in the second direction D2, and the distance h4 refers to distance between the side of the channel region C5 close to the channel region C1 in the second direction D2 and the side of the channel region C1 close to the channel region C5 in the second direction D2.

For example, the length-width ratio of the channel region C4 of the first light emitting control transistor T4 is the same as the length-width ratio of the channel region C5 of the second light emitting control transistor T5. For example, the ratio of the length of the channel region C4 in the first direction D1 to the width of the channel region C4 in the second direction D2 is the same as the ratio of the length of the channel region C5 in the first direction D1 to the width of the channel region C5 in the second direction D2, so that the driving effects of the first light emitting control transistor T4 and the second light emitting control transistor T5 are relatively close, the display effect is more stable, and the difficulty of the manufacturing process is reduced.

Figure 9G:
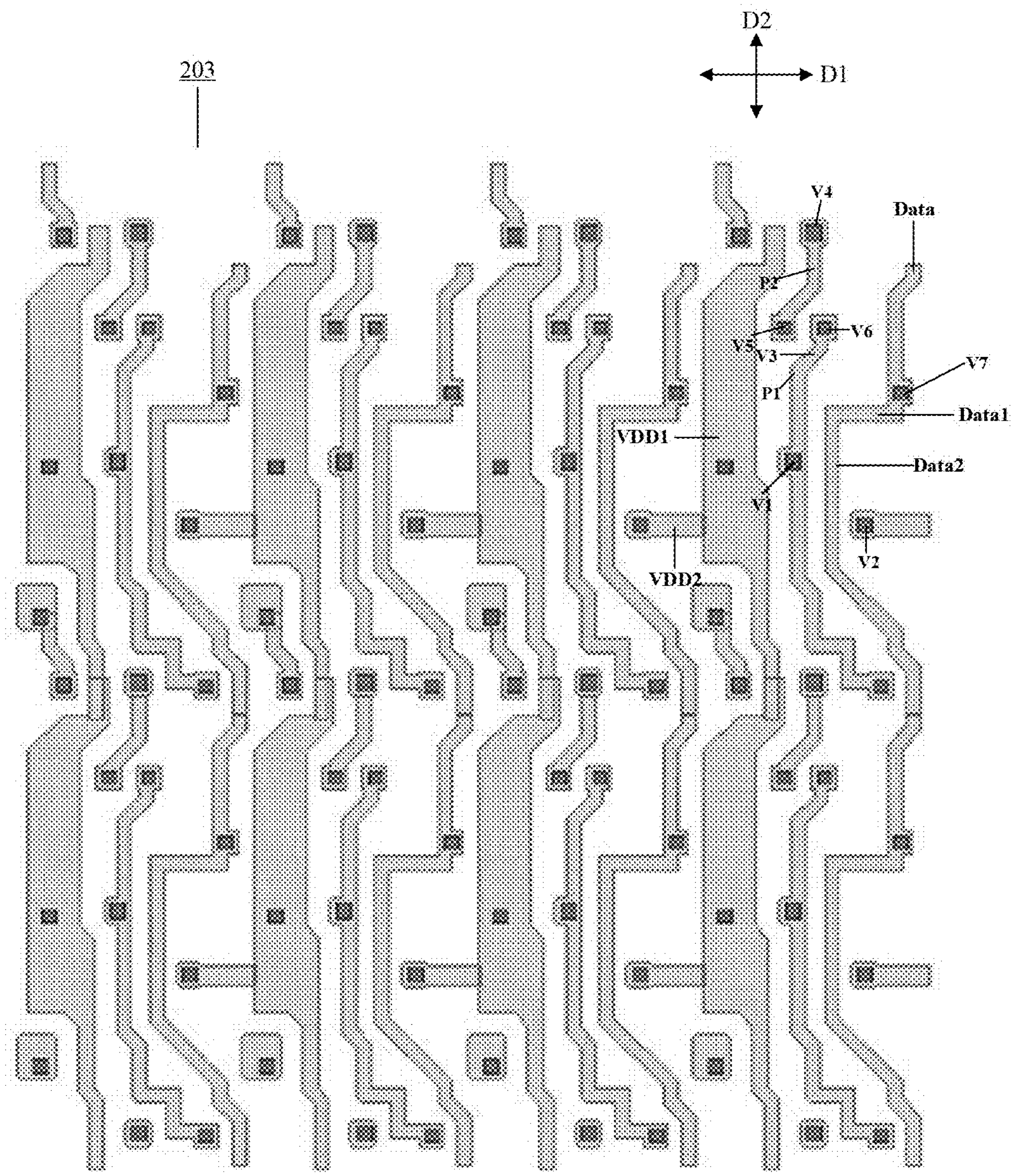
FIG. 9G is a schematic planar view of a third conductive layer in the display substrate shown in FIG. 9A.

For example, as shown in FIG. 9A and FIG. 9G, the pixel circuit 101 further includes a first power line VDD, the first power line VDD is connected to the first voltage terminal vdd and is configured to provide a first power voltage to the pixel circuit, the first power line VDD and the first electrode T1*s* of the driving transistor T1 are disposed in the same layer, for example, both are located in the third conductive layer 203. The first power line VDD includes a third vertical portion VDD1 and a third lateral portion VDD2. The third vertical portion VDD1 extends along the second direction D2 as a whole and is connected to adjacent sub-pixels to supply the power voltage to a plurality of sub-pixels in the same column; the third lateral portion VDD2 is connected to the third vertical portion VDD1 and extends from the third vertical portion VDD1 toward the second electrode plate Cst2, the third lateral portion VDD2 is electrically connected to the second electrode plate Cst2 through the second via V2.

For example, as shown in FIG. 9A and FIG. 9G, the second signal line such as the data line Data and the first power line VDD are arranged in the same layer, and both are located in the third conductive layer 203; and the second signal line include a fourth lateral portion Data1 extending along the first direction D1 as a whole and a fourth vertical portion Data2 extending along the second direction D2 as a whole; in the second direction D2, the fourth lateral portion Data1 of the data line Data is at least partially opposite to the third lateral portion VDD2 of the first power line VDD, that is, projections of the fourth lateral portion Data1 and the third lateral portion VDD2 along the second direction D2 overlaps with each other. The orthographic projection of the fourth vertical portion Data2 of the data line Data on the base substrate 200 does not overlap with the orthographic projection of the third lateral portion VDD2 of the first power line VDD on the base substrate 200, so that in the case that the data line Data and the first power line VDD are in the same layer, the data lines Data avoids the first power line VDD to prevent short circuit or signal crosstalk between the data lines Data and the first power line VDD.

For example, in the embodiment shown in FIG. 9A, the first power line VDD and the data line Data are located in the same layer, and both are located in the third conductive layer 203; in other embodiments, the first power line VDD and the data line Data may be respectively in different layers. For example, in at least one embodiment, the display substrate further includes a fourth conductive layer on a side of the third conductive layer 203 away from the base substrate 200. For example, the first power line VDD is located in the third conductive layer 203, and the data line Data is located in the fourth conductive layer; or, the first power line VDD is located in the fourth conductive layer, and the data line Data is located in the third conductive layer 203. In the case that the first power line VDD and the data line Data are respectively located in different layers, the orthographic projections of the two on the base substrate may have overlapping portions.

For example, as shown in FIGS. 9A and 10B, the third vertical portion VDD1 is located on the first side of the storage capacitor Cst in the first direction D1, and the orthographic projection of the fourth vertical portion Data2 of the data line Data on the base substrate 200 at least partially overlaps with the orthographic projection of the storage capacitor Cst on the base substrate 200, and does not overlap with the orthographic projection of the second via V2 on the base substrate 200, so that the data line Data can avoid the first power line VDD provided in the same layer in the case of saving space.

For example, as shown in FIG. 9A, the compensation transistor T3 of the pixel circuit 101 is configured to compensate the gate electrode T1*g* of the driving transistor T1 in response to the second scan signal Ga2 applied to the gate electrode T3*g* of the compensation transistor T3 and the data signal Vd. The first lateral portion 210*a* of the first signal line 210 providing the first scan signal Ga1 to the data writing transistor T2 is configured to provide the second scan signal to the compensation transistor T3. As shown in FIG. 9B, the compensation transistor T3 includes an active pattern T3*a*, and the active pattern T3*a* of the compensation transistor T3 and the active pattern T1*a* of the driving transistor T1 are disposed in the same layer, and both are located in the semiconductor layer 107. The sub-pixel further includes a shielding portion 31, the shielding portion 31 is located on a side of the active pattern T3*a* of the compensation transistor T3 away from the base substrate 200, and the orthographic projection of the shielding portion 31 on the base substrate 200 at least partially overlaps with the orthographic projection of the active pattern T3*a* of the compensation transistor T3 on the base substrate 200, so that the shielding portion 31 is used to shield the active pattern T3*a* of the compensation transistor, for example, shield the channel region of the compensation transistor T3, so as to prevent light from affecting the performance of the channel region of the compensation transistor T3. For example, the shielding portion 31 and the reset signal line 240 are disposed in the same layer, for example, both are located in the second metal layer 202. For example, the shielding portion 31 and the reset signal line 240 are disposed in the same layer and are integrally formed, so that the shielding portion 31 and the reset signal line 240 can be formed by performing a patterning process on the use the same layer through the same mask, which simplifies the structure and manufacturing process of the display substrate. It should be noted that the active pattern T3*a* shielded by the shielding portion 31 is a conductive portion around the channel region of the compensation transistor T3, and does not include the channel region of the compensation transistor T3.

For example, as shown in FIGS. 9A-9B, the semiconductor layer 107 includes an active pattern T1*a* of the driving transistor T1; the semiconductor layer 107 includes a first portion 107*a* and a second portion 107*b*, the first portion 107*a* of the semiconductor layer and the second portion of the semiconductor layer 107*b* are spaced apart by an opening O, the orthographic projection of the opening O on the base substrate 200 overlaps with the orthographic projection of the second lateral portion 231*a* of the first light emitting control line 231 on the base substrate 200, the orthographic projection of the first portion 107*a* of the semiconductor layer and the orthographic projection of the second portion 107*b* of the semiconductor layer on the base substrate 200 do not overlap with the orthographic projection of the second lateral portion 231*a* of the first light emitting control line 231 on the base substrate 200.

Figure 9H:
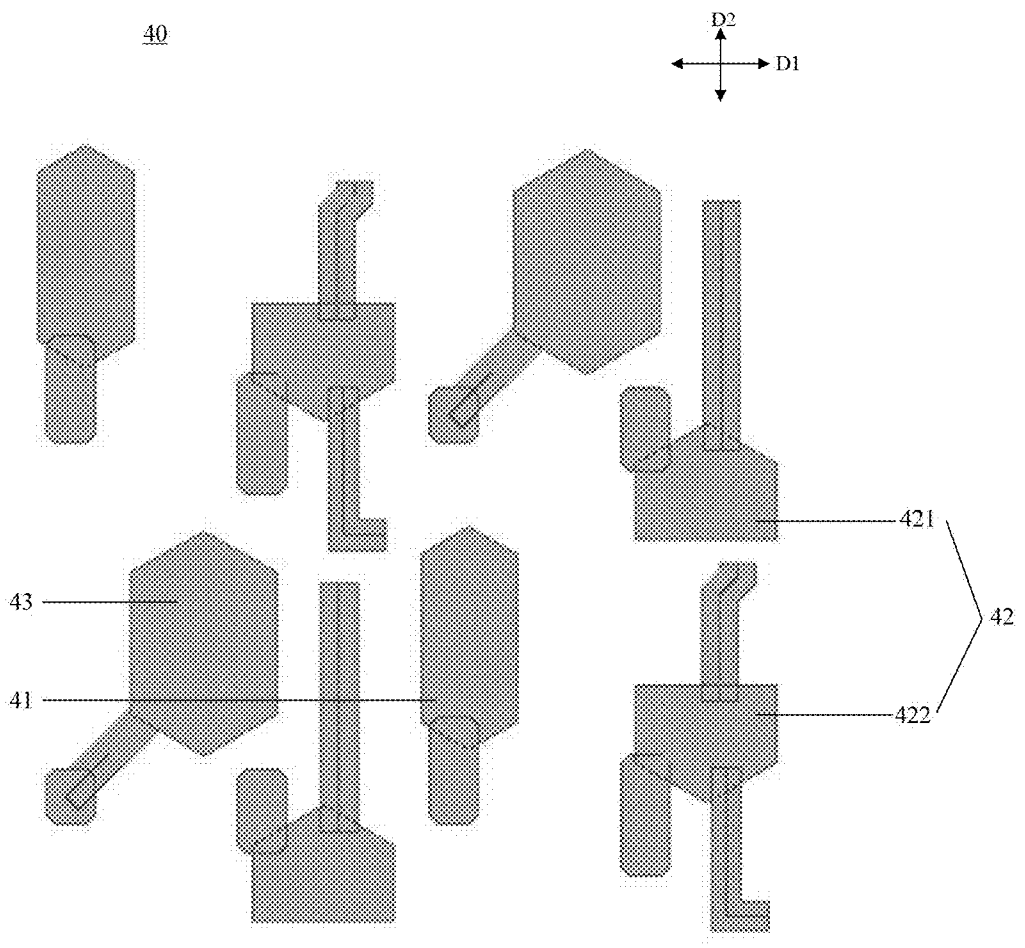
FIG. 9H is a schematic planar view of a first electrode provided by at least one embodiment of the present disclosure.
Figure 9I:
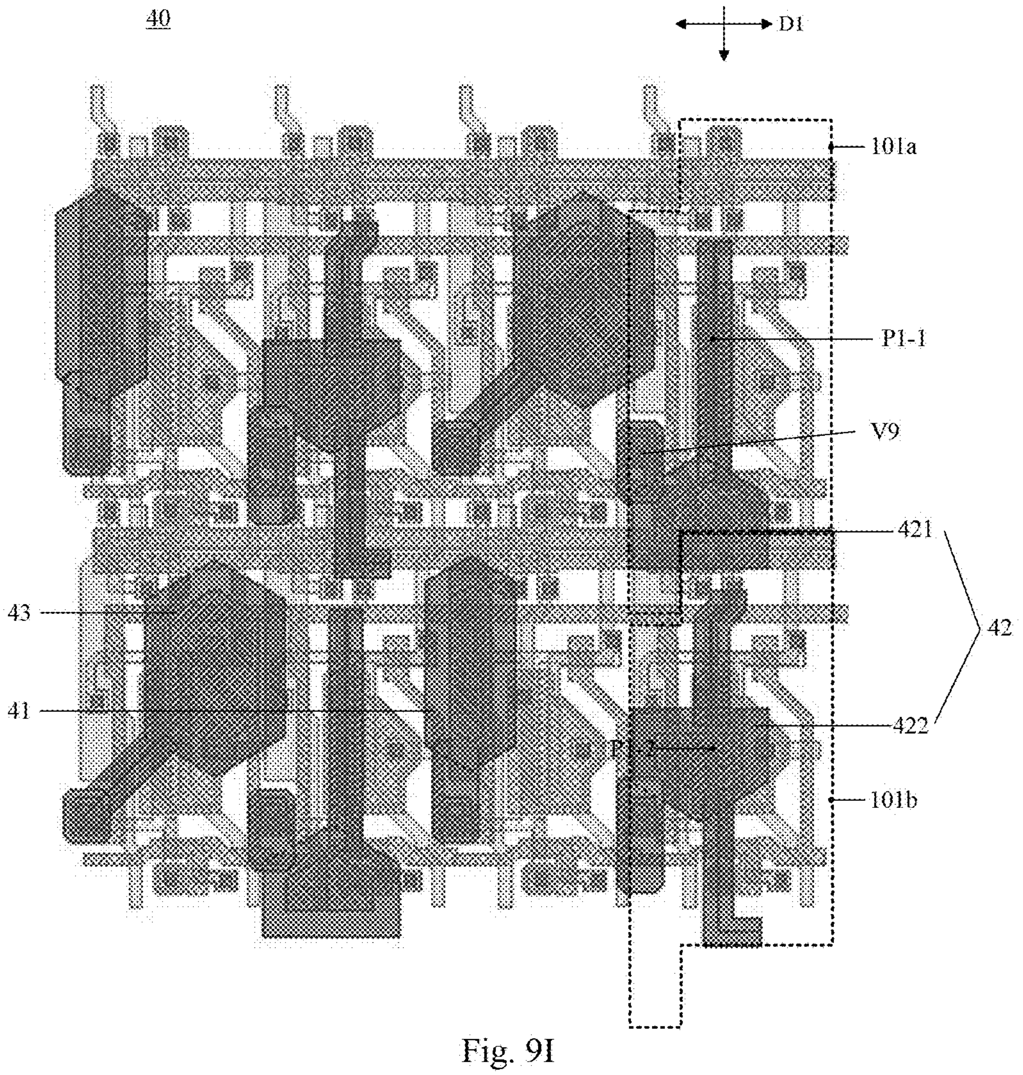
FIG. 9I is a schematic planar view of the stacking of a semiconductor layer, a first conductive layer, a second conductive layer, a third conductive layer of the display substrate shown in FIG. 9A and the first electrode shown in FIG. 9H.
Figure 9J:
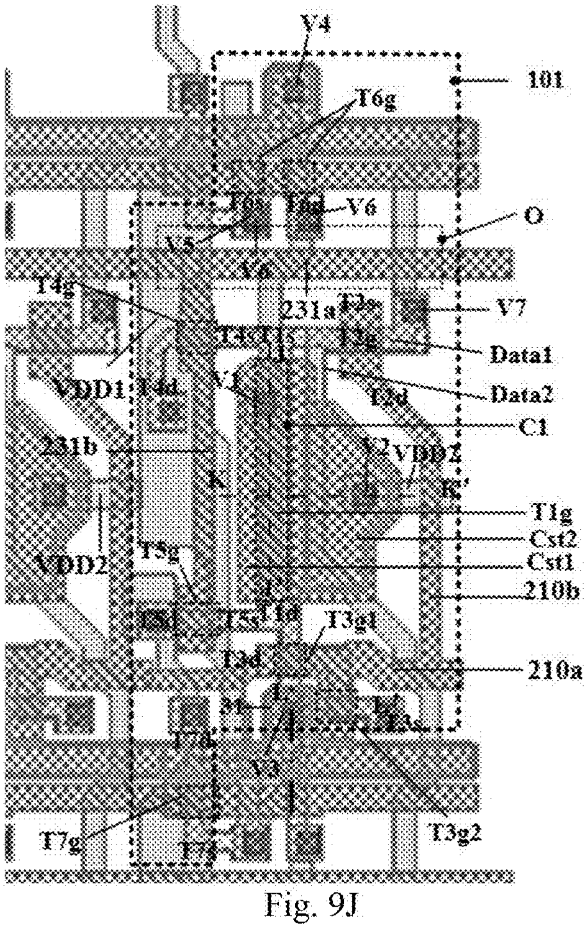
FIG. 9J is a partially enlarged schematic diagram of a sub-pixel in FIG. 9A.

The light emitting device of each sub-pixel performing a display function includes a first electrode 40, the first electrode 40 is electrically connected to one of the first electrode T1*s* and the second electrode T1*d* of the driving transistor T1. The base substrate 200 includes a plurality of sub-pixels. For example, as shown in FIGS. 9H-9I, the plurality of sub-pixels of the display substrate 10 include a first sub-pixel, two adjacent second sub-pixels and a third sub-pixel. The first pixel, the second sub-pixel and the third sub-pixel respectively emit light of different colors, and respectively include a first electrode 41, a first electrode 42 and a first electrode 43. The two adjacent second sub-pixels are respectively an upper second sub-pixel 101*a* and a lower second sub-pixel 101*b*, the upper second sub-pixel 101*a* includes a first electrode 421, and the lower second sub-pixel 101*b* includes a first electrode 422. For example, the display substrate includes a plurality of first sub-pixels, a plurality of second sub-pixels and a plurality of third sub-pixels, thereby including a plurality of first electrodes 41, a plurality of first electrodes 42 and a plurality of first electrodes 43; for example, the plurality of first electrodes 42 include the first electrode 421 and the first electrode 422 in FIG. 9I. The orthographic projection of the first connection structure P1-1 of the upper second sub-pixel 101*a* on the base substrate 200 at least partially overlaps with the orthographic projection of the first electrode 421 of the upper second sub-pixel 101*a* on the base substrate 200, and the orthographic projection of the first connection structure P1-2 of the lower second sub-pixel 101*b* on the base substrate 200 at least partially overlaps with the orthographic projection of the first electrode 422 of the lower second sub-pixel 101*b* on the base substrate 200, so that the first connection structures of the two adjacent second sub-pixels are basically shielded by the first electrodes of the sub-pixels where they are located, and the light emitting brightness of the two adjacent second sub-pixels tends to be consistent.

As shown in FIG. 9I, in each sub-pixel having the first electrode, taking the above second sub-pixel 101*a* as an example, the first electrode 421 is electrically connected to the second terminal T1*d* of the driving transistor T1 through the ninth via V9.

For example, the first sub-pixel emits red light, the second sub-pixel emits green light, and the third sub-pixel emits blue light.

For example, the upper second sub-pixel 101*a* and the lower second sub-pixel 101*b* are arranged along the second direction D2, and the upper second sub-pixel 101*a* and the first sub-pixel adjacent to the upper second sub-pixel 101*a* are arranged along the first direction D1. Of course, in other embodiments, the upper second sub-pixel 101*a* and the lower second sub-pixel 101*b* may also be arranged along the first direction D1, and the upper second subpixel 101*a* and the first second subpixel 101*a* adjacent to the upper second subpixel 101*a* are arranged along the second direction D2. The embodiments of the present disclosure are not limit in this aspect.

Other unmentioned features and technical effects of the embodiment shown in FIG. 9A, such as the types of the transistor, materials of each layer, etc., are the same as the corresponding structures in the previous embodiments, and reference may be made to the previous description.

At least one embodiment of the present disclosure provides a display device including any display substrate provided by the embodiments of the present disclosure. The display device may be, for example, an organic light emitting diode display device, a quantum dot light emitting diode display device, or other devices having a display function. The embodiments of the present disclosure are not limited in this aspect.

For the structure, the functions and technical effects of the display device provided by the embodiments of the present disclosure, reference may be made to the corresponding description in the display substrate 10 provided by the above embodiments of the present disclosure, and details are not repeated here.

For example, the display device provided by at least one embodiment of the present disclosure may be any product or component with a display function, such as a display panel, a mobile phone, a tablet computer, a television, a monitor, a notebook computer, a digital photo frame, a navigator, etc. The embodiments of the present disclosure are not limited in this aspect.

What are described above is related to only the illustrative embodiments of the present disclosure and not limitative to the protection scope of the present application. Therefore, the protection scope of the present application shall be defined by the accompanying claims.

What is claimed is:

1. A display substrate, comprising:

a base substrate;

a first signal line extending along a first direction as a whole and a second signal line extending along a second direction as a whole on the base substrate, wherein the first direction intersects the second direction;

a sub-pixel, wherein the sub-pixel comprises a pixel circuit, and the pixel circuit comprises:

a light emitting device, a driving transistor and a data writing transistor, wherein the data writing transistor is configured to transmit a data signal to the driving transistor under a control of a first scan signal;

the driving transistor is configured to control a magnitude of a driving current flowing through the light emitting device according to the data signal, the driving transistor comprises an active pattern and a gate electrode, the active pattern comprises a channel region, and an orthographic projection of the channel region on the base substrate at least partially overlaps with an orthographic projection of the gate electrode on the base substrate;

the light emitting device is configured to receive the driving current and is driven by the driving current to emit light;

the pixel circuit further comprises a storage capacitor, and the storage capacitor comprises: a first electrode plate, a planar pattern of the first electrode plate is in an L shape, and the first electrode plate and the gate electrode of the driving transistor are disposed in the same layer and have an integral structure.

2. The display substrate according to claim 1, wherein the planar shape of the channel region of the driving transistor is a straight strip shape extending along the second direction.

3. The display substrate according to claim 1, wherein the storage capacitor further comprises a second electrode plate, an orthographic projection of the second electrode plate on the base substrate at least partially overlaps with an orthographic projection of the first electrode plate on the base substrate, and does not overlap with an orthographic projection of the channel region of the driving transistor on the base substrate.

4. The display substrate according to claim 1, wherein the pixel circuit further comprises:

a semiconductor layer, comprising the active pattern of the driving transistor; and a first connection structure, wherein a first terminal of the first connection structure is connected with the semiconductor layer, and a second terminal, opposite to the first terminal, of the first connection structure is electrically connected with the gate electrode of the driving transistor and the first electrode plate, an orthographic projection of the first connection structure on the base substrate does not overlap with an orthographic projection of the second electrode plate on the base substrate.

5. The display substrate according to claim 4, wherein the orthographic projection of the first connection structure on the base substrate does not overlap with the orthographic projection of the channel region of the driving transistor on the base substrate.

6. The display substrate according to claim 5, wherein the orthographic projection of the first connection structure on the base substrate at least partially overlaps with an orthographic projection of the second portion of the first electrode plate on the base substrate.

7. The display substrate according to claim 5, wherein the first connection structure is in a same layer as a first electrode of the driving transistor, and is electrically connected with the first electrode plate through a first via;

an orthographic projection of the first via on the base substrate overlaps with an orthographic projection of the second portion of the first electrode plate on the base substrate, and does not overlap with an orthographic projection of the second electrode plate on the base substrate.

8. The display substrate according to claim 1, wherein the pixel circuit further comprises:

a first power line which is connected with a first voltage terminal and configured to provide a first power voltage to the pixel circuit, is in a same layer as a first electrode of the driving transistor, and comprises:

a first vertical portion, extending in the second direction and connected to an adjacent sub-pixel; and a first lateral portion, connected with the first vertical portion and extending from the first vertical portion towards the second electrode plate, wherein the first lateral portion is electrically connected with the second electrode plate through a second via.

9. The display substrate according to claim 4, wherein the first electrode plate comprises:

a first portion, extending along the second direction, wherein an orthographic projection of the first portion on the base substrate overlaps with an orthographic projection of the channel region of the driving transistor on the base substrate; and a second portion, connected with the first portion and protruding from the first portion of the first electrode plate along the first direction, wherein an orthographic projection of the second portion on the base substrate at least partially overlaps with an orthographic projection of the second electrode plate on the base substrate.

10. The display substrate according to claim 9, wherein the first portion of the first electrode plate has a first terminal in the second direction, and a blank notch is surrounded by the first terminal of the first portion of the first electrode plate and the second portion;

the first signal line is in a same layer as the first electrode plate and is spaced apart from the first electrode plate, and comprises:

a main portion, passing through the sub-pixel along the first direction and on a first side of the first electrode plate in the second direction; and a protrusion portion, connected with the main portion and protruding from the main portion towards the first electrode plate, wherein the protrusion portion is at least partially located in the notch.

11. The display substrate according to claim 10, wherein the notch is at a side of the first terminal of the first portion of the first electrode plate away from the channel region of the driving transistor in the first direction.

12. The display substrate according to claim 10, wherein the pixel circuit further comprises:

a compensation transistor, configured to compensate the gate electrode of the driving transistor in response to a second scan signal applied to the gate electrode of the compensation transistor and the data signal, wherein the first signal line providing the first scan signal to the data writing transistor is further configured to provide the second scan signal to the compensation transistor;

the compensation transistor comprises a first gate electrode and a second gate electrode, at least part of the protrusion portion constitutes the first gate electrode of the compensation transistor, and a part of the main portion constitutes the second gate electrode of the compensation transistor and the gate electrode of the data writing transistor.

13. The display substrate according to claim 12, wherein the compensation transistor comprises an active pattern, and the active pattern of the compensation transistor is in a same layer as the active pattern of the driving transistor;

the sub-pixel further comprises:

a shielding portion, on a side of the active pattern of the compensation transistor away from the base substrate, wherein an orthographic projection of the shielding portion on the base substrate at least partially overlaps with an orthographic projection of the active pattern of the compensation transistor on the base substrate, the shielding portion is electrically connected with the first connection structure.

14. The display substrate according to claim 13, wherein the shielding portion is in a same layer as the second electrode plate, an orthographic projection of the first connection structure on the base substrate at least partially overlaps with the orthographic projection of the shielding portion on the base substrate, and the first connection structure is electrically connected with the shielding portion through a third via.

15. The display substrate according to claim 9, wherein the orthographic projection of the first connection structure on the base substrate at least partially overlaps with the orthographic projection of the channel region of the driving transistor on the base substrate;

the first connection structure is in a same layer as the first electrode of the driving transistor, and is electrically connected with the first electrode plate through the first via;

an orthographic projection of the first via on the base substrate overlaps with an orthographic projection of the second portion of the first electrode plate on the base substrate, and does not overlap with orthographic projections of the first portion of the first electrode plate and the second electrode plate on the base substrate.

16. The display substrate according to claim 4, wherein the orthographic projection of the first connection structure on the base substrate at least partially overlaps with the orthographic projection of the channel region of the driving transistor on the base substrate;

the first connection structure comprises a first inclined portion, the first inclined portion extends along a third direction intersecting the first direction and the second direction, and an orthographic projection of the first inclined portion on the base substrate at least partially overlaps with an orthographic projection of the channel region of the driving transistor on the base substrate.

17. The display substrate according to claim 8, wherein the first portion has a first terminal in the second direction, and the first signal line providing the first scan signal to the data writing transistor comprises a bent portion, the bent portion surrounds the first terminal of the first portion.

18. The display substrate according to claim 17, wherein the pixel circuit further comprises:

a compensation transistor, configured to compensate the gate electrode of the driving transistor in response to a second scan signal applied to the gate electrode of the compensation transistor and the data signal, wherein the first signal line providing the first scan signal to the data writing transistor is further configured to provide the second scan signal to the compensation transistor.

19. The display substrate according to claim 18, wherein the compensation transistor comprises an active pattern, and the active pattern of the compensation transistor is in a same layer as the active pattern of the driving transistor;

the sub-pixel further comprises:

a shielding portion, on a side of the active pattern of the compensation transistor away from the base substrate, wherein an orthographic projection of the shielding portion on the base substrate at least partially overlaps with an orthographic projection of the active pattern of the compensation transistor on the base substrate, the shielding portion is electrically connected with the first power line;

the shielding portion is in a same layer as the second electrode plate, an orthographic projection of the first power line on the base substrate at least partially overlaps with an orthographic projection of the shielding portion on the base substrate, and the first power line is electrically connected with the shielding portion through a second via.

20. A display device, comprising the display substrate according to claim 1.

* * * * *